(12) United States Patent
Seliskar

(10) Patent No.: US 7,968,409 B2
(45) Date of Patent: *Jun. 28, 2011

(54) MIXED-SIGNAL SEMICONDUCTOR PLATFORM INCORPORATING FULLY-DEPLETED CASTELLATED-GATE MOSFET DEVICE AND METHOD OF MANUFACTURE THEREOF

(76) Inventor: John J. Seliskar, Charlottesville, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/661,914

(22) Filed: Mar. 26, 2010

(65) Prior Publication Data

US 2010/0317163 A1    Dec. 16, 2010

Related U.S. Application Data

(62) Division of application No. 11/249,002, filed on Oct. 12, 2005, now Pat. No. 7,719,058.

(51) Int. Cl.
*H01L 21/336* (2006.01)
(52) U.S. Cl. ... 438/284; 438/151; 438/296; 257/E21.19; 257/E29.299
(58) Field of Classification Search .................. 438/284; 257/E21.19, E29.299
See application file for complete search history.

(56) References Cited

U.S. PATENT DOCUMENTS

| 7,211,864 | B2 * | 5/2007 | Seliskar | 257/347 |
| 7,439,139 | B2 * | 10/2008 | Seliskar | 438/284 |
| 2005/0006704 | A1 * | 1/2005 | Ning et al. | 257/350 |

* cited by examiner

*Primary Examiner* — Ken A Parker
*Assistant Examiner* — Jose R Diaz

(57) ABSTRACT

A Mixed-Signal Semiconductor Platform Incorporating Castellated-Gate MOSFET device(s) capable of Fully-Depleted operation is disclosed along with a method of making the same. The composite device/technology platform has robust I/O applications and includes a starting semiconductor substrate of a first conductivity type. One or more isolated regions of at least a first conductivity type is separated by trench isolation insulator islands. Within an isolated region designated for castellated-gate MOSFETs there exists a semiconductor body consisting of an upper portion with an upper surface, and a lower portion with a lower surface. Also within the castellated-gate MOSFET region, there exists a source region, a drain region, and a channel-forming region disposed between the source and drain regions, and are all formed within the semiconductor substrate body. The channel-forming region within the isolated castellated-gate MOSFET region is made up of a plurality of thin, spaced, vertically-orientated conductive channel elements that span longitudinally along the device between the source and drain regions. One or more of the trench isolated regions may contain at least one type or polarity of logic and/or memory computing device. Alternately or additionally, one or more type of Logic and/or memory device may be incorporated within vertically displaced regions above the active body region of the semiconductor wafer, embedded within Interlevel Dielectric Layers.

8 Claims, 60 Drawing Sheets

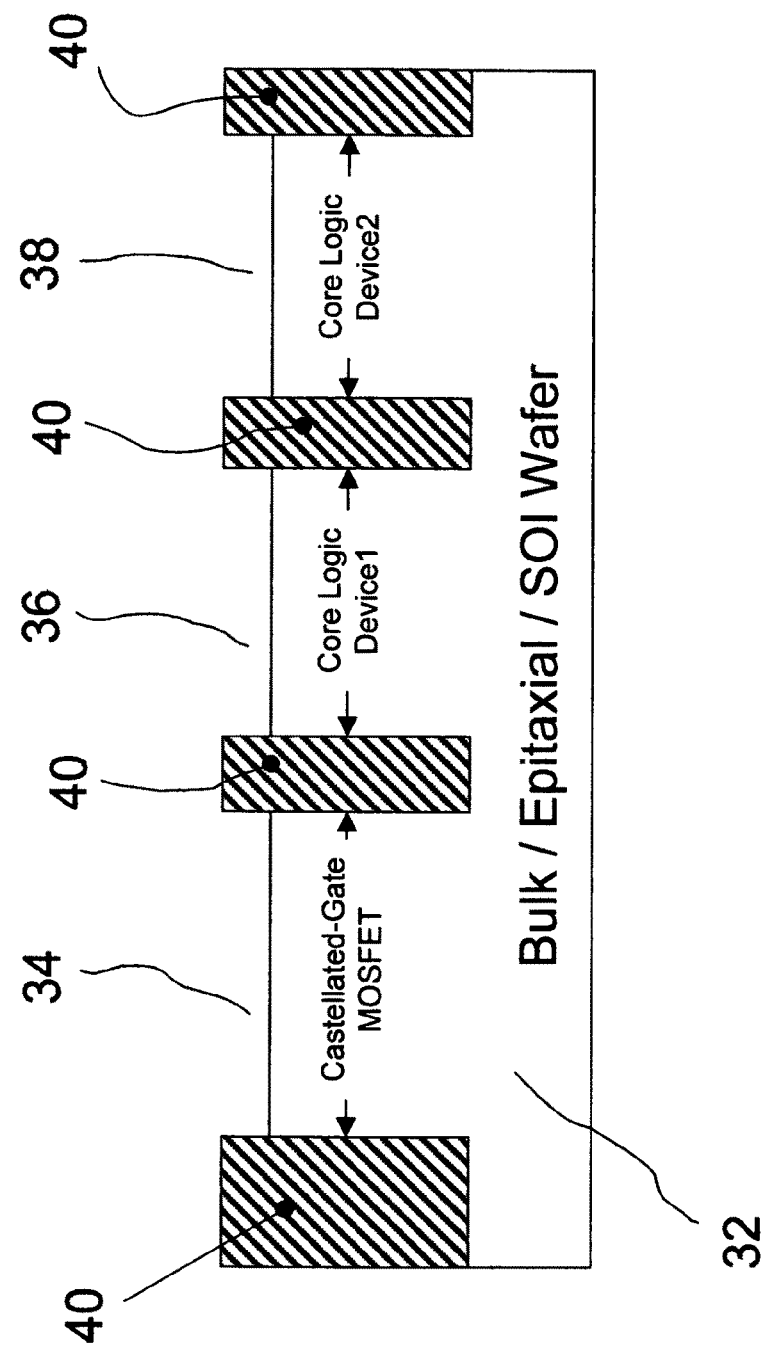

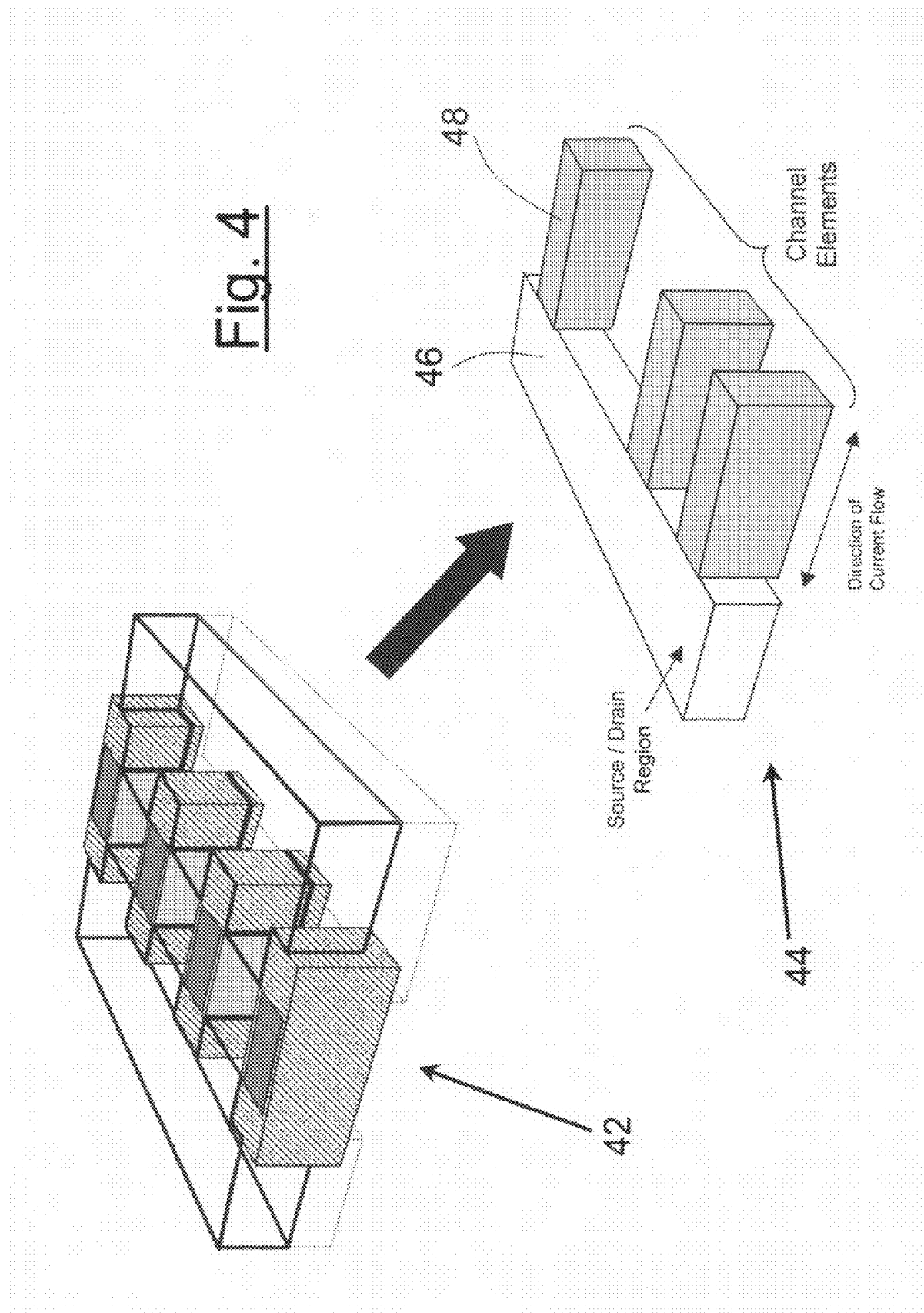

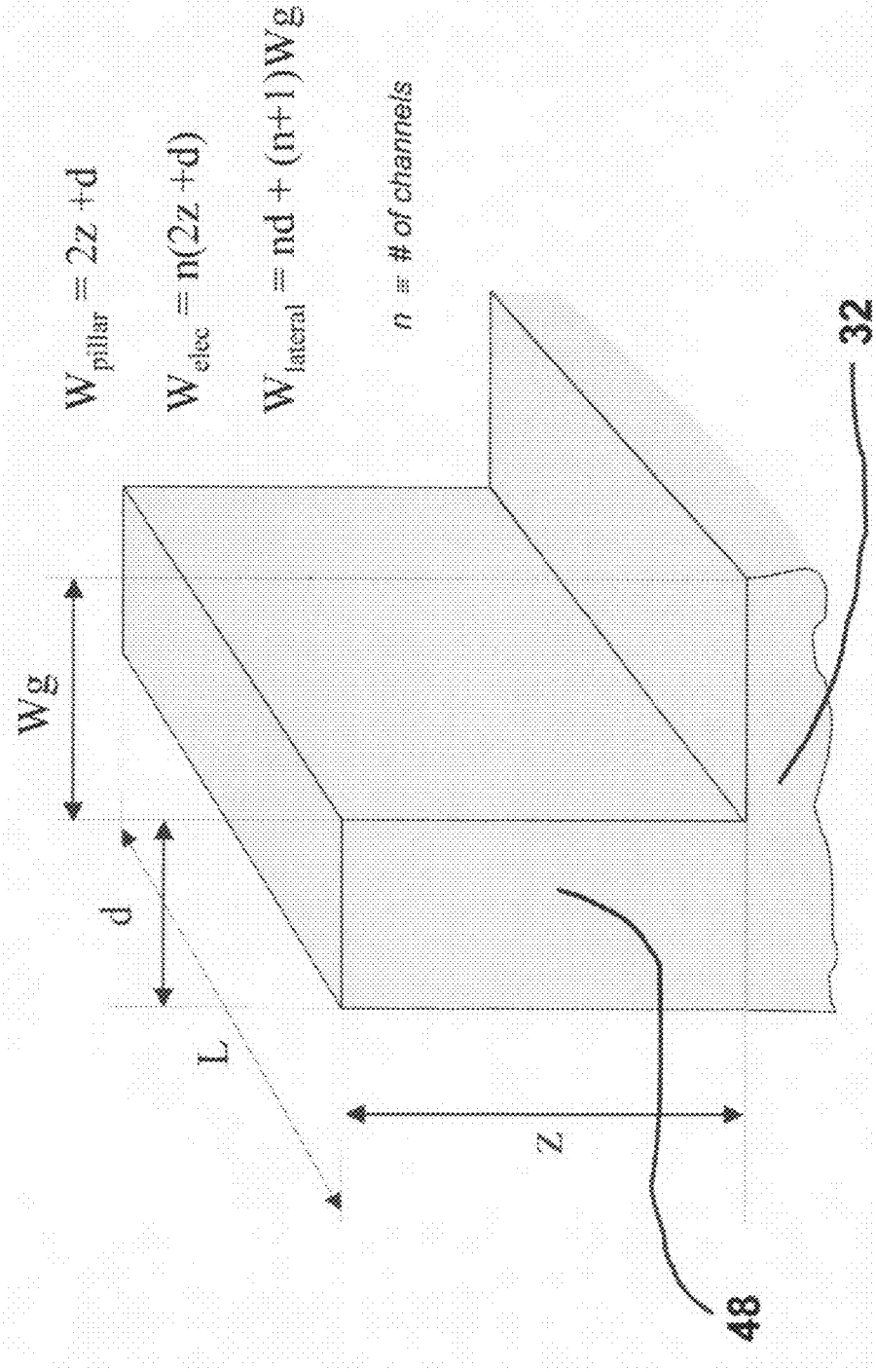

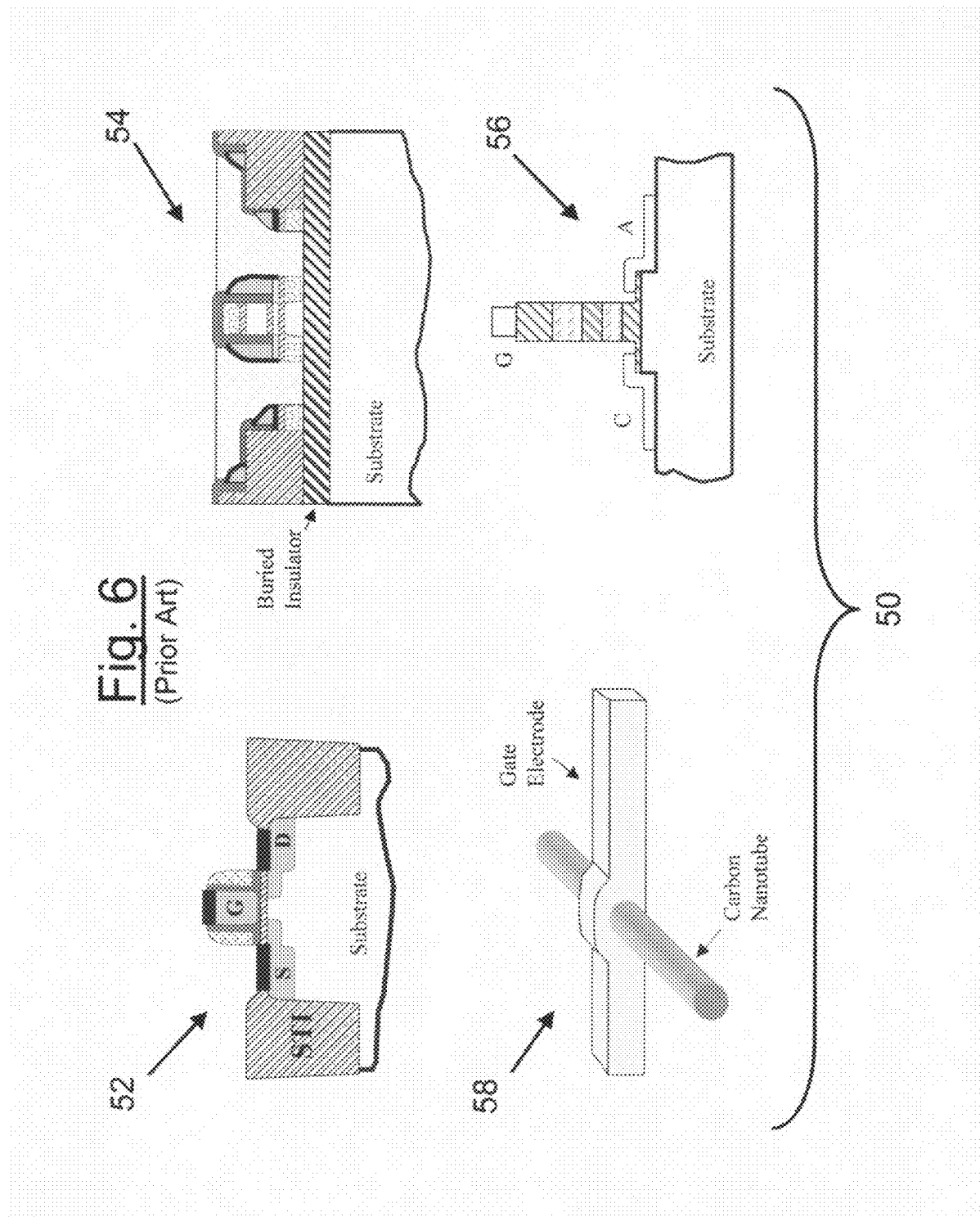

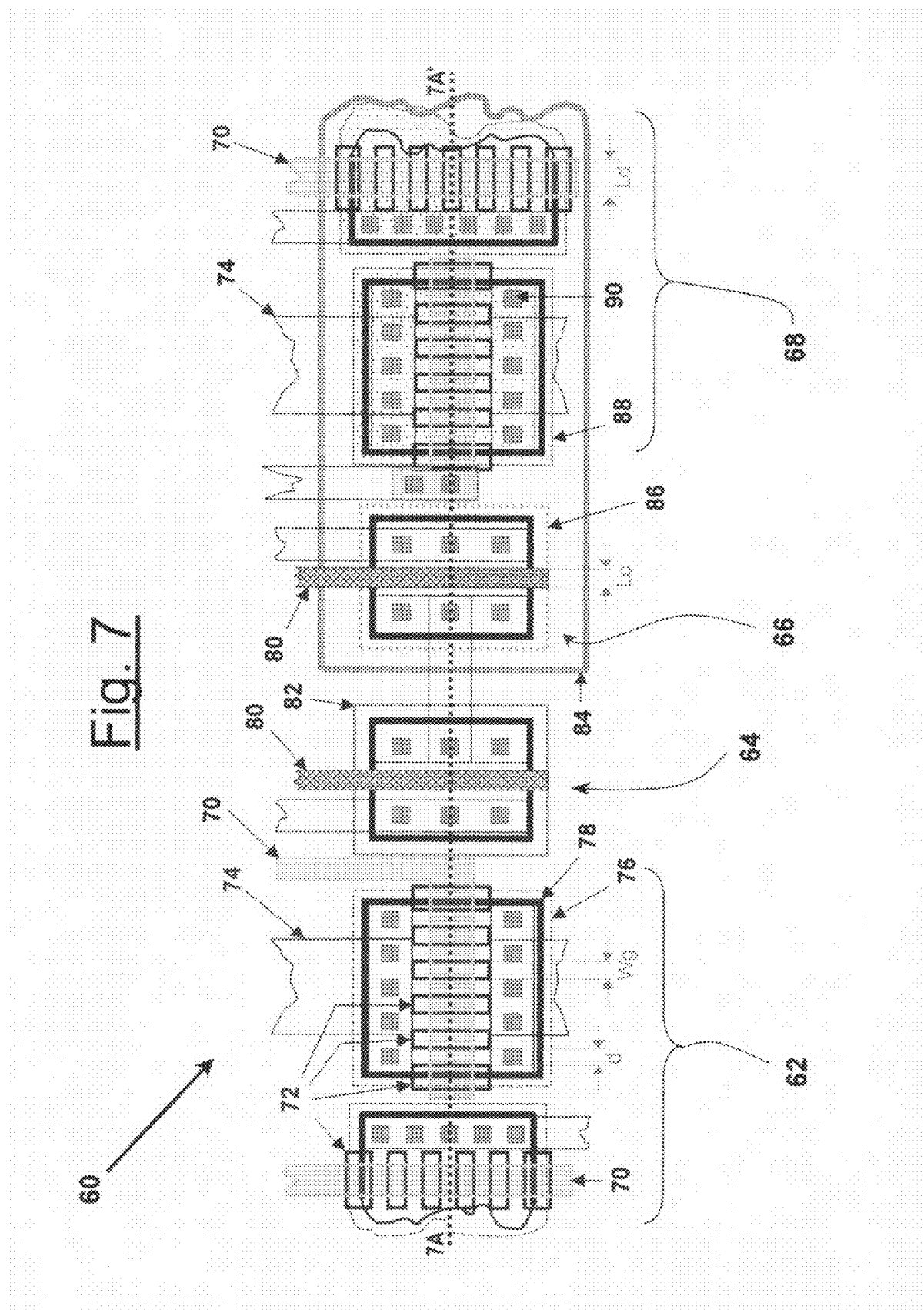

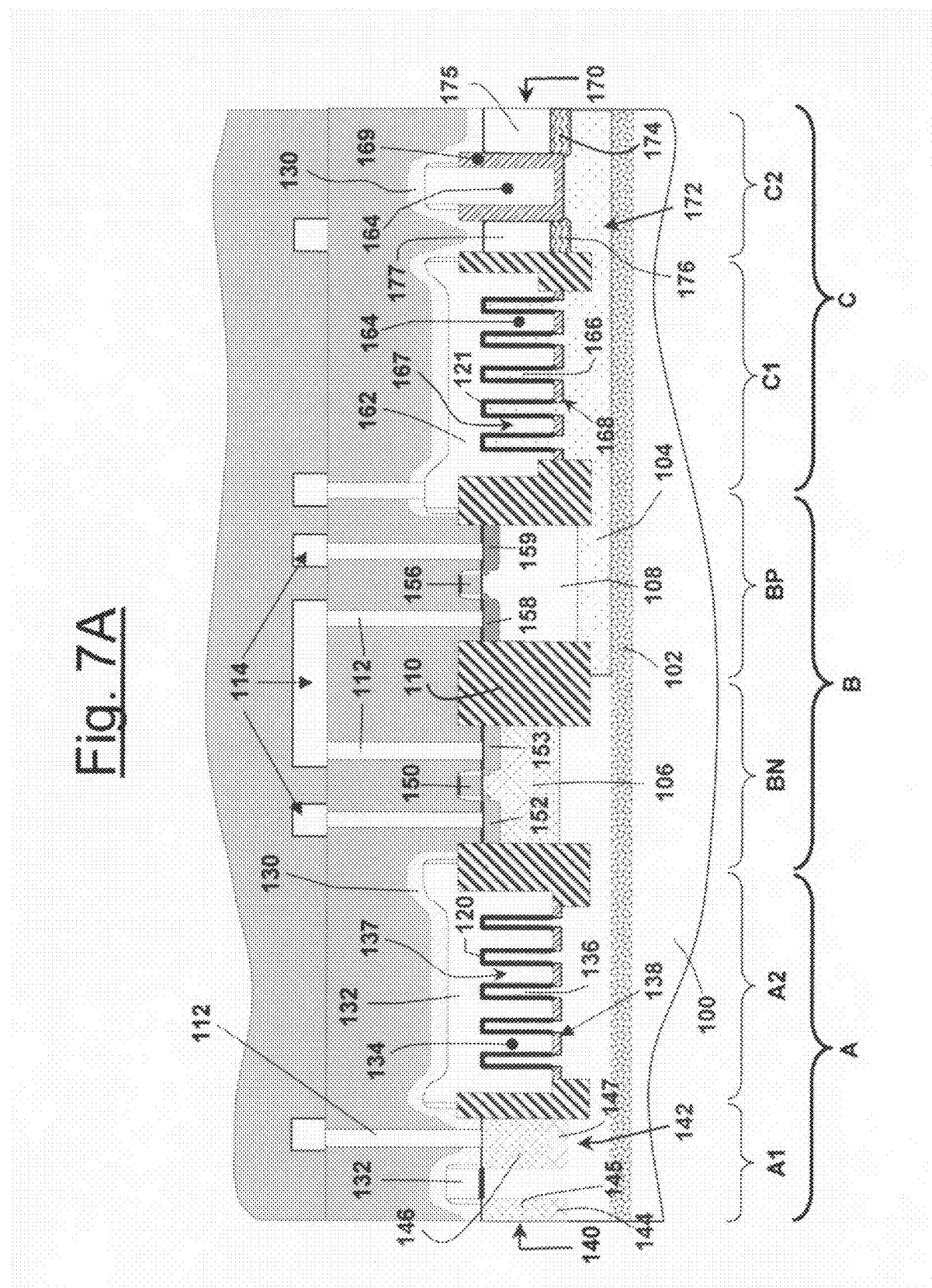

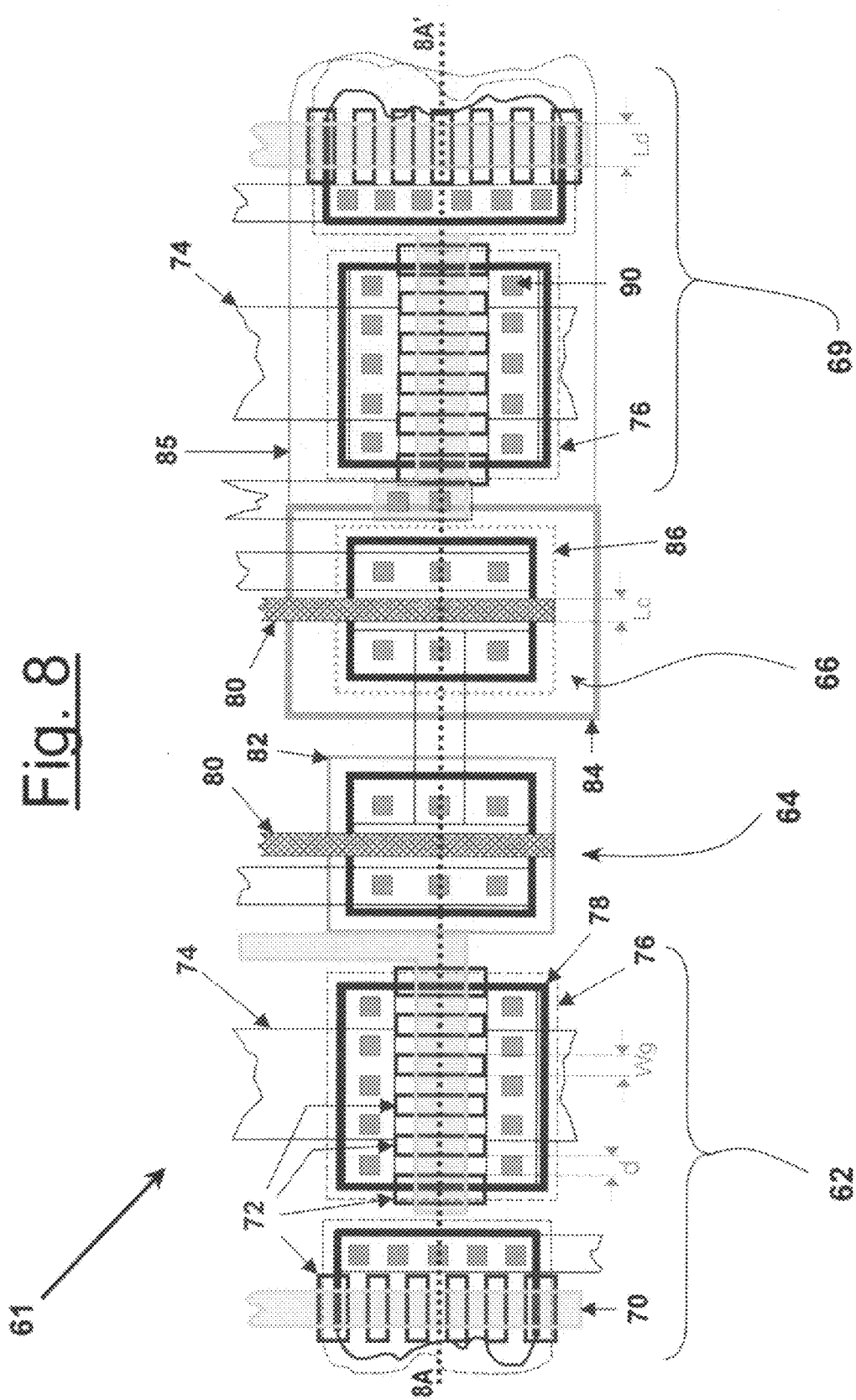

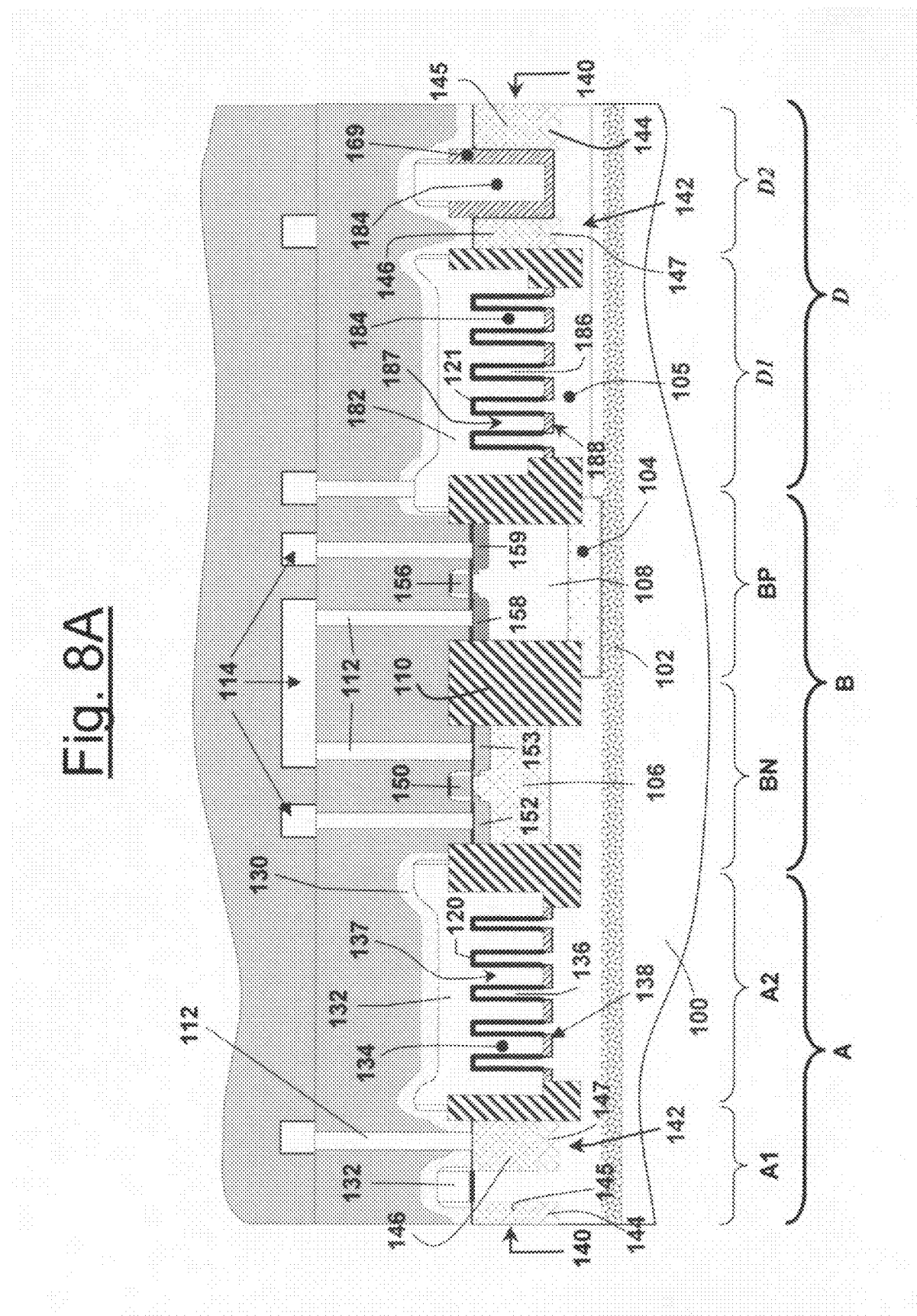

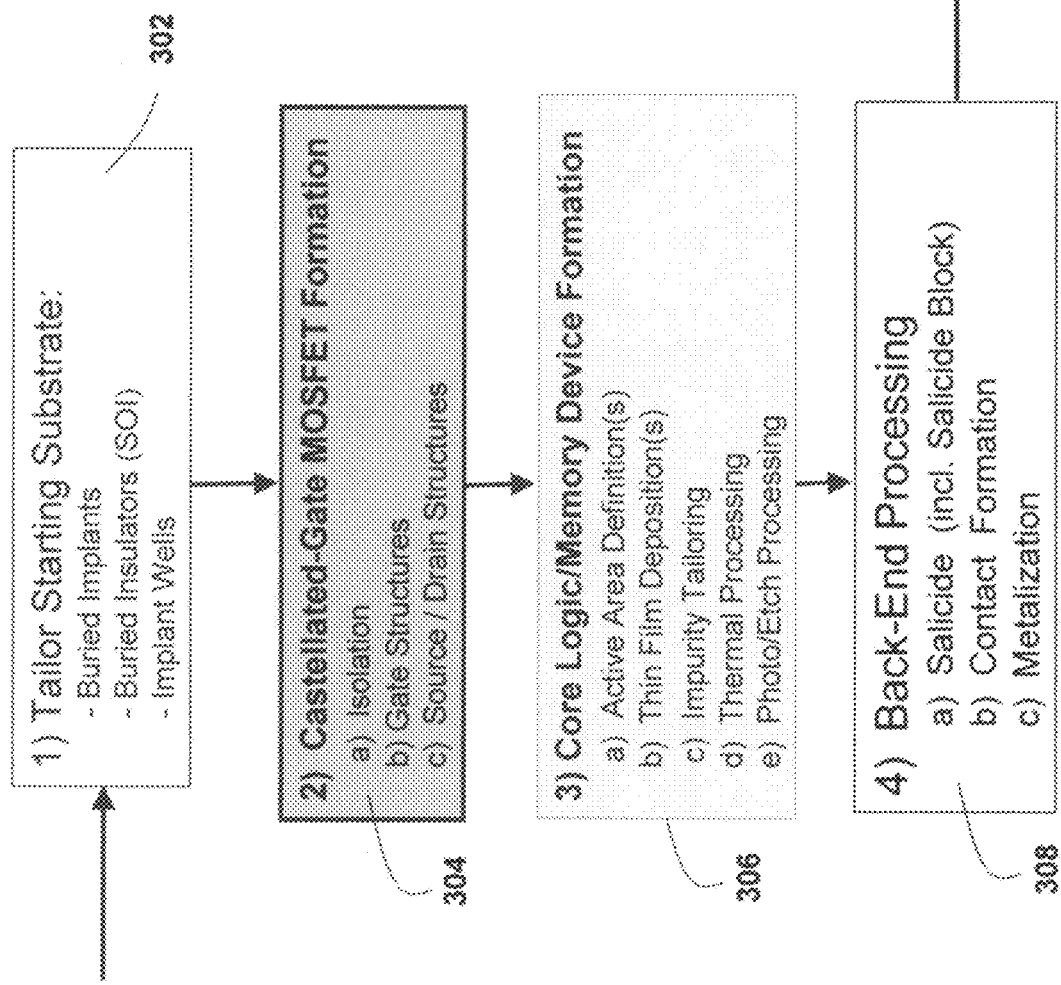

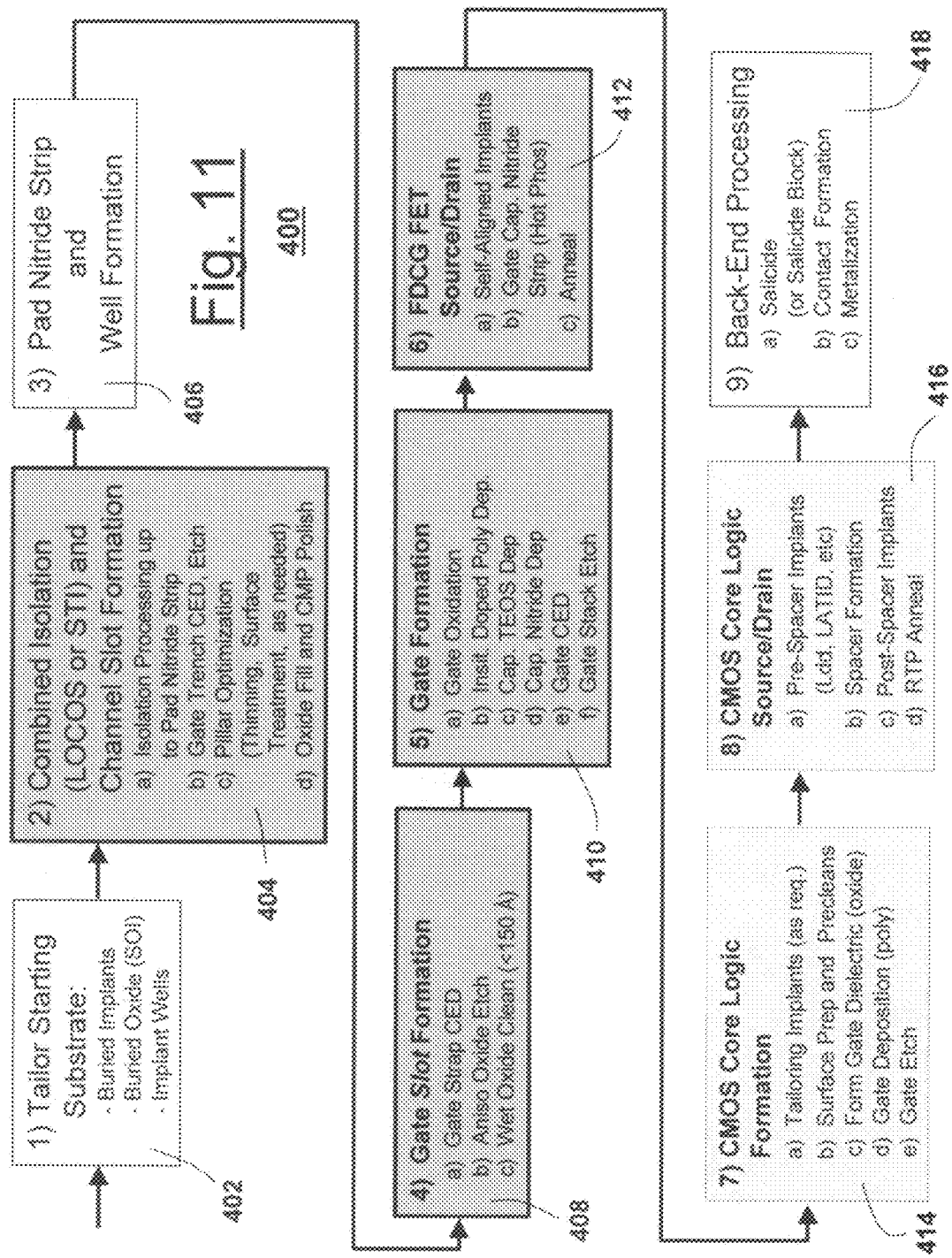

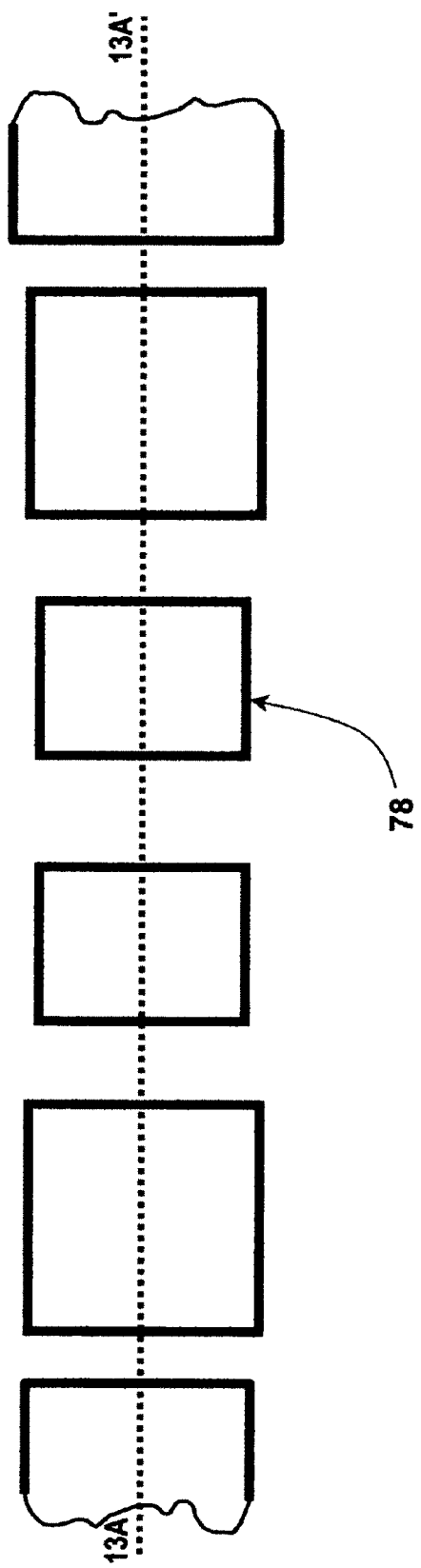

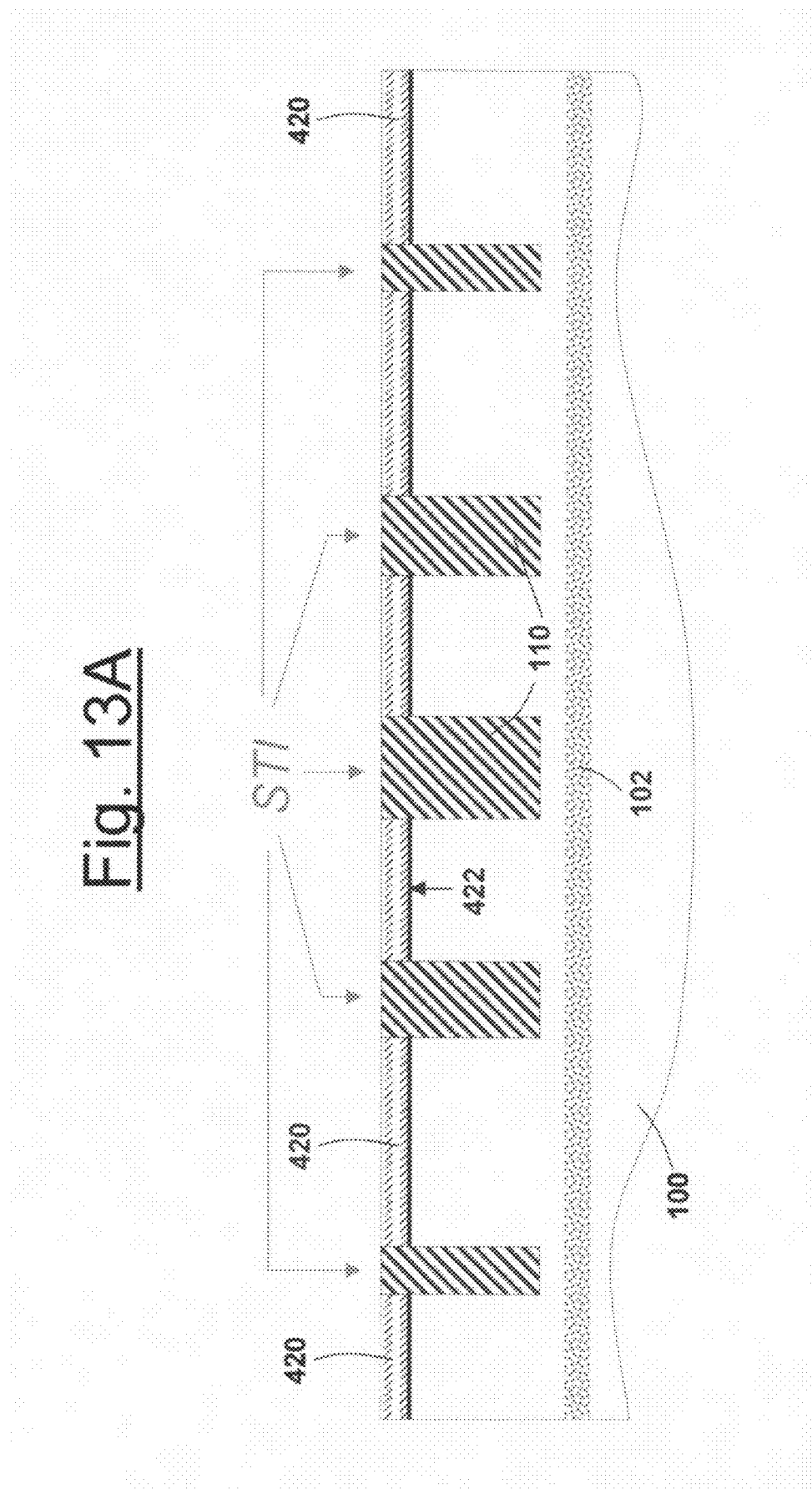

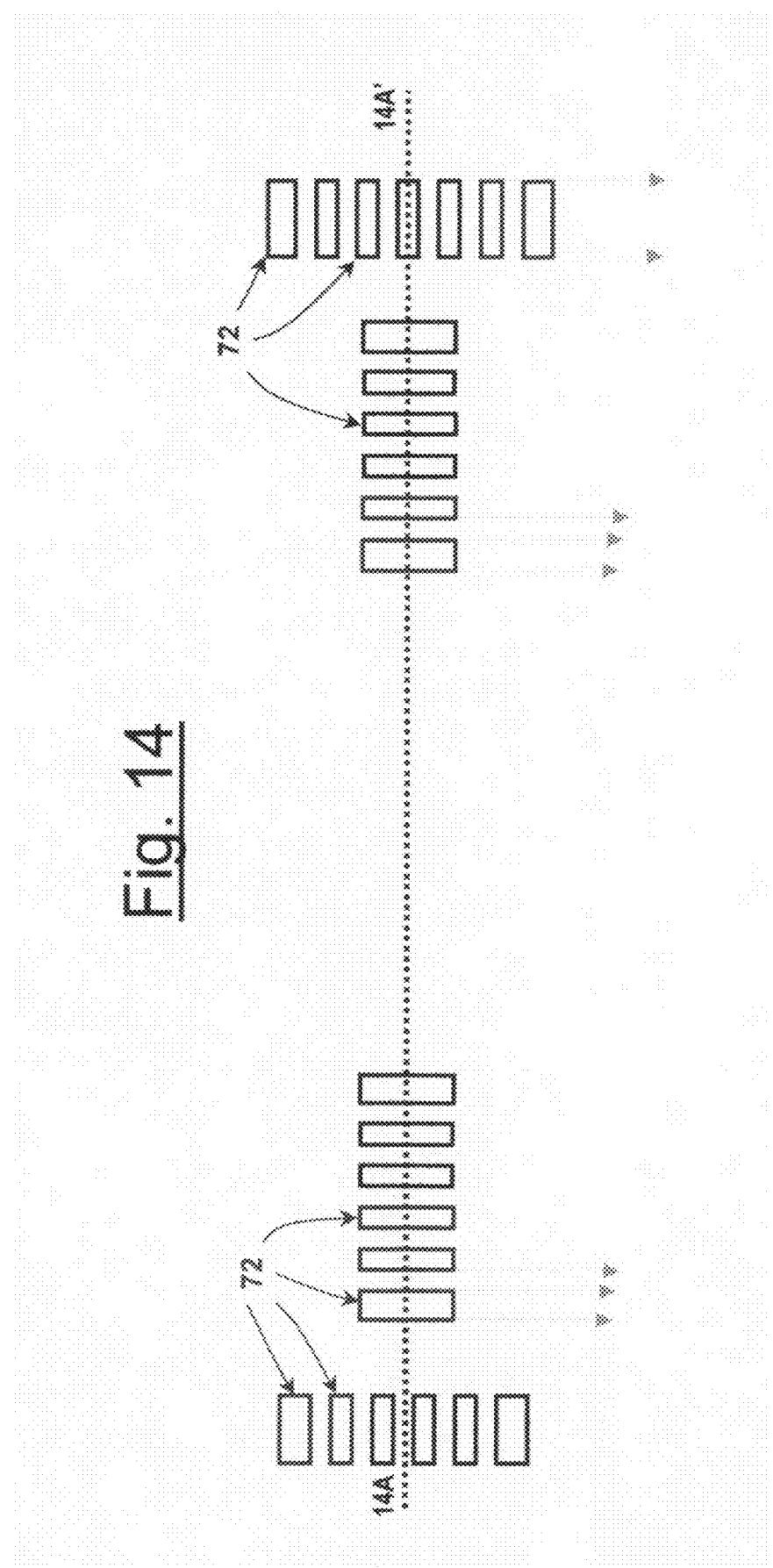

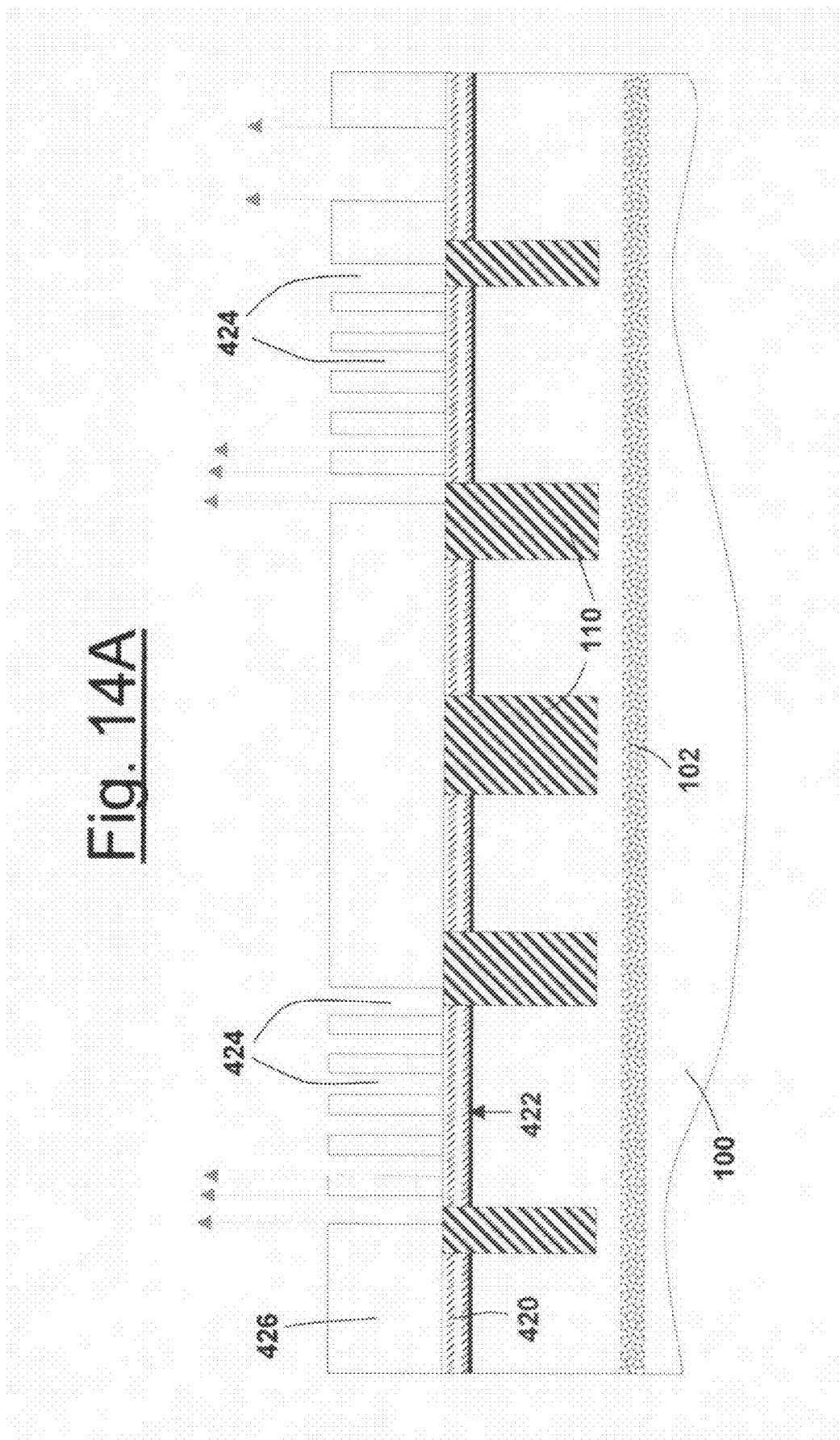

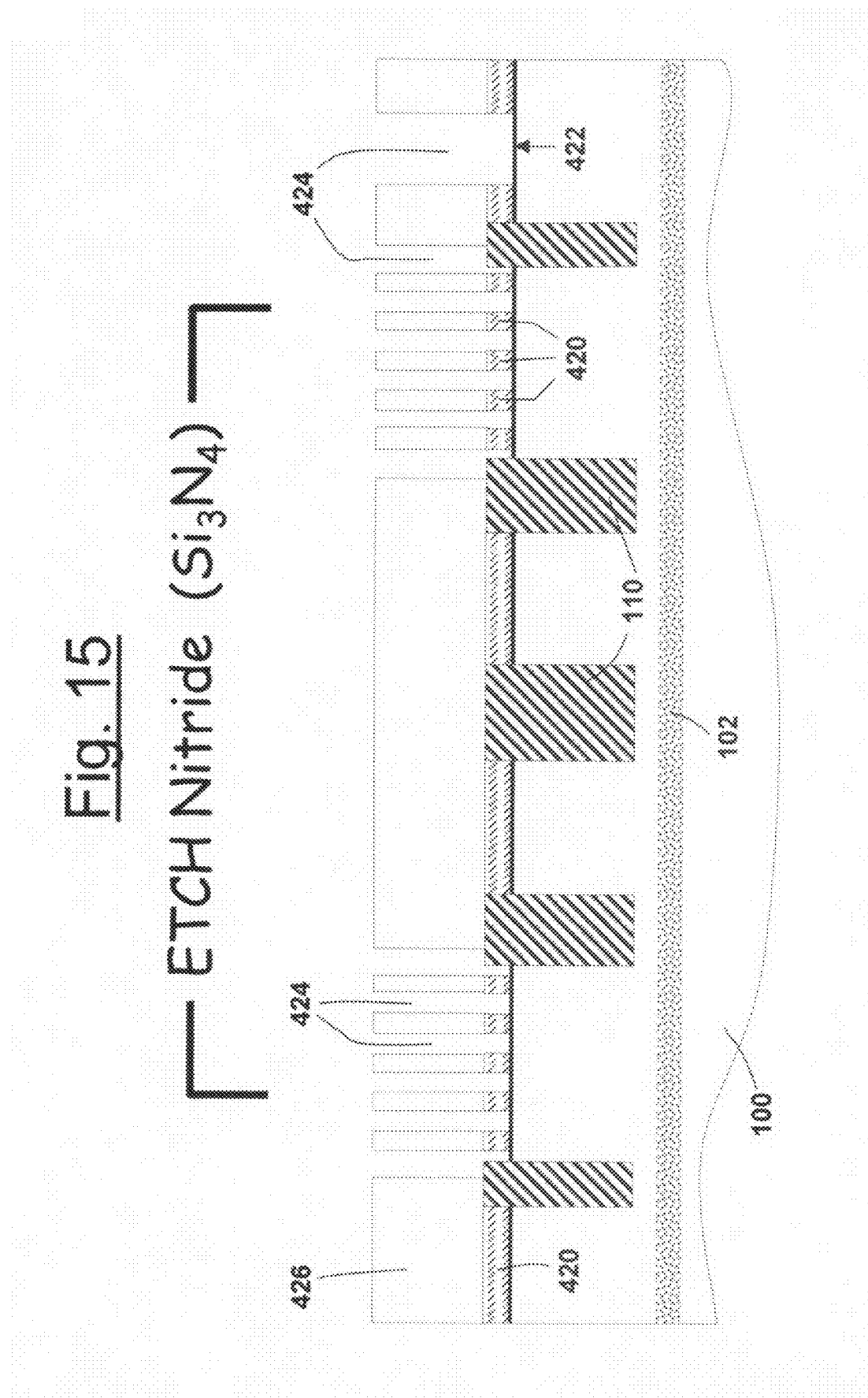

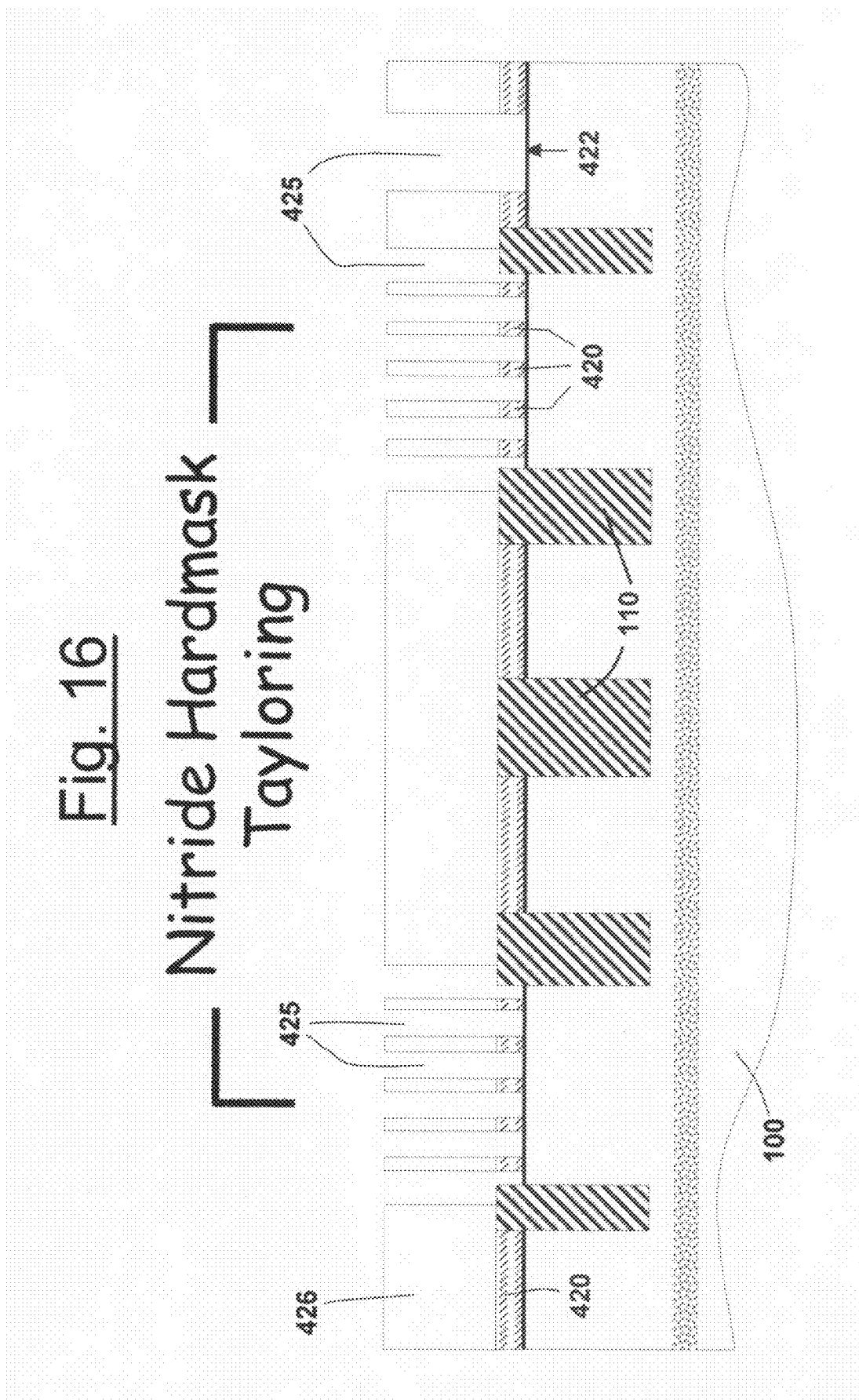

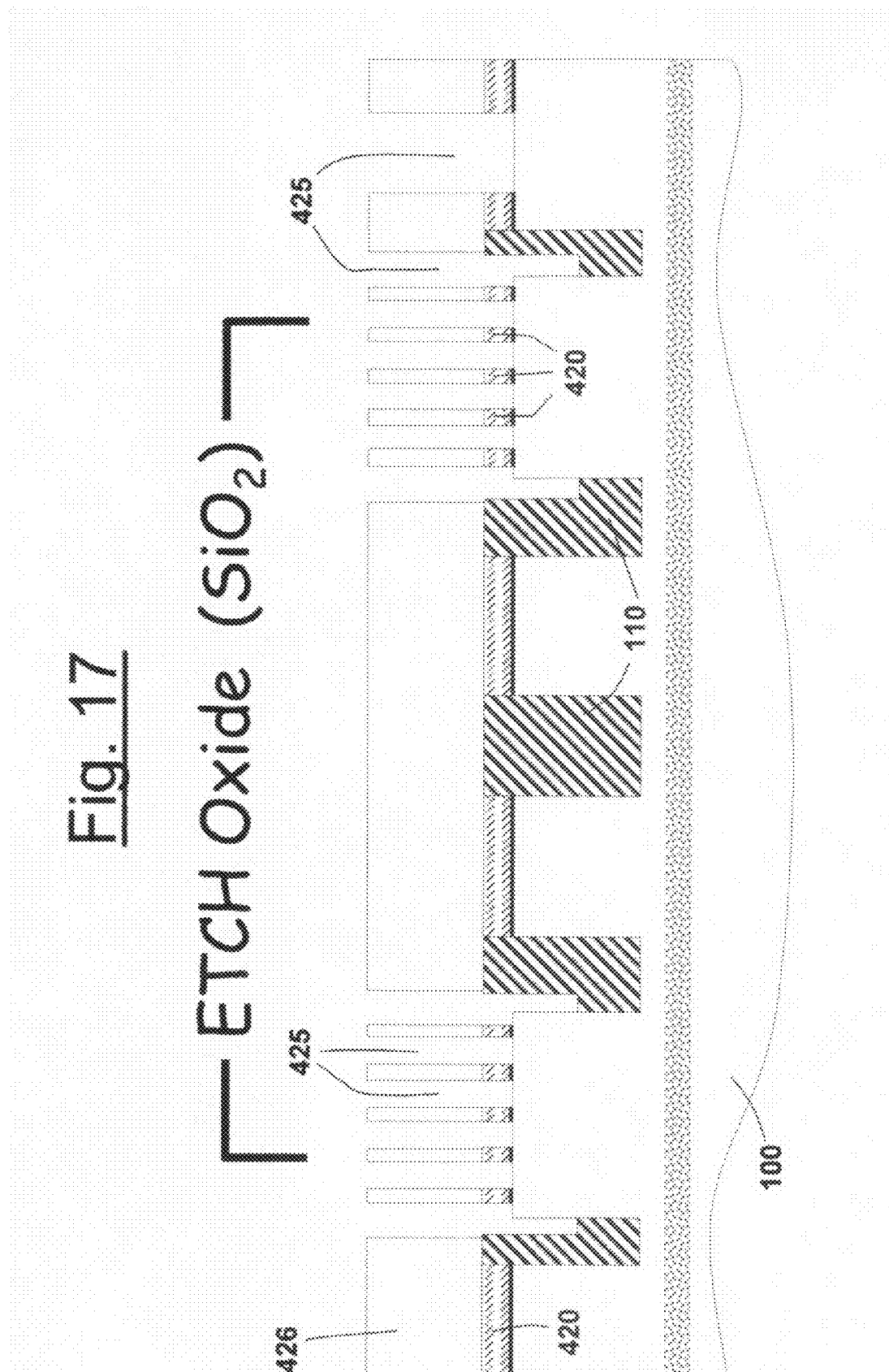

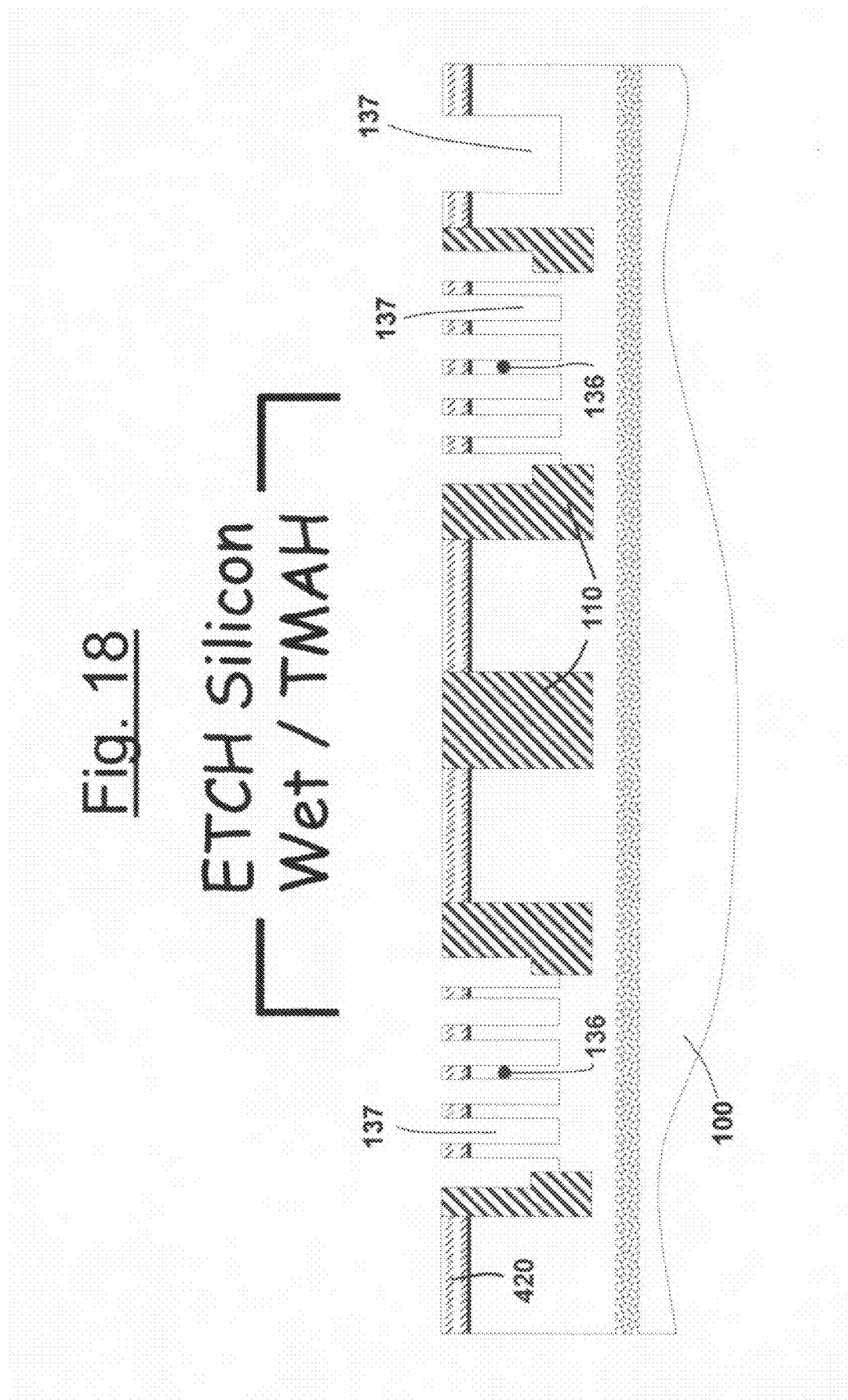

Trench Fill and Planarization

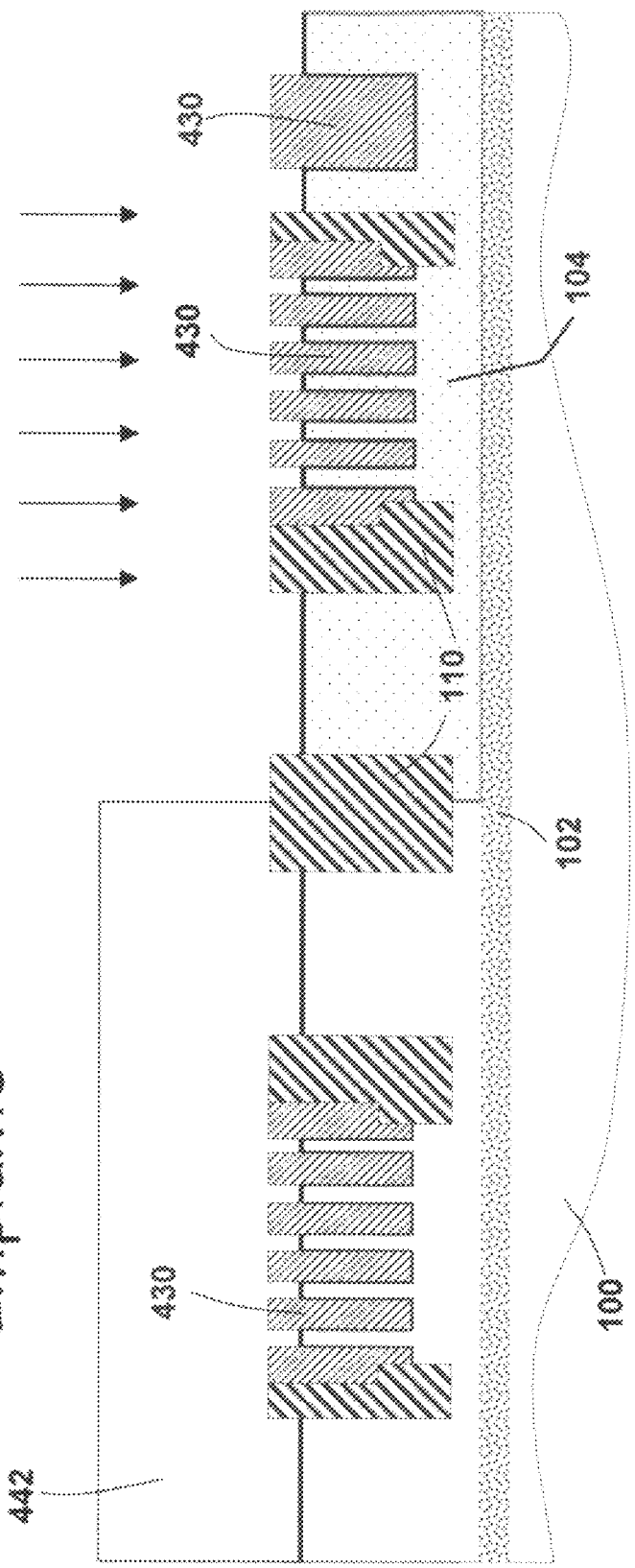

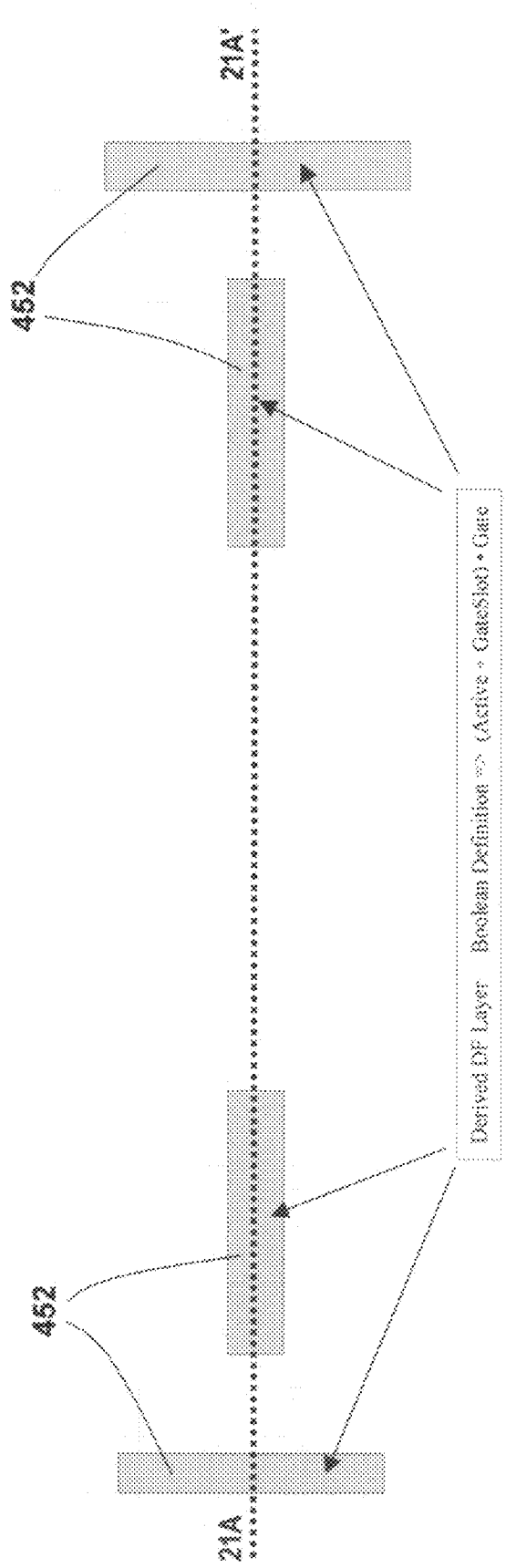

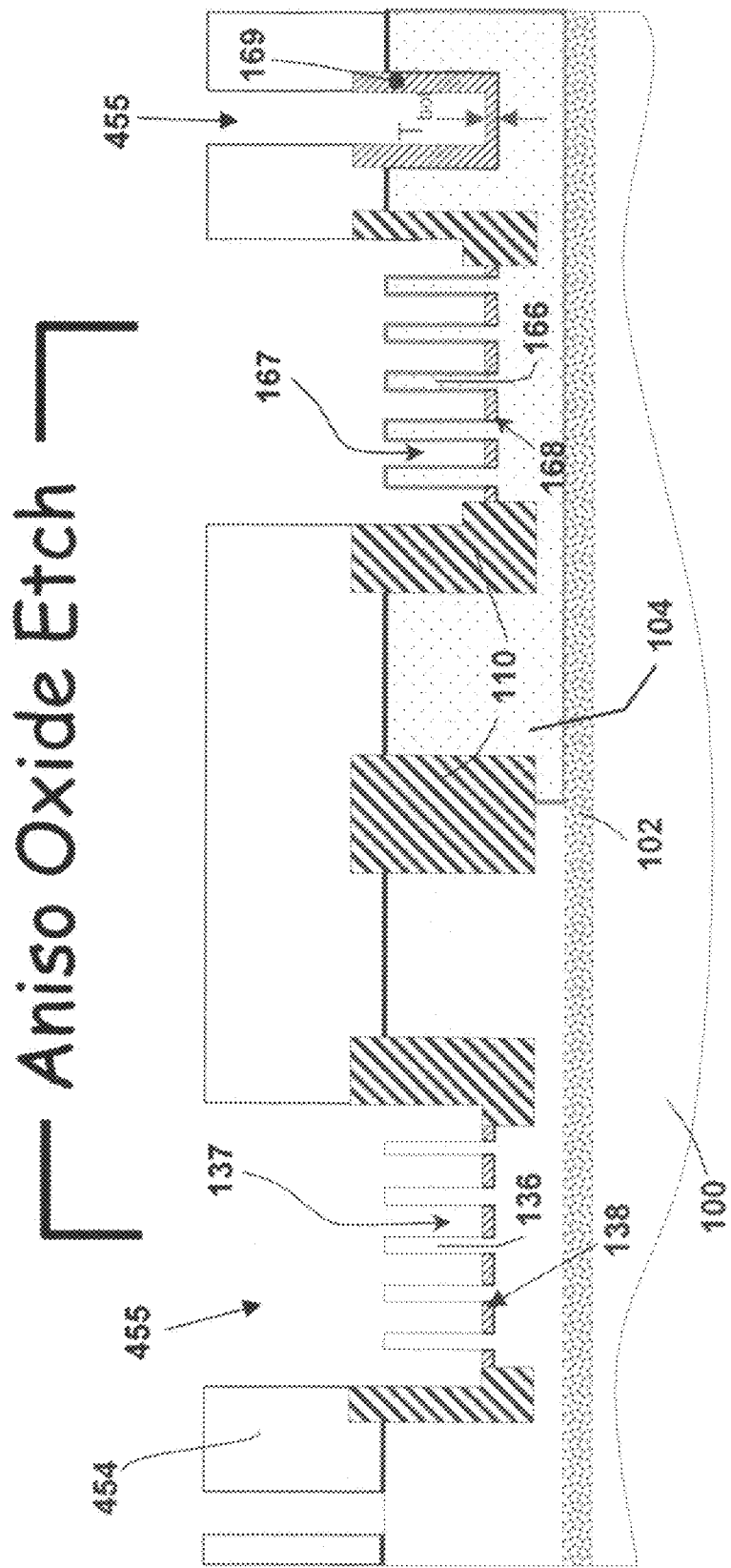
Fig. 22 — Aniso Oxide Etch

- Pillar Optimization
- Gate Oxidation
- Gate Stack Deposition

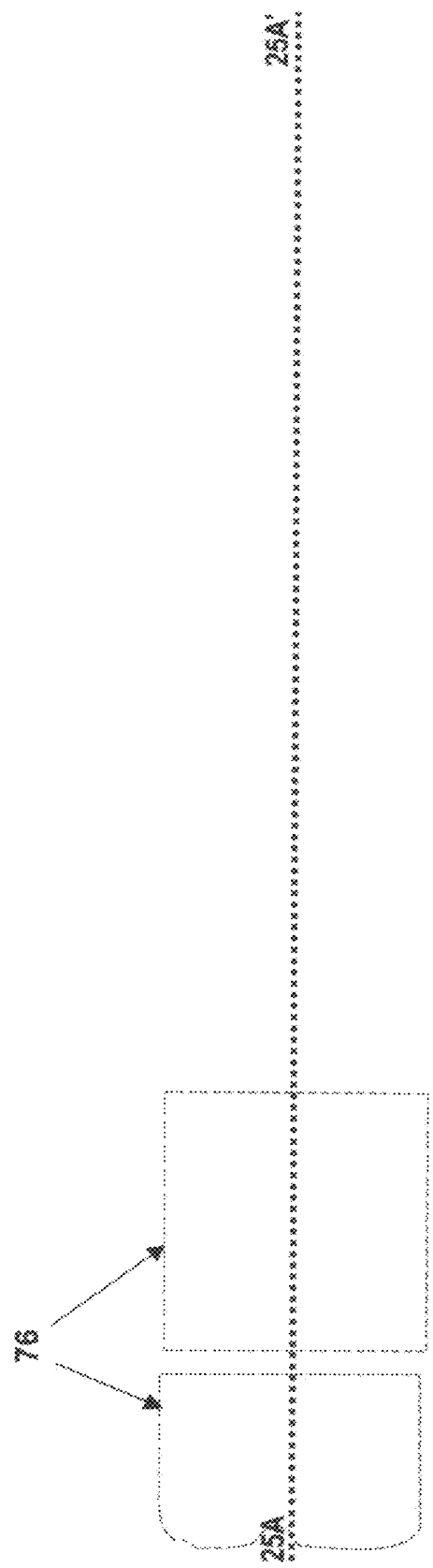

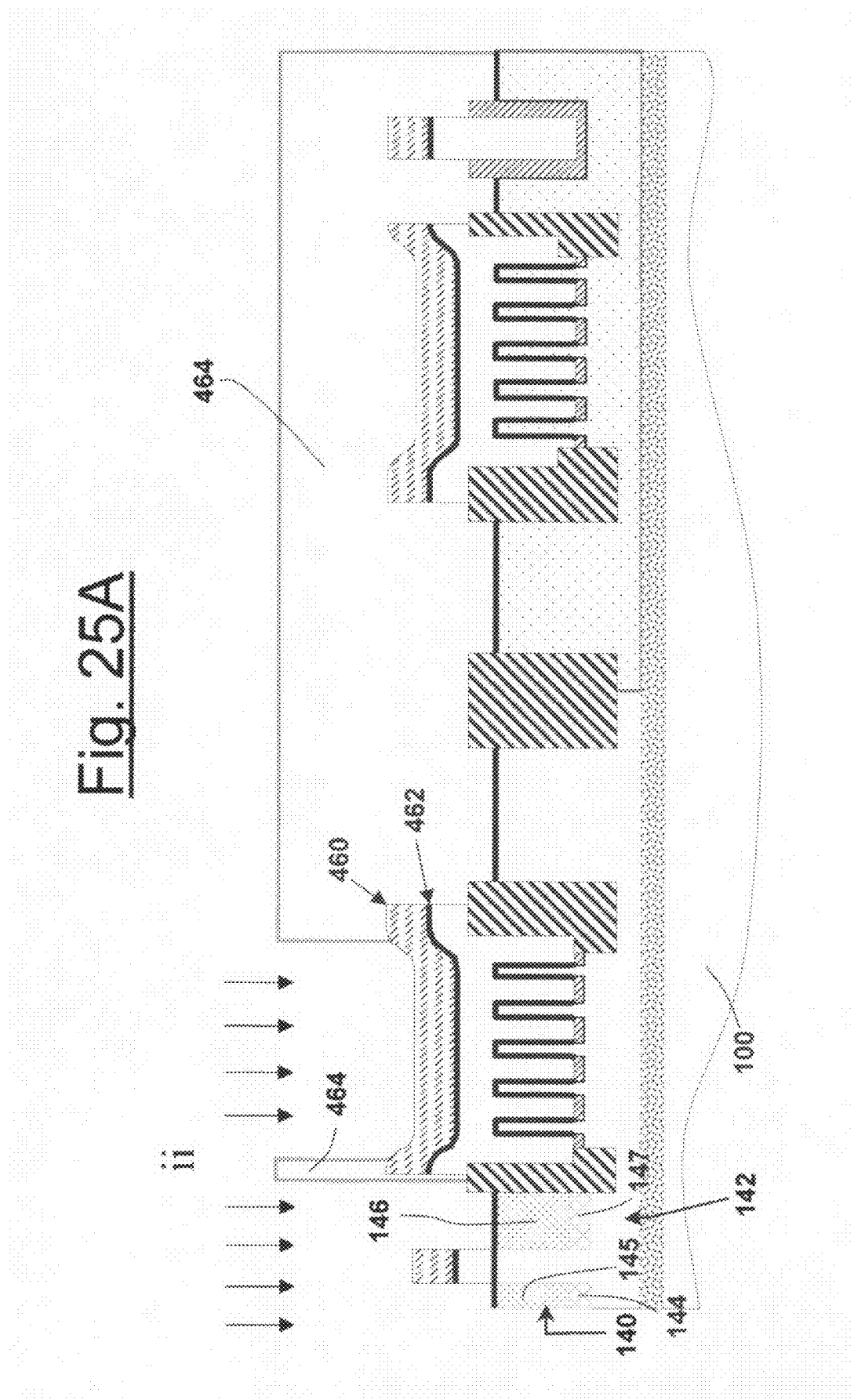

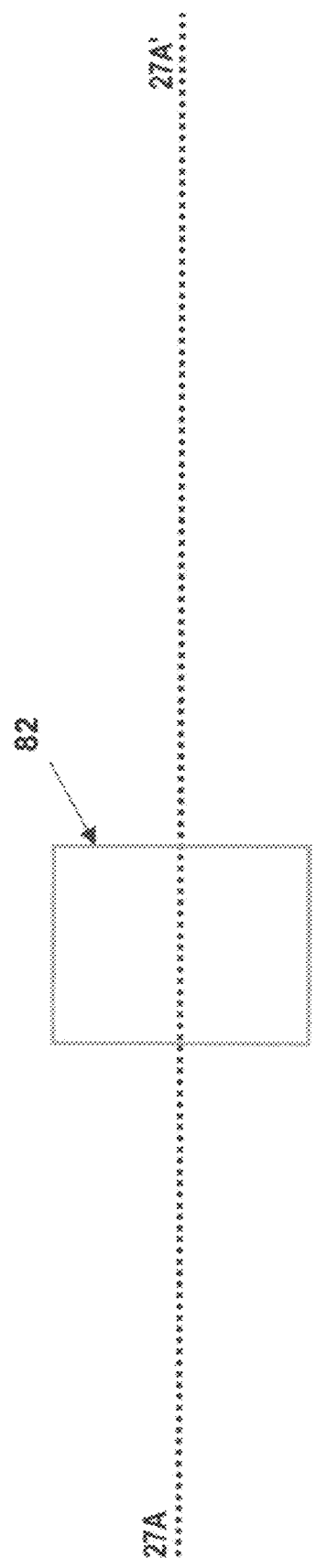

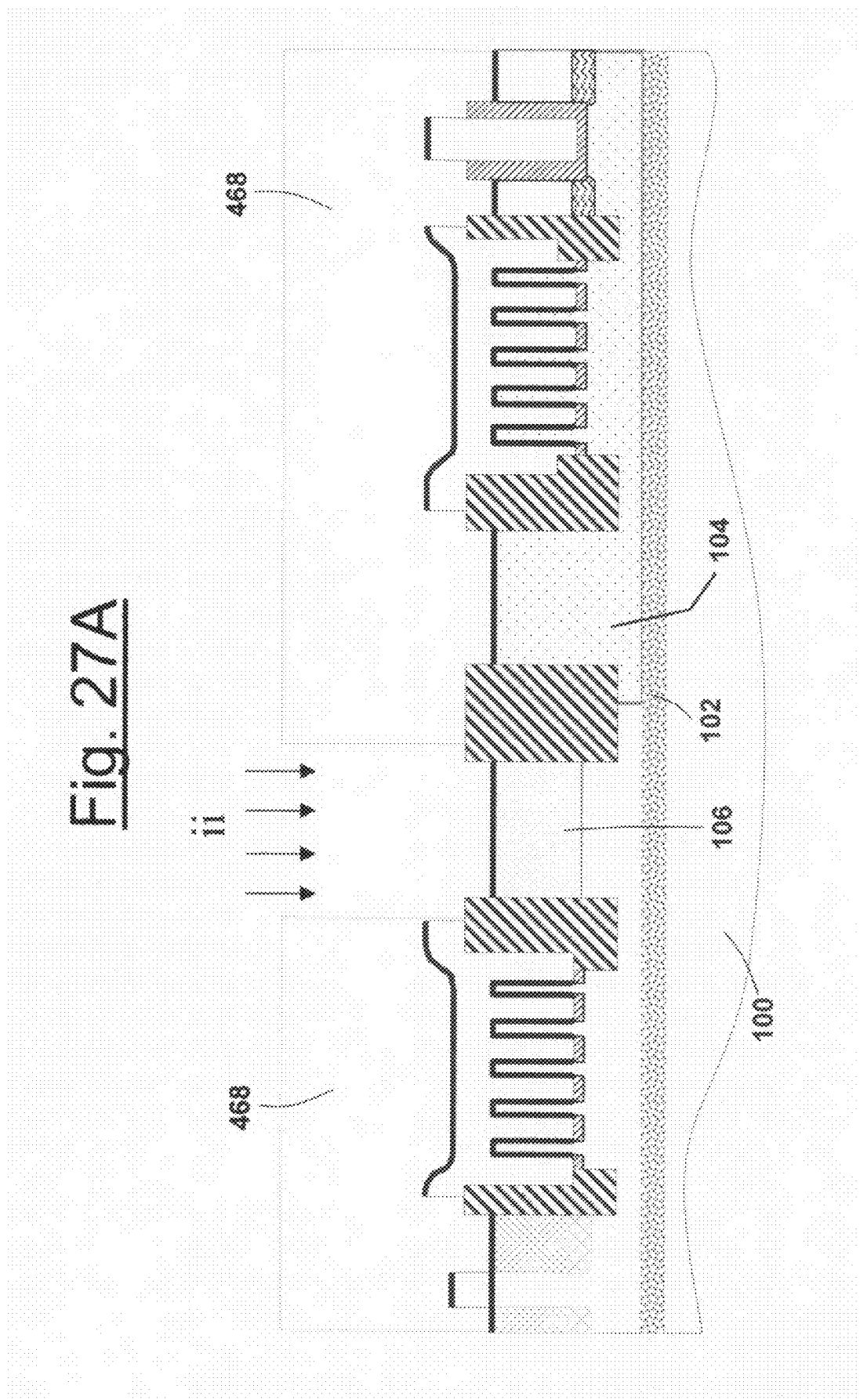

- Final Gate PreCleans
- Core Gate Oxidation
- Core Gate Poly Deposition

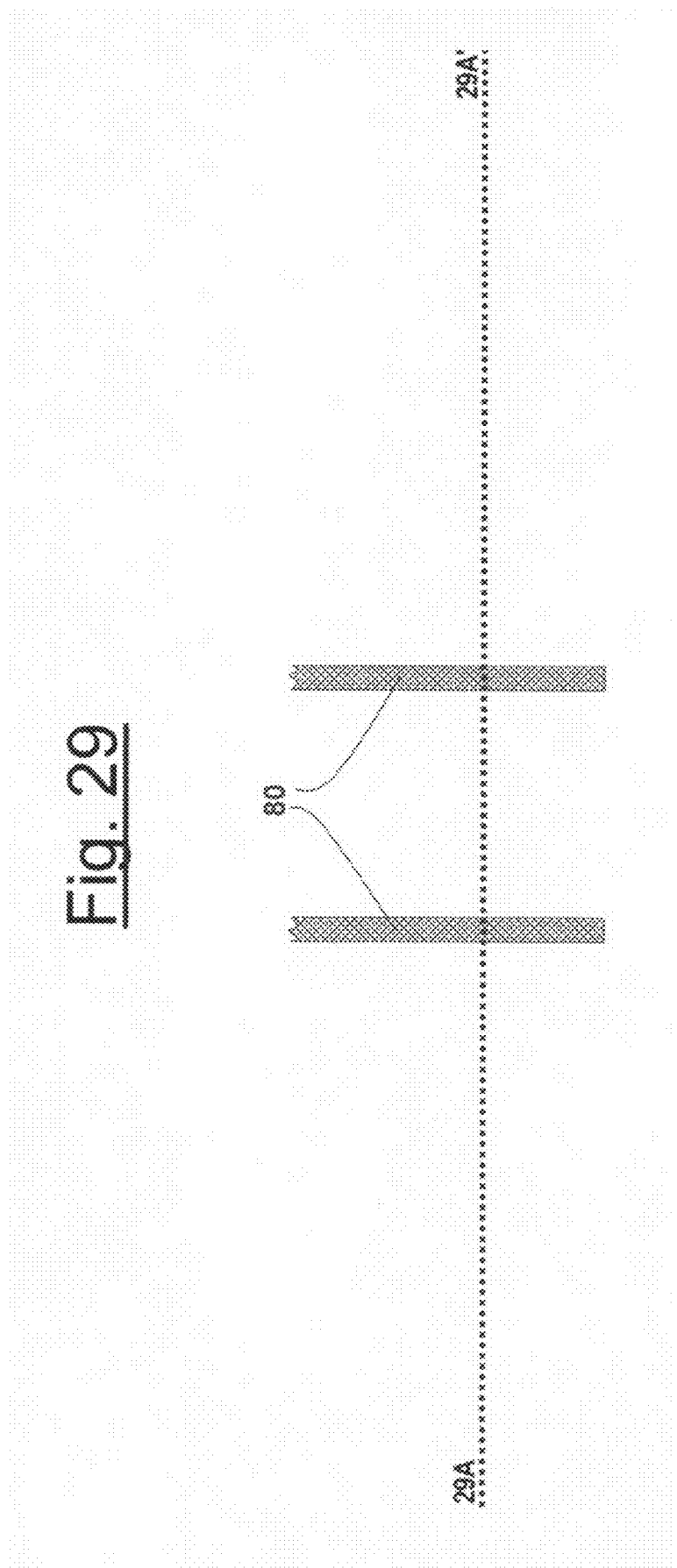

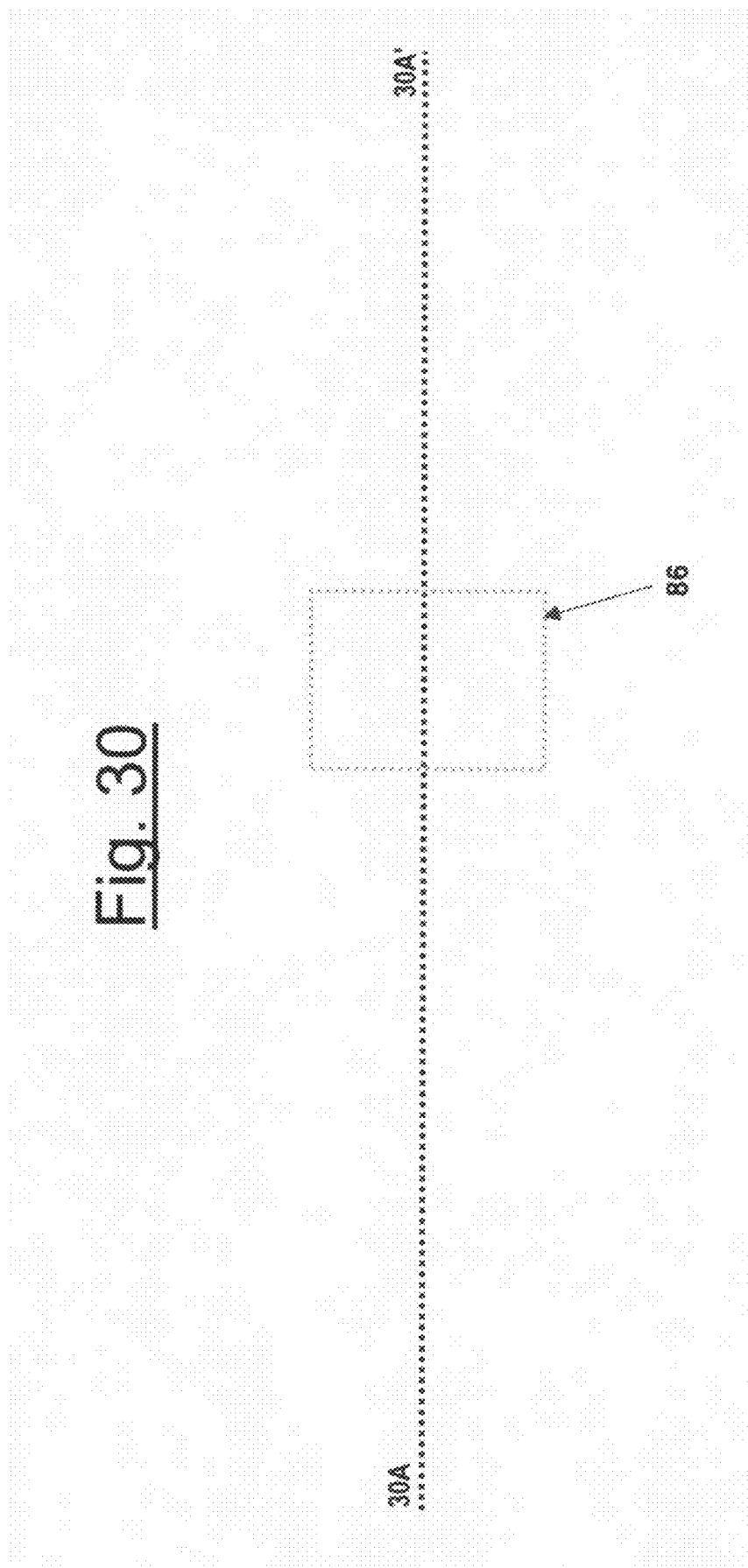

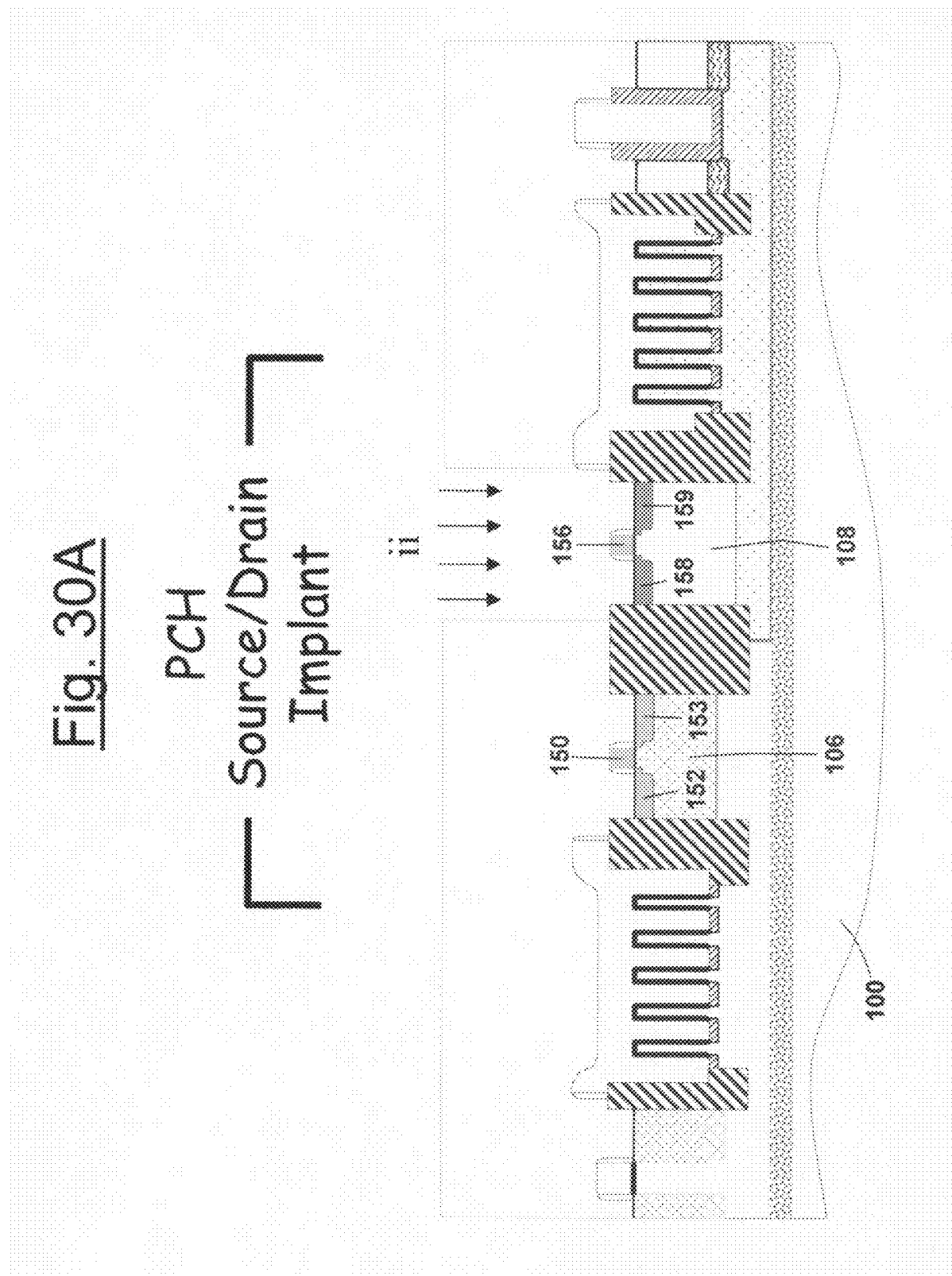

Salicide Block Post-Etch

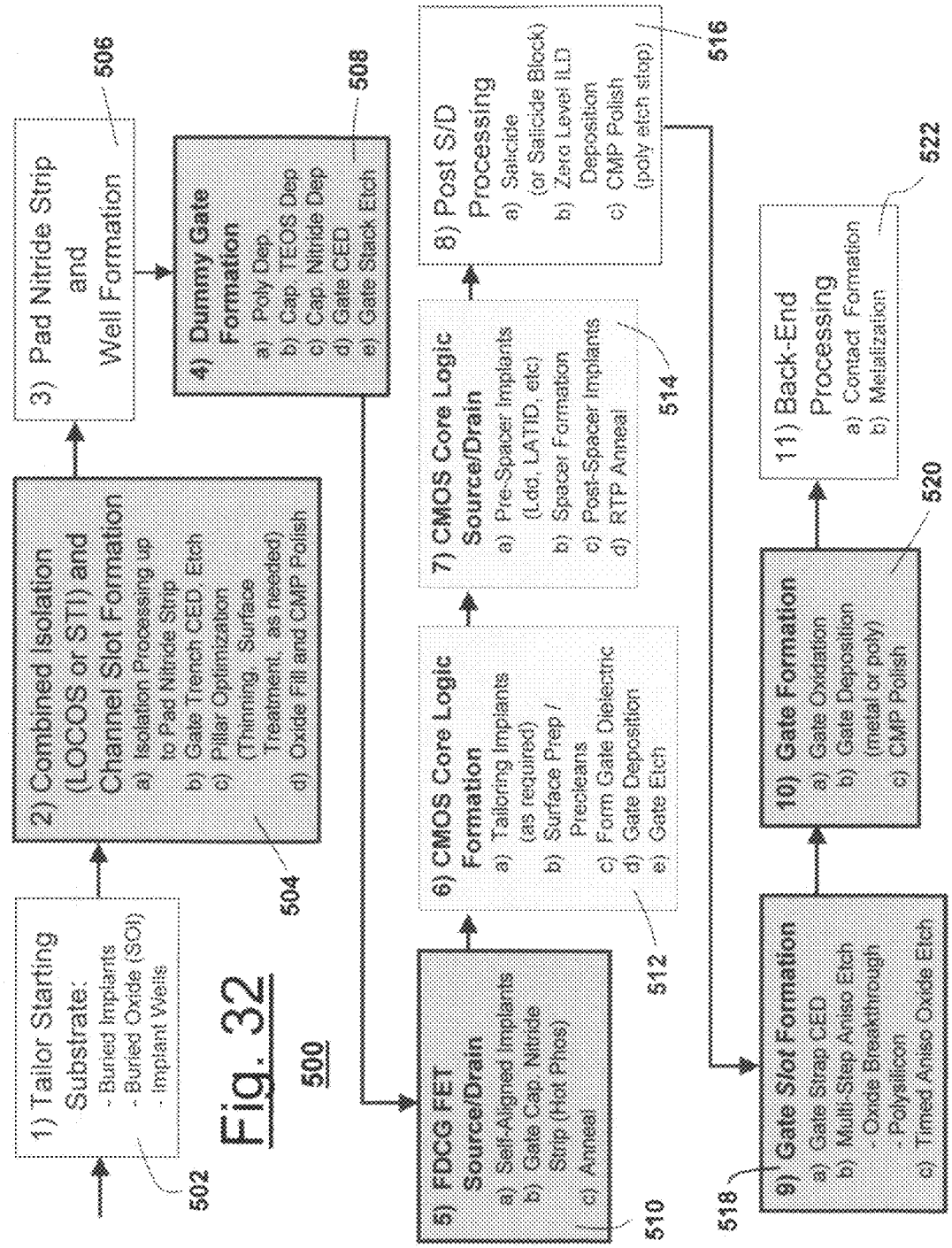

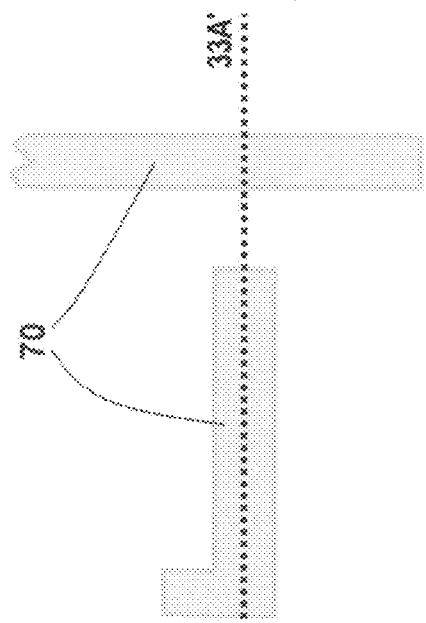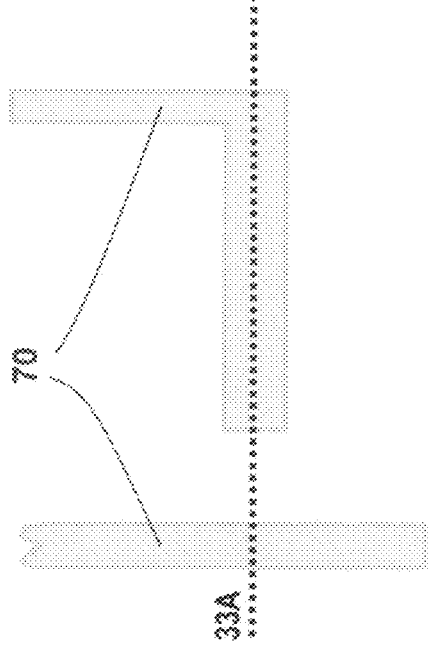
Fig. 33

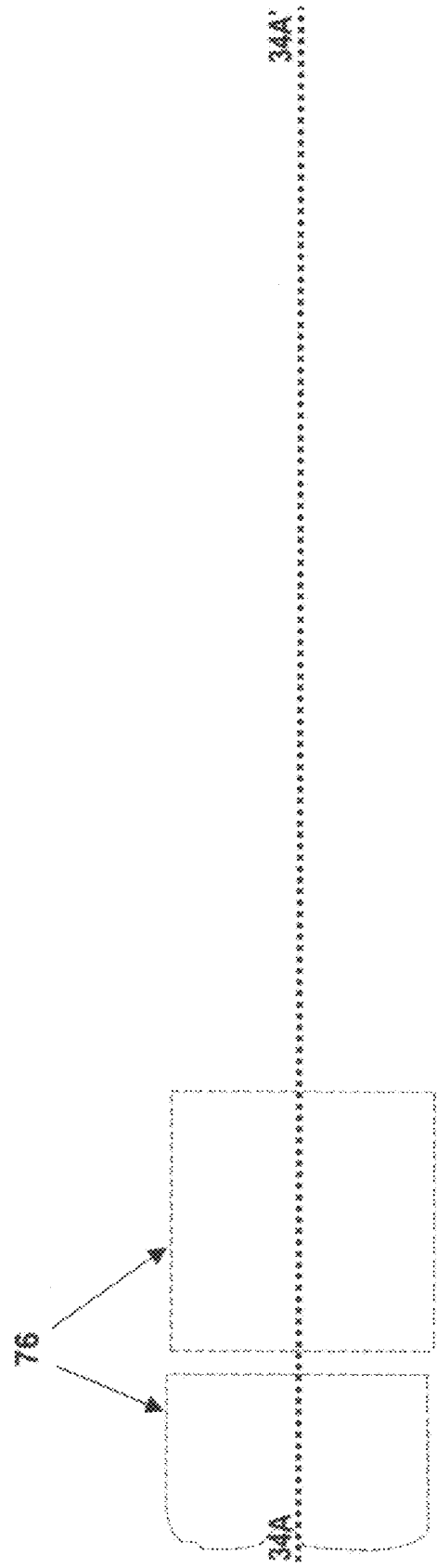

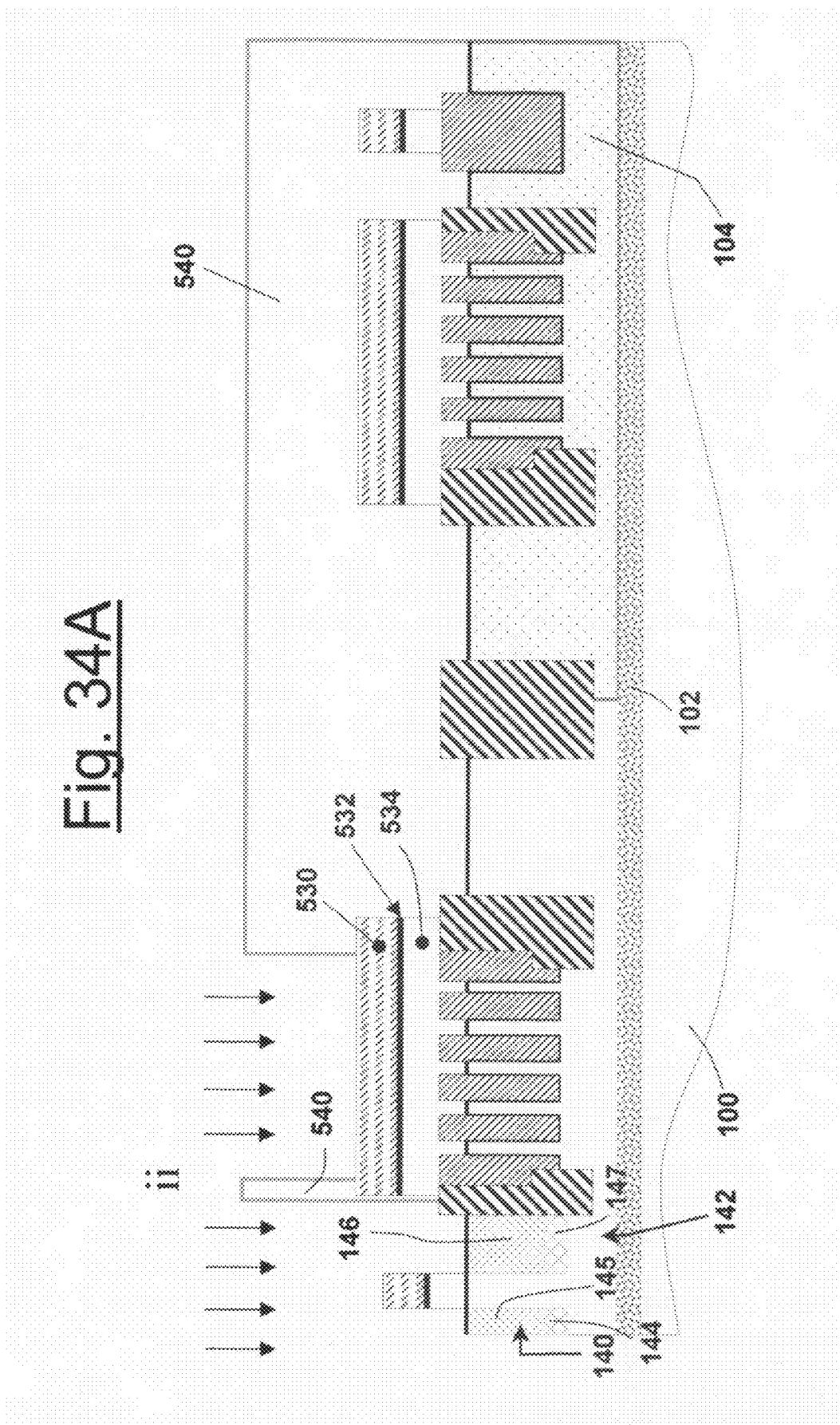

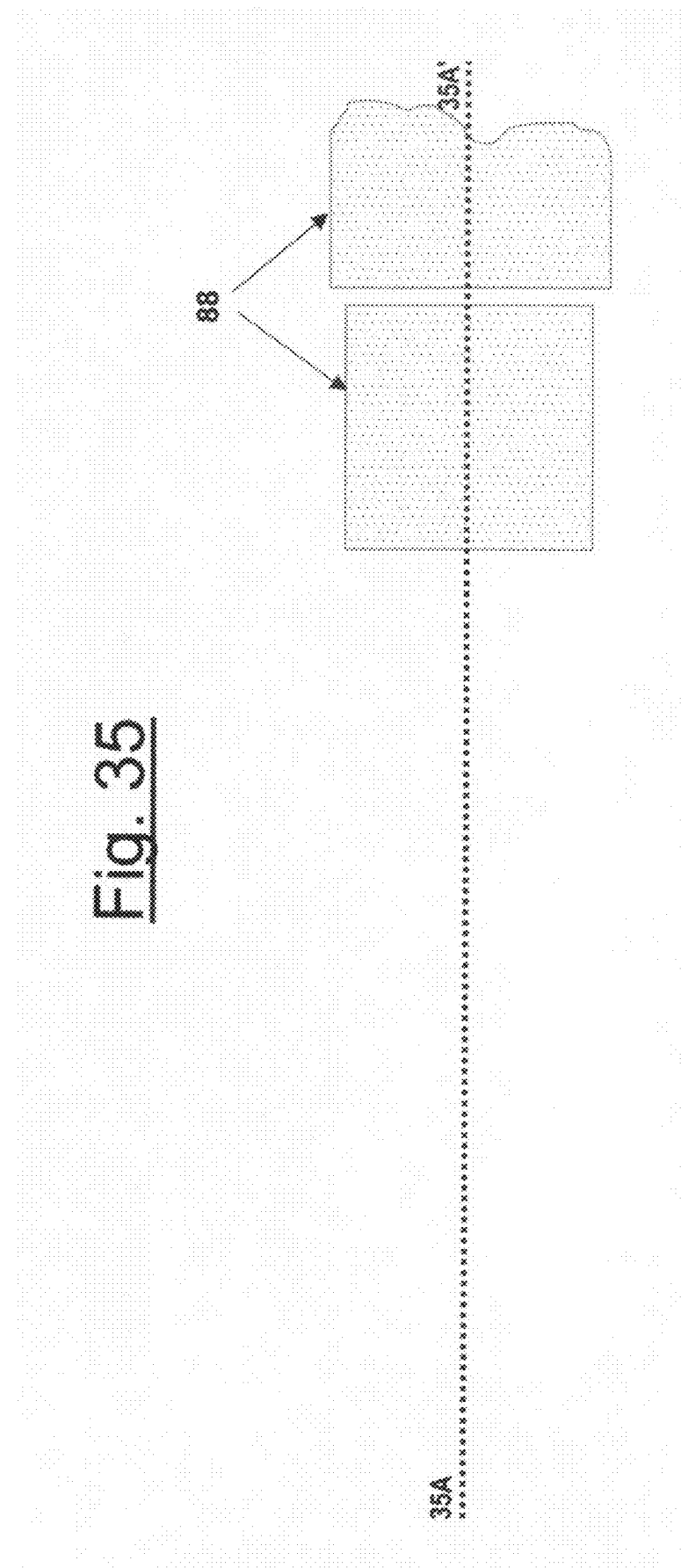

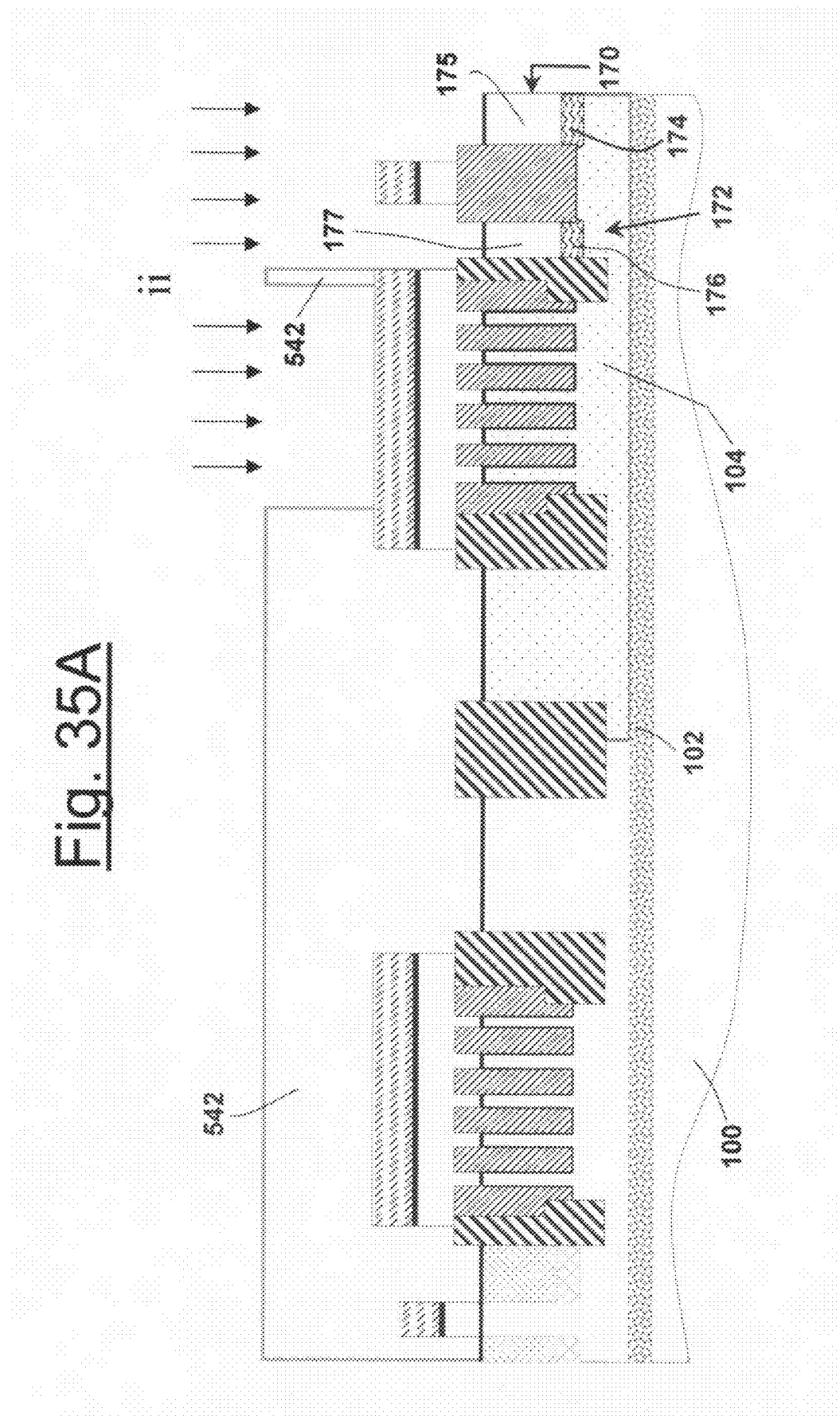

- Zero-Level ILD Dep
- CMP Polish (poly1 etch stop)

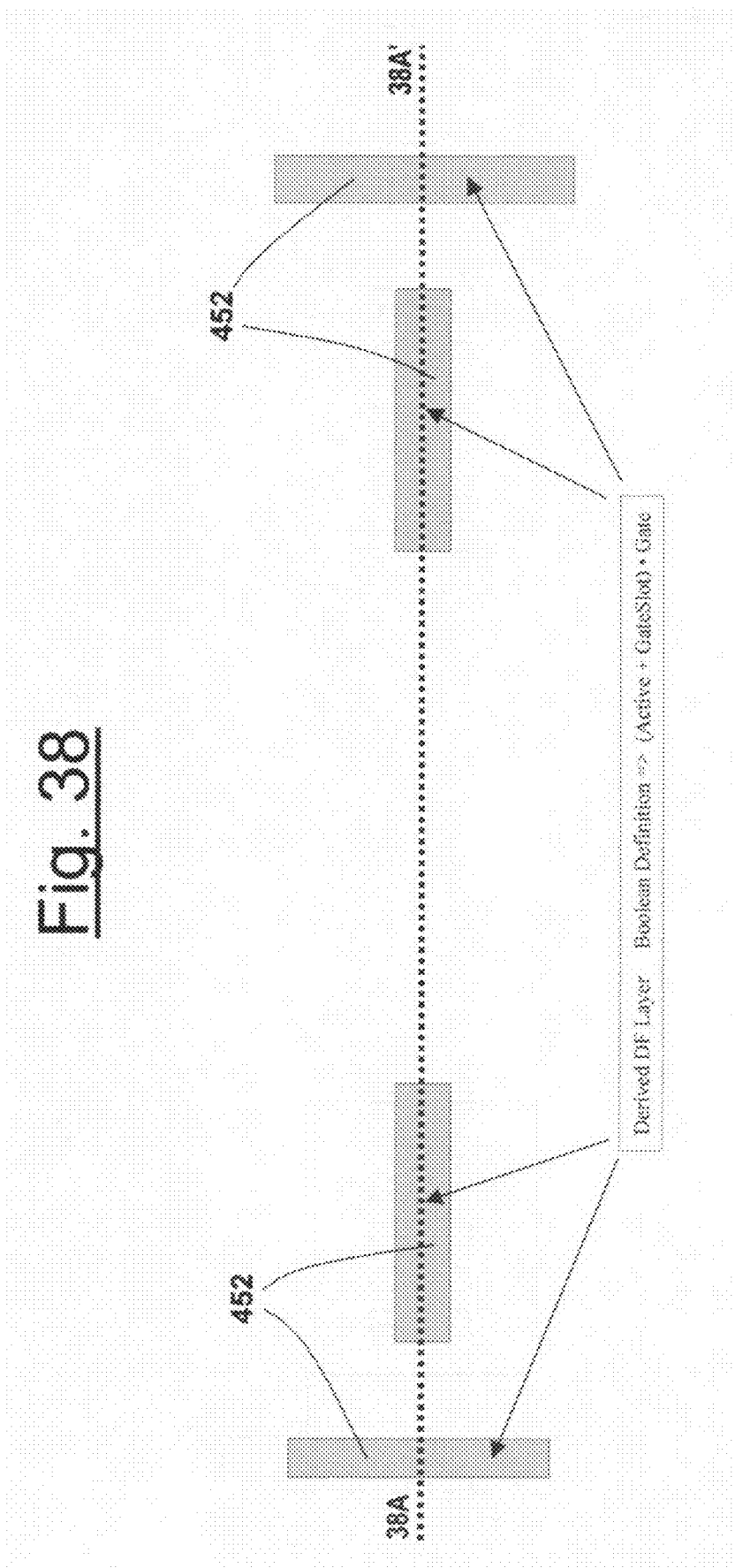

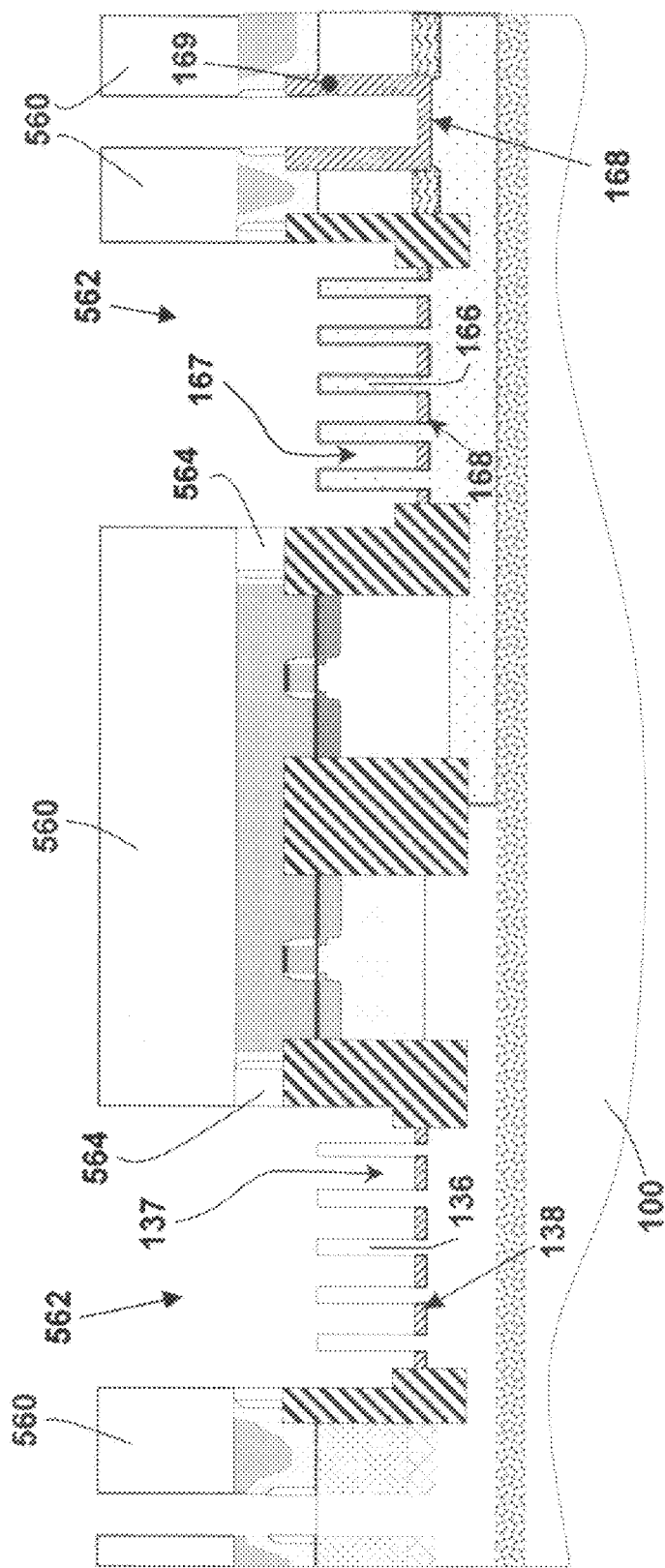
Fig. 38A — Aniso Oxide Etch

- Pillar Optimization
- Gate Oxidation
- Gate Deposition
- CMP Polish

MIXED-SIGNAL SEMICONDUCTOR PLATFORM INCORPORATING FULLY-DEPLETED CASTELLATED-GATE MOSFET DEVICE AND METHOD OF MANUFACTURE THEREOF

CROSS REFERENCE TO RELATED APPLICATIONS

This application is a division of U.S. patent application Ser. No. 11/249,002, filed Oct. 12, 2005 now U.S. Pat. No. 7,719,058, by John J. Seliskar, entitled "A Mixed-Signal Semiconductor Platform Incorporating Fully-Depleted Castellated-Gate MOSFET Device and Method of Manufacture Thereof", the contents of which are hereby expressly incorporated herein by reference. The present invention is also related to an additional application entitled "An improved Fully-Depleted Castellated Gate MOSFET Device and Method of Manufacture Thereof", Ser. No. 11/728,111, filed Mar. 23, 2007, by John J. Seliskar, now U.S. Pat. No. 7,439,139.

BACKGROUND OF THE INVENTION

1. Field of the Invention

The present invention relates to a semiconductor device primarily intended for mixed-signal and analog applications which incorporates devices to perform logic operations and devices to perform an Input/Output (I/O) function, and a manufacturing method thereof, and more particularly to a semiconductor device including Castellated-Gate MOSFET devices capable of Fully-Depleted operation and complimentary MOS (CMOS) transistors functioning as logic devices, and to a manufacturing method thereof.

2. Description of the Prior Art

In complex systems that perform signal processing, power management, and computing operations, the logical, analog, and other functions are often performed by various and often different semiconductor device structures that are fabricated by various manufacturing methods. In the effort to reduce system cost, increase performance, or increase reliability, one or more of these manufacturing methods are often integrated to create a semiconductor device that can perform a greater variety of functions on a single chip. In the field of analog, mixed-signal, and power electronics in particular, technologies that combine different types of active devices onto a common wafer substrate are quite prevalent. Some examples of these semiconductor technology platforms include U.S. Pat. Nos. 3,404,450, 4,475,279, 4,960,726, 6,288,427, and 6,392,275.

More particularly, in the area of analog and mixed-signal semiconductor VLSI devices involved in high-speed communications, the Input/Output (I/O) device must be able to drive relatively large loads, while simultaneously being robust from a reliability standpoint, as it may be used or exist in a less-controlled signaling environment than found in all-digital systems The aforementioned device performance characteristics are often at odds with those of the devices that perform low power logic and/or computing functions within modern, highly integrated VLSI chips, including Application-Specific-Integrated-Circuits (ASICs), Application-Specific-Standard-Products (ASSPs), Field Programmable Gate Arrays (FPGAs), or Systems-On-A-Chip (SoCs). In silicon-based technologies at the present time, these logic and computing functions are overwhelmingly performed by Complimentary Metal Oxide Semiconductor devices (CMOS).

The progression of CMOS device scaling, that is planer MOSFET, has seen a continuous shrinking of transistor dimensions in both the vertical and the horizontal dimensions resulting in an approximate doubling of the number of transistors per unit area every 18 months or so. From the economics perspective, this scaling progression has resulted in CMOS becoming the preeminent technology for packing system functions on a microchip. The desire to shrink MOSFET gate channel lengths and hence area, as width-to-length ratios remain roughly constant, requires the simultaneous vertical scaling of both the gate oxide and the source/drain junctions. This creates the requirement that the power supply (Vdd) also scale, as indicated above. The power supply voltage must scale so as to maintain gate oxide integrity (breakdown/wear-out due to voltage stress), to provide adequate junction breakdown margin, and to minimize device lifetime reduction due to hot carrier injection. Unfortunately, while CMOS scaling has enabled the circuit and system designer to pack a tremendous amount of functionality onto a silicon die, it has simultaneously created a number of significant problems as far as the chip's ability to interface with the outside world.

The CMOS device scaling behavior, discussed above, combined with the continuing drive to utilize semiconductor chip area while maintaining I/O compatibility has resulted in the evolution of baseline CMOS ASIC/SOC process technologies that now have two or more gate oxides to account for the need to operate efficiently at two, and sometimes three, power supply levels. Having begun at roughly the 0.25 um node, this is currently the approach taken by certain mainstream ASIC/ASSP semiconductor producers or foundries. These technology offerings generally consist of a baseline process flow that has a fully scaled and optimized thin oxide core device to the extent that the current process manufacturing technology allows, and a thick oxide device which is essentially the core device from the previous technology generation. Unfortunately, in such technology evolution, the thick oxide I/O device has become somewhat of a "forgotten stepchild", as only the thin-oxide core devices can truly take advantage of the shrinking feature sizes that are enabled by state-of-the-art photolithography. More importantly, as the thick oxide device is a "leftover" from the previous technology node, it typically under-performs the thin-oxide core device in terms of speed/bandwidth ($f_t$).

In addition to the speed performance and oxide reliability issues stated above, a number of other I/O robustness issues arise in analog and mixed-signal applications. These issues include EMI (electromagnetic interference)/ESD (electrostatic discharge), and more generally, EOS (electromagnetic overstress). For example a power amplifier must be able to withstand a high VSWR (voltage standing wave ratio) in the event that its output load becomes mismatched during transmission. In a second example, Latch-Up phenomenon must also be taken into account when using bulk-wafer based semiconductor devices, which can pose additional challenges in analog and mixed-signal applications. Consequently, while CMOS technology scaling provides a clear path to a greater degree of chip-level system integration in the digital domain, the scaling behavior of the planer CMOS transistor does not provide equivalent advantages in the area of analog and mixed-signal I/O.

At present, BiCMOS (bipolar-CMOS combination) technologies, and particularly SiGe bipolar, offer a solution to some of the problems discussed above. However, a number of difficulties persist including, in particular, power consumption, cost and scalability. Bipolar devices consume significantly more power than CMOS devices, which increases package cost and at some point renders them unsuitable as a system solution, in particular for portable devices. From the standpoint of scaling, bipolar technologies have hit an apparent limit in terms of increasing performance for a given density and power consumption. Bipolar devices by nature, like the thick oxide CMOS I/O devices discussed earlier, cannot take full advantage of decreasing feature sizes which result from advances in wafer patterning technology (photolithography). The integration of CMOS and bipolar devices (BiCMOS) reduces the power consumption problem but leads to a second difficulty, i.e. cost. High performance technologies, such as SiGe BiCMOS cost upwards of 25% or more than CMOS-only devices at the same feature sizes. Finally, the combined SiGe BiCMOS technology platform faces another very significant cost related obstacle: manufacturability. The production of SiGe NPN bipolar devices involves the formation of a very delicate Germanium doping profile which requires stringent process control. The sensitivity of the resulting NPN device to thermal processing generally means that it must be added last in the BiCMOS process sequence. Consequently the core digital devices must absorb the effects of additional thermal and plasma processes, many of which can lead to device parametric shifts and subsequent parametric yield loss. While sophisticated SiGe BiCMOS technologies have been demonstrated at MOSFET gate lengths down to 90 nm on 300 mm wafers, future nanoscale CMOS, or other digital core technologies are likely to require physical structures (strained Si/SiGe, high-k gates) that may be as delicate and sensitive from a process integration perspective, as the SiGe bipolar base structure; this trade-off could be a major obstacle in a combined mixed-signal SoC platform.

Clearly, the trends and problems discussed above may soon create a situation where it is no longer desirable to integrate a significant amount of analog functionality into a single-chip mixed-signal system solution, thus eliminating one of the traditional paths to reduce cost and power consumption in electronic systems. Accordingly, there is a need for a new type of combined silicon technology platform that takes advantage of the low power and economic advantages of CMOS in addition to enhancing the I/O function through decreasing feature sizes. There continues to be development of technology platforms which overcome some of the aforementioned problems. Some specific recent examples of these efforts are illustrated in U.S. Pat. Nos. 6,756,274 and 6,806,554. In other more-specific developments related to the present invention, the combination of planer MOSFETs and vertical FinFETs (e.g. a single channel castellated-gate MOSFET) have recently been published by Masahara et. al., "A Novel Process for Co-Integration of Vertical Double-Gate and Planar Single-Gate MOSFETs" IEEE DRC #61 (2003), pp. 49-50. In this case however, the combination of these two device types was proposed for core logic applications to solve the problem of a lack of channel length design selectability in the case where the vertical dimension of the fin defines the device channel length; this is a substantially different problem than the one solved by the invention disclosed herein. In spite of these recent developments in the art, a number of problems continue to persist. Therefore, there remains a need in the art for a silicon semiconductor device and technology platform that combines a high density core device technology for logic and computing functions with a high performance I/O device for analog and mixed-signal applications. The present invention addresses and solves these particular problems in the art.

SUMMARY OF THE INVENTION

Accordingly, it is one object of the present invention to provide an improved semiconductor device and technology platform that incorporates one or more types of semiconductor logic device with at least one type or polarity of castellated-gate MOSFET device capable of fully depleted operation.

It is another object of the present invention to provide an all-CMOS VLSI technology platform for analog and mixed-signal applications having robust and high-speed I/O capability, wherein the output devices have drive current per unit area increases up to an order-of-magnitude (>10×) or greater than existing planar CMOS VLSI I/O devices.

It is another object of the present invention to provide an all-CMOS VLSI technology platform for analog and mixed-signal applications having robust and high-speed I/O capability, wherein the output devices have a Unity Gain Frequency that is three to five times (3× to 5×) greater than existing planar CMOS VLSI I/O devices for a given wafer area.

It is another object of the present invention to provide an all-CMOS VLSI technology platform for analog and mixed-signal applications which is capable of providing analog functions with dynamic range performance significantly beyond that of existing CMOS VLSI technologies that utilize planar MOSFET devices to perform the I/O function.

It is another object of the present invention to provide an all-CMOS VLSI technology platform for analog and mixed-signal applications which incorporates I/O devices which have reduced sensitivity to substrate noise and crosstalk generated by the digital logic functions.

It is another object of the present invention to provide an all-CMOS VLSI technology platform for analog and mixed-signal applications which is capable of providing high-efficiency and area-dense power management functions, such as integrated DC-DC converters.

It is another object of the present invention to provide an all-CMOS VLSI technology platform for analog and mixed-signal applications which is capable of providing high speed transceiver functions for data transmission that utilize extended multilevel signaling methods.

It is another object of the present invention to provide a method to manufacture the semiconductor device.

It is yet another object of the present invention to provide such a combined device in which the I/O device component is relatively immune to the thermal, plasma, and other processing steps utilized in semiconductor device fabrication to create the logic devices, and therefore may be formed first in the serial process sequence to create the combined device.

It is yet another object of the present invention to provide such a combined device in which the addition of analog functionality to existing functional blocks of logic and/or memory does not significantly degrade the net parametric or defect-limited yield of those blocks.

Yet another object of the present invention is to provide a combined semiconductor device in which the physical design layout shapes (masks) that form the I/O device (castellated-gate MOSFET) are substantially transportable between process sequences that use bulk starting wafers and Silicon-On-Insulator (SOI) starting wafers.

To achieve the foregoing and other objects and in accordance with the purposes of the present invention, as embodied and broadly described herein, a mixed-signal semiconductor device and technology platform incorporating castellated-gate MOSFET devices capable of fully depleted operation is disclosed along with a method of making the same. The combined semiconductor device has robust I/O applications and includes a starting semiconductor substrate of a first conductivity type. One or more isolated regions of at least first and second conductivity types are separated by trench isolation insulator islands. Within an isolated region designated for castellated-gate MOSFETs there exists a semiconductor body consisting of an upper portion with an upper surface, and a lower portion with a lower surface. Also within the castellated-gate MOSFET region, there exists a source region, a drain region, and a channel-forming region disposed between the source and drain regions, and are all formed within the semiconductor substrate body. The channel-forming region within the isolated castellated-gate MOSFET region is made up of a plurality of thin, spaced, vertically-orientated conductive channel elements that span longitudinally along the device between the source and drain regions.

In one modification of the combined device, two polarities of castellated-gate MOSFET (that is, N-Channel and P-Channel) are provided with a pair of CMOS logic devices on a common substrate. In this combination, the N-Channel castellated-gate MOSFET will reside within a region of a first conductivity type, which may be shared with a CMOS logic device of appropriate polarity. The P-Channel castellated-gate MOSFET will reside within a region of a second conductivity type, which also may be shared with a CMOS logic device of appropriate polarity.

In another arrangement of the combined device, two or more types of castellated-gate MOSFET (that is, enhancement mode and/or depletion mode) sharing a common polarity may be provided with a pair of CMOS logic devices in a common substrate. Within this combination, the castellated-gate MOSFETs will reside in separate regions that may have the same conductivity type, but at different doping concentrations. A CMOS logic device may share a region of a specific conductivity type with a castellated-gate MOSFET, while still remaining separated by trench isolation.

In a further modification, a Silicon-On-Insulator wafer is used as the starting substrate. In one alternative to this modification, the buried insulator layer is spaced below the bottom surface of the trench isolation islands resulting in a common semiconductor connection within the castellated-gate MOSFET region, in the lower portion of that device. In another alternative, the buried insulator layer abuts the bottom surface of the trench isolation islands.

In a more specific aspect of the invention, the gate element materials used to form one or more types of castellated-gate MOSFET are selected from the group consisting of polysilicon, tungsten, titanium, tantalum and composites thereof, and the dielectric layer may be selected from the group consisting of silicon dioxide, lanthanum oxide, hafnium oxide, oxynitride (ONO), and silicon nitride. Additionally within the combined device, one or more castellated-gate MOSFETs may each utilize different gate materials selected from this group, or share common gate structures. Castellated-gate MOSFETs may also share gate materials with CMOS logic devices.

In yet another specific modification of the invention, the starting substrate is selected from the group consisting of bulk, epitaxial, and bonded silicon wafers, preferably with an upper active layer of 100-crystalline orientation. This group may additionally include engineered substrates containing strained silicon layers and/or silicon-germanium heterostructures and engineered substrates including silicon carbide wafers with or without deposited active layers.

Another modification of the invention includes a method of manufacturing a combined semiconductor technology platform for analog and mixed-signal applications which incorporates a set of logic devices and one or more castellated-gate MOSFET devices capable of fully-depleted operation. The method includes the steps of creating a starting silicon semiconductor substrate, and then applying active layer pad nitride masks to form shallow trench isolation islands in the substrate. Next, castellated-gate MOSFETs are fabricated within predetermined regions by forming a plurality of thin vertical silicon channel elements. After doping the castellated-gate MOSFET region(s) using ion-implantation, one or more gate insulators are formed using sequential or parallel steps, followed by the deposition of vertical gate elements in between the vertical silicon channels, also using either a sequential or parallel method. One or more gate patterning steps may be applied (for one or more castellated-gate MOSFETs) to form a gate conductor strap(s) that connects vertical gate elements together at their upper end surfaces. Fabrication of the castellated-gate MOSFET devices are completed by forming source and drain regions of an appropriate conductivity type (N-type for N-Channel device, P-type for P-Channel device) by ion implantation at opposite end portions of the appropriate set of spaced, vertical channel elements. After optionally passivating the castellated-gate device regions by deposing and patterning a dielectric or other material, the CMOS logic devices can then be fabricated by the numerous methods known to those skilled in the art. Finally, after completing the fabrication of a set of CMOS logic devices using known methods, additional backend processing, including the optional use of salicide blocking in castellated-gate MOSFET regions, is performed to provide wiring and contacts with which to form circuits.

An alternative method of manufacturing a combined semiconductor technology platform for analog and mixed-signal applications incorporating CMOS logic devices and castellated-gate MOSFETs is also disclosed. This method includes the steps of creating a starting silicon semiconductor substrate, and then applying active layer pad nitride masks to form shallow trench isolation islands in the substrate. Castellated-gate MOSFETs are then fabricated within predetermined regions by forming a plurality of thin vertical silicon channel elements. After doping the castellated-gate MOSFET region(s) using ion-implantation, a planar dummy gate is deposed and patterned. With the dummy gate in place, self-aligned source and drain regions of an appropriate conductivity type (N-type for N-Channel device, P-type for P-Channel device) are formed by ion implantation at opposite end portions of the appropriate set of spaced, vertical channel elements which form the castellated-gate MOSFET(s). With the dummy gate(s) defining the castellated-gate MOSFET(s) still in place, a set of CMOS logic devices are completely fabricated using methods known to those skilled in the art. A thin interlevel dielectric (ILD) layer is then deposited and polished back using the dummy gate of the castellated-gate MOSFET(s) as a chemical mechanical polishing (CMP) etch stop, or reference. Fabrication of the castellated-gate MOSFET(s) is completed by removing the dummy gate, deposing gate insulator(s), deposing gate conductor(s), and polishing them back using CMP. Finally, the combined semiconductor device is completed by performing backend processing steps known to those skilled in the art to form contacts and wiring with which to form circuits.

BRIEF DESCRIPTION OF THE DRAWINGS

The accompanying drawings which are incorporated in and form a part of the specification illustrate preferred embodiments of the present invention and, together with a description, serve to explain the principles of the invention. In the drawings:

FIG. 3 is a cross-sectional view of a generic embodiment of the present invention, illustrating a semiconductor device which incorporates one or more types of logic devices along with one or more types of polarities of castellated-gate MOSFET devices capable of fully-depleted operation on a common semiconductor substrate;

FIG. 4 includes detailed and simplified perspective views of a castellated-gate MOSFET device capable of fully depleted operation, in accordance with the present invention;

FIG. 5 is a structural representation illustrating the electrical behavior of a Fully-Depleted Castellated-Gate device constructed in accordance with the present invention;

FIG. 6 includes both cross-sectional and perspective views of prior art semiconductor devices which can be used to perform logic and storage functions;

FIG. 7 is a top view of the photolithography masking elements of a first embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 7A is a cross-sectional view taken substantially along line 7A-7A' of FIG. 7;

FIG. 8 is a top view of the photolithography masking elements of a second embodiment of the present invention, illustrating N-Channel and P-Channel MOS logic devices, N-Channel Fully-Depleted Castellated-Gate MOSFETs of a first orientation having first and second threshold voltages, and N-Channel Fully-Depleted Castellated-Gate MOSFETs with first and second threshold voltages in orientations 90° relative to the first orientations, to illustrate the complete structure of the embodiment;

FIG. 8A is a cross-sectional view taken substantially along line 8A-8A' of FIG. 8;

FIG. 10 is a generic flow diagram illustrating one possible baseline process for constructing a device in accordance with the present invention;

FIG. 11 is a generic flow diagram based on FIG. 10. of a first basic process for constructing a device in accordance with the present invention in the case of a CMOS core logic/memory technology;

FIG. 13 is a top view of a subsequent process step for the embodiment of the present invention wherein active layer masks are applied to form shallow trench isolation. The figure illustrates N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 13A is a cross-sectional view taken substantially along line 13A-13A' of FIG. 13;

FIG. 14 is a top view of a subsequent process step for using the gate slot mask to form openings in photoresist in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 14A is a cross-sectional view taken substantially along line 14A-14A of FIG. 14;

FIG. 15 is a sectional view of another subsequent process step illustrating the first of a multi-step etch procedure to form the trenches for the gate conductor in the same embodiment of the present invention;

FIG. 16 is a sectional view of another subsequent process step illustrating the isotropic etching of nitride hardmasks directly after performing the anisotropic nitride etch illustrated in FIG. 15 in the same embodiment of the present invention;

FIG. 17 is a sectional view of another subsequent process step illustrating the anisotropic etching of silicon dioxide as part of a multi-step etch procedure to form the trenches for the gate conductor in the same embodiment of the present invention;

FIG. 18 is a sectional view of a final process step illustrating the anisotropic etching of silicon as part of a multi-step etch procedure to form the trenches for the gate conductor in the same embodiment of the present invention;

FIG. 20A is a cross-sectional view taken substantially along line 20A-20A of FIG. 20;

FIG. 21 is a top view of another subsequent process step for using a mask derived from the Active, Gate, and Gate Slot masks to form openings in photoresist in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 22 is a sectional view of yet another subsequent process step illustrating the forming of the trench bottoms by anisotropic etching in the same embodiment of the present invention;

FIG. 25 is a top view of yet another subsequent process step for forming self-aligned source and drain regions for the N-Channel Fully-Depleted Castellated-Gate device through the application of source and drain masks in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 25A is a cross-sectional view taken substantially along line 25A-25A of FIG. 25;

FIG. 27 is a top view of yet another subsequent process step for forming an optimized body region for a planer N-Channel MOS logic device in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 27A is a cross-sectional view taken substantially along line 27A-27A of FIG. 27;

FIG. 29 is a top view of another subsequent process step for patterning and etching the gate film of the N-Channel and P-Channel MOS logic devices using a gate mask in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 30 is a top view of yet another subsequent process step for forming self-aligned source and drain regions for the P-Channel MOS logic device through the application of source and drain masks in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 30A is a cross-sectional view taken substantially along line 30A-30A of FIG. 30;

FIG. 32 is a generic flow diagram illustrating a second basic process of constructing a device using a dummy gate to form the embodiment in accordance with the present invention;

FIG. 33 is a top view of a subsequent process step for applying a gate mask with a dummy gate stack in place followed by a three-step anisotropic etch sequence in the second embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 34 is a top view of yet another subsequent process step for forming self-aligned source and drain regions for the N-Channel Fully-Depleted Castellated-Gate device through the application of source and drain masks in the second embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 34A is a cross-sectional view taken substantially along line 34A-34A of FIG. 34;

FIG. 35 is a top view of yet another subsequent process step for forming self-aligned source and drain regions for the P-Channel Fully-Depleted Castellated-Gate device through the application of source and drain masks in the second embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 35A is a cross-sectional view taken substantially along line 35A-35A of FIG. 35;

FIG. 38 is a top view of yet another subsequent process step illustrating the forming of the trench bottoms by anisotropic etching, and simultaneously forming a segment of the dummy gate material which is disconnected from the final gate conductor, in the second embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment;

FIG. 38A is a cross-sectional view taken substantially along line 38A-38A of FIG. 38;

DETAILED DESCRIPTION OF THE EXEMPLARY EMBODIMENTS

One attractive approach to the aforementioned problems, and particularly high speed VLSI I/O, is to incorporate fully-depleted castellated-gate (FDCG) MOSFETs as an add-on to a standard core logic or memory technology such as CMOS, thereby creating a combined silicon technology platform with enhanced analog and mixed-signal performance characteristics. Consistent with existing combined semiconductor technologies such as BiCMOS, BiCDMOS or the early BiFET processes, the present invention marries a core logic or memory device technology such as CMOS with a robust I/O device, thereby creating an integrated technology platform with extended functionality. An important feature of the present invention is that the fabrication steps of the I/O device can be substantially or entirely completed prior to the fabrication of the core logic devices since castellated-gate device structures are physically more stable in the presence of plasma and thermal processing than other alternatives known in the art. Consequently, analog and mixed-signal functionality may be incorporated within a single device without degrading the performance or yield of the core logic devices which typically account for the major portion of chip die area (cost), and provide the substantial portion of the functional value of the integrated system.

Figure 1:
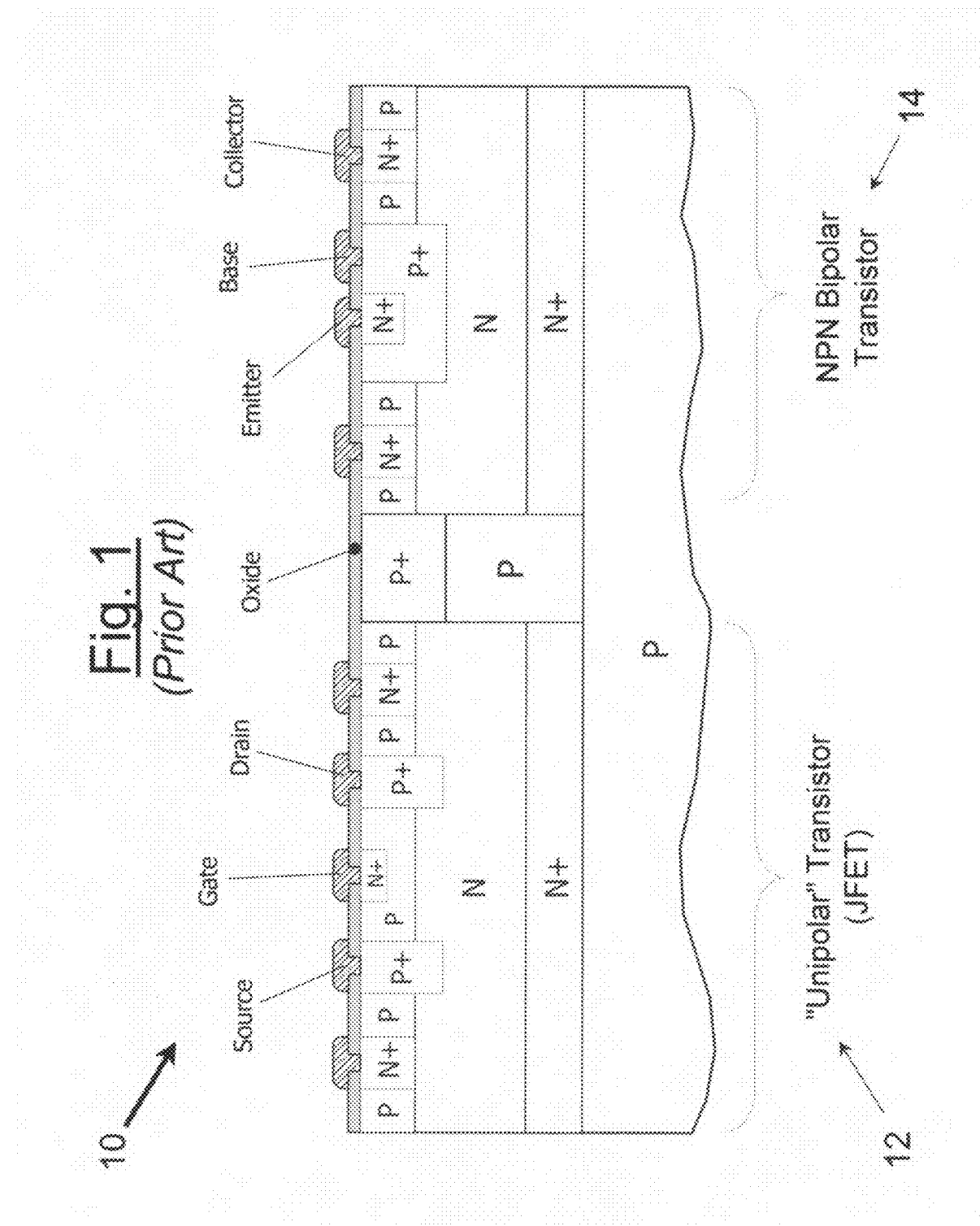
FIG. 1 is a cross-sectional view of a prior art semiconductor device which incorporates an NPN bipolar junction transistor and a unijunction transistor (JFET) on a common substrate.
Figure 2:
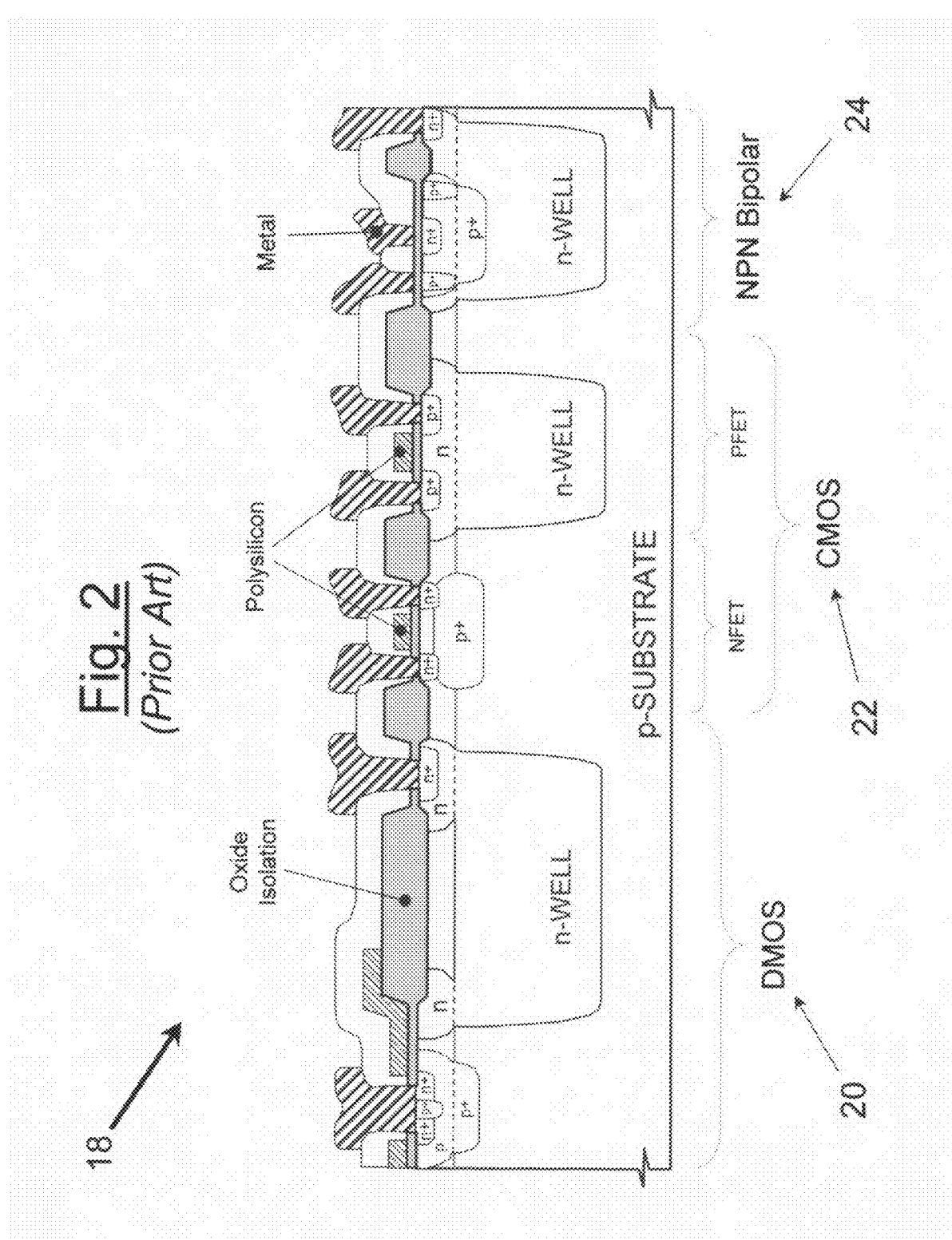
FIG. 2 is a cross-sectional view of a prior art semiconductor device which incorporates a high voltage DMOS transistor, CMOS transistors (N-Channel and P-Channel), and an NPN bipolar junction transistor on a common substrate.

From a structural standpoint, semiconductor technologies that integrate different types of active devices onto a common substrate typically segregate them laterally into different regions using structures such as trench isolation or zones of different material conductivity type. Referring now to FIG. 1, a cross-sectional view of a combined BiFET technology 10 includes both unipolar transistors (JFETs) 12 in one region, and NPN bipolar junction transistors 14 in a second region on a common substrate, separated by p-type diffusion. In another example shown in cross-section in FIG. 2, a combined BiCDMOS device 18 contains a pair of CMOS devices 22, a DMOS device structure 20, and a NPN Bipolar transistor structure 24.

The combined semiconductor technology platform of the present invention integrates one or more types of logic or memory device with at least one type or polarity of castellated-gate MOSFET device capable of fully depleted operation on a common semiconductor substrate. Referring to FIG. 3, a generic embodiment of a device in accordance with the present invention is illustrated in a crossectional view. The generic combined device embodiment 30 incorporates a castellated gate MOSFET device capable of fully-depleted operation within a region 34, as well as first 36 and second 38 regions designated for first and second types of semiconductor logic devices, respectively. The regions are laterally separated by trench insulator islands 40, and all contained within a common semiconductor substrate 32.

Within the context of the present invention, a generic castellated-gate MOSFET capable of fully-depleted operation is essentially a vertical dual-gate, or tri-gate "FinFET" device, with the important distinction that it normally incorporates multiple "fins" to perform its function, unlike prior art "FinFET" core technology devices which must be optimized to perform their function as a single vertical device or "fin". While the co-integrated core logic devices of the present invention may in fact be CMOS FinFETs or some other multi-gated device, the I/O device of the combined technology platform described herein is intended to be a multi-Fin vertical device targeting operating voltages typically greater than 1.3 Volts, and capable of being fabricated on either bulk or SOI starting substrates. Referring now to FIG. 4, a perspective view illustrates a castellated-gate MOSFET structure 42 capable of fully-depleted operation, disclosed previously in a U.S. patent application with Ser. No. 10/940,093, filed Sep. 13, 2004. The castellated-gate MOSFET structure 42 is a specific case of a more generic castellated-gate structure 44, shown in perspective view, in accordance with the present invention.

The I/O performance improvement of the combined semiconductor technology platform of the present invention will be illustrated in terms of the improved DC and AC electrical performance provided by a fully-depleted castellated-gate (FDCG) MOSFET component. The improved DC drive current capability of a generic FDCG MOSFET can be demonstrated by performing a $1^{st}$-order comparison with the commonly known planer MOSFET device of similar physical area for a given voltage supply level (Vdd). The composite DC electrical behavior of the FDCG MOSFET can be described using the basic structural representation shown in FIG. 5. As shown in the preferred case, a fully-depleted conducting pillar is formed of width (d). The resulting element 48 in the preferred embodiment is essentially a single tri-gated FinFET. The vertical gate conductor elements are of width Wg and extend a predetermined depth (z) into the silicon wafer 32. The electrical channel length of the resulting conducting element 48 is L. The resulting effective electrical "width" of a single element is $W_{pillar}=2z+d$, so it follows that the electrical width of a device with n elements will be $W_{elec}=n(2z+d)$. It should be noted that the segment defined by Wg does not contribute to conduction. The physical width of the generic device 44 (see FIG. 4), i.e. the amount of linear wafer dimension, is $W_{lateral}=nd+(n+1)Wg$. As a first order approximation, the DC terminal characteristics of each pillar device will follow the "square-law" characteristic of a standard MOSFET [$Ids \cong \beta(Vgs-Vt)^2$].

The first-order "drivability" of a MOS device in saturation can be expressed as illustrated in equation (1) below.

$$\text{Driveability} = \frac{Ids}{W_{lateral}} \cong \frac{1/2 \mu_{eff} C_{ox}(W_{elec}/L_{elec})V_{eff}^2}{W_{lateral}} \quad (1)$$

wherein $\mu_{eff}$ is the effective mobility, $W_{elec}$ is the electrical width, $L_{elec}$ is the electrical length, Veff is the overdrive voltage (Veff=Vgs–Vt), and Cox=∈r ∈0/tox. In comparing the generic FDCG MOSFET device to it's planer counterpart, the DC/low-frequency performance improvement can be defined as the ratio of the respective device "driveabilities" for a given gate oxide thickness (tox), or power supply level (Vdd) as indicated in equation (2) below.

$$P_{drv} = \frac{FDCG \; MOS \; \text{Driveability}}{Planer \; MOS \; \text{Driveability}} \quad (2)$$

From the definitions given with respect to FIG. 5 and the relation defined by Equation 2, the DC FDCG MOSFET performance improvement for the tri-gated case can be expressed as follows in equation (3):

$$P_{drv}\bigg|_{TG} \cong \beta \frac{n(2z+d)}{nd+(n+1)Wg}\left(\frac{L_{eSG}}{L_{eDG}}\right) \quad (3)$$

wherein $L_{eSG}$ and $L_{eDG}$ are the minimum channel lengths of a planer single-gate MOSFET and a vertical double-gated or tri-gated MOSFET, respectively. β represents the ratio of the double-gated and single-gated effective mobilities for a given threshold voltage, where 0.75<β<1.00. In the case where the gate slot separation (d) is increased to the point where fully-depleted device operation no long occurs, the $(L_{eSG}/L_{eDG})$ term in Equation 3 approaches unity.

From Equation 3, one can project a DC performance improvement in the range of 6.3×<$P_{drv|TG}$<8.5× between the tri-gate FDCG MOSFET device and its planar counterpart for a power supply level of 5-volts (tox=120A). This performance improvement increases to greater than 10× when the margin for short-channel phenomenon affecting the device are relaxed to levels consistent with digital signal functions.

In terms of small-signal/AC behavior, the performance improvement of the FDCG MOSFET device component of the present invention can be quantified by its Unity Gain Frequency, $f_T$. In the case of a MOSFET, the Unity Gain Frequency is defined as the frequency at which the small signal current gain of the device drops to unity while the Source and Drain terminals are held at AC ground. For a MOSFET in saturation (single or double gate), the following mathematical relationship of equation (4) applies.

$$f_T = \frac{g_m}{2\pi C_{gs}} \cong \frac{1.5\mu_{eff}V_{eff}}{2\pi L^2} \quad (4)$$

Equation 4 can be used to define a performance improvement metric, as was done for the dc "driveability" improvement. The resulting expression for AC performance improvement ($P_{ac}$) of a double or tri-gated FDCG device over it's planer counterpart, for a constant power supply (tox), is as follows in equation 5.

$$P_{ac} = \frac{f_T|_{DG}}{f_T|_{SG}} \cong \beta\left(\frac{L_{eSG}}{L_{eDG}}\right)^2 \quad (5)$$

wherein $L_{eSG}$, $L_{eDG}$, and β are all previously defined. From Equation 5 and available scaling data, the expected AC performance improvement of the FDCG MOSFET device component of the present invention is in the range of 3× to 5× for the power supply levels of interest (1.8<Vdd<5.0).

Referring now to FIG. 6, examples of core logic or memory technologies 50 in accordance with the present invention are illustrated in cross-sectional and perspective views. Planer single-gated MOSFET device 52, shown in crossection, is a commonly known and heavily practiced prior art device used to form VLSI memory and logic circuits. Also shown in cross-section, planar Silicon-On-Insulator (SOI) double-gate MOSFET device 54 is a more recent prior art extension of the basic MOSFET device 52. Three terminal quantum device 56 is an example of a prior art logic element envisioned for future information processing systems. Finally, three terminal gated carbon nanotube device 58, shown in perspective view, is a proposed nanotechnology device for future memory and computing applications.

It should be noted that future extensions of planer single-gated MOSFET device 52 of FIG. 6 may include the use of strained-silicon for the N-Channel device and SiGe heterostructures for the P-Channel device. Quantum device architectures rely heavily on the use of heterostructures formed by techniques such as Molecular Beam Epitaxi (MBE). These device structures have been shown to be parametrically sensitive to subsequent manufacturing steps such as thermal processing. On the other hand, FDCG MOSFETs of the present invention have relatively uniform impurity profiles, as well as physically larger regions of a common conductively type. Consequently, FDCG MOSFETs are readily integrated first in a sequential process flow of a combined technology platform, thereby allowing the I/O device to be created in a first set of manufacturing steps, and not subjecting potentially delicate logic or memory devices to further plasma or thermal processing.

Referring now to FIG. 7, a more specific embodiment of the of the present invention is illustrated with its photo masking layers using a bulk silicon starting wafer. Within this first embodiment shown in FIG. 7, castellated-gate device structures are used in accordance with the referenced patent application. FIG. 7 illustrates a combined device 60 which incorporates planar CMOS logic consisting of an N-Channel device 64, a P-Channel device 66, as well as two N-Channel castellated-gate MOSFETs 62 and two P-Channel castellated-gate MOSFETs 68. Each castellated MOSFET of FIG. 7 is shown in a first orientation, as well as a second orientation that is rotated 90 deg from the first. The combined device 60 of this first embodiment of the present invention includes additional masking layers beyond that of the standard foundry CMOS fabrication process. These include a gate slot mask 72, top-gate/strap mask 70, N-Channel castellated-gate MOSFET source/drain mask 76, and P-Channel castellated-gate MOSFET source/drain mask 88.

FIG. 7A shows the combined device 60 in a cross-sectional view taken substantially along the line 7A-7A' of FIG. 7. In FIG. 7A, N-Channel castellated-gate devices A1 and A2 reside within a predefined region A of p-type conductivity in a substrate 100, separated by trench isolation structures 110 as defined by active layer mask shapes (78 of FIG. 7). In this specific first embodiment of the present invention, the NCH castellated-gate MOSFETs have a super self-aligned structure, with each consisting of a plurality of thin vertical silicon channels 136 that span the distance between a source 140 and a drain 142. The silicon channels of the N-channel castellated gate devices are gated by a plurality of vertical electrodes 134 that are separated from the channels by a dielectric material 120, separated from the source and drain by a spacer (not shown), and connected together at their top surfaces by a conducting strap 132. In this first embodiment, the source 140 and drain structures 142 have a two part structure consisting of heavily doped n-type upper source and drain regions, 145 and 146 respectively, and heavily doped p-type lower source and drain regions, 144 and 147 respectively.

Similarly, the combined device 60, formed in substrate 100, has P-Channel castellated-gate devices C1 and C2 which reside within a predefined region C of n-type conductivity, which may exist within a common N-Well region 104 as defined by an N-Well mask layer (84 in FIG. 7). The P-Channel devices also consist of a plurality of thin vertical silicon channels 166 that span the distance between a source 170 and a drain 172. The silicon channels of the P-Channel castellated gate devices are gated by a plurality of vertical electrodes 164 that are separated from the channels by a dielectric material 121, separated from the source and drain by a spacer 169, and connected together at their top surfaces by a conducting strap 162. As was the case of the N-Channel castellated-gate devices, the source 170 and drain structures 172 of the P-Channel devices also have a two part structure consisting of heavily doped p-type upper source and drain regions, 175 and 177 respectively, and heavily doped n-type lower source and drain regions, 174 and 176 respectively.

The silicon channels 136, 166, respectively of the N-Channel and P-Channel castellated-gate devices may be formed by a common processing step (utilizing the a combined gate-slot mask 72 shown in FIG. 7), or formed by separate operations. Furthermore, castellated-gate electrode structures 132,134 and 162, 164 may be of the same material formed in a common operation (as defined in this embodiment by their common patterning mask 70), or may be different materials fabricated in completely separate steps.

The combined device 60 of the present invention incorporates typical CMOS core devices B in the common substrate 100, consisting of a planer N-Channel MOSFET BN and a planer P-Channel MOSFET BP, separated from each other, and from the castellated-gate devices by trench isolation 110. The N-Channel CMOS device is formed in a predetermined upper region 106 of the substrate having p-type conductivity. The N-Channel device has a highly doped n-type source region 152 and a drain region 153 which are spaced apart by a predetermined interval as defined by the gate electrode 150. Likewise, the P-Channel CMOS device is formed in a predetermined upper region 108 of the substrate having n-type conductivity, as defined by an N-Well region 104. The P-Channel device has a highly doped p-type source region 158 and a drain region 159 which are spaced apart by a predetermined interval as defined by the gate electrode 156. As is common practice in typical CMOS core process technologies, the N-Channel and P-Channel logic devices may share the same gate electrode material, as well as a common mask layer (80 in FIG. 7).

All castellated-gate devices and core logic devices of the combined device 60 all share common contact structures 112 and wiring 114 (as defined by mask layers 90 and 74, respectively, in FIG. 7). In addition, the core logic devices and castellated-gate devices may share regions of same conductivity type, such as a common N-Well 104. The N-Channel and P-Channel castellated-gate devices of this first embodiment share a common silicide blocking film 130, which is typically a deposited and patterned oxide such as TEOS or BPTEOS.

Referring now to FIG. 8, a second embodiment of the of the present invention is illustrated with its photo masking layers using a bulk silicon starting wafer. FIG. 8 illustrates a combined device 61 which incorporates planar CMOS logic consisting of an N-Channel device 64, a P-Channel device 66, as well as two N-Channel castellated-gate MOSFETs 62 having a first threshold voltage (Vt) value and two N-Channel castellated-gate MOSFETs 69 having a second threshold voltage (Vt) value. Each castellated MOSFET of FIG. 8 is shown in a first orientation, as well as a second orientation that is rotated 90 deg from the first. FIG. 8A shows the combined device 61 in a cross-sectional view taken substantially along the line 8A-8A' of FIG. 8.

In FIG. 8A, N-Channel castellated-gate devices A1 and A2 having a first threshold voltage value reside within a predefined region A of p-type conductivity in a substrate 100, separated by trench isolation structures 110. Similar to the first embodiment of the present invention shown in FIG. 7A, the castellated-gate MOSFETs of the second embodiment may have a super self-aligned structure as shown in FIG. 8A, wherein the NCH devices of first threshold value each consist of a plurality of thin vertical silicon channels 136 that span the distance between a source 140 and a drain 142. The silicon channels of the N-channel castellated gate devices of first threshold voltage are gated by a plurality of vertical electrodes 134 that are separated from the channels by a dielectric material 120, separated from the source and drain by a spacer (not shown), and connected together at their top surfaces by a conducting strap 132.

Also similar to the first embodiment, the source 140 and drain 142 structures of the N-Channel castellated-gate MOSFETs of first threshold voltage shown in FIG. 8A have the same two-part structure consisting of heavily doped n-type upper source and drain regions, 145 and 146 respectively, and heavily doped p-type lower source and drain regions, 144 and 147 respectively.

Within the combined device 61, the N-Channel castellated-gate devices of second threshold voltage value, D1 and D2, reside within a predefined region D (as defined by masking layer 85 in FIG. 8) which also has p-type conductivity 105, but at a lower dopant concentration level than p-type castellated device region A. The N-Channel devices of second threshold voltage value also consist of a plurality of thin vertical silicon channels 186 that span the distance between a source 140 and a drain 142. The silicon channels of the N-Channel castellated gate devices of second threshold voltage value are gated by a plurality of vertical electrodes 184 that are separated from the channels by a dielectric material 121, separated from the source and drain by a spacer 169, and connected together at their top surfaces by a conducting strap 182. In this second embodiment, the source and drain of the N-Channel castellated-gate MOSFETs of second threshold have two part source and drain structures which are identical to those of the N-Channel devices of first threshold value, and have been defined by a common mask shape (88 in FIG. 8).

The silicon channels 136, 186, respectively of the first and second threshold voltage N-Channel castellated-gate devices may be formed by a common processing step, or formed by separate operations. In addition, castellated-gate electrode structures 132,134 and 182, 184 may be of the same material formed in a common operation, or may be different materials fabricated in completely separate steps. Furthermore, as discussed above, the common polarity of the N-Channel castellated-gate devices of different threshold voltage allow them to share identical source and drain structures that may be formed in a common manufacturing step, however better device performance optimization may be obtained by forming them differently in separate steps.

As was the case of the first embodiment, the combined device 61 of the second embodiment of the present invention incorporates typical CMOS core devices B in the common substrate 100, consisting of a planer N-Channel MOSFET BN and a planer P-Channel MOSFET BP, separated from each other, and from the castellated-gate devices by trench isolation 110.

Figure 9:
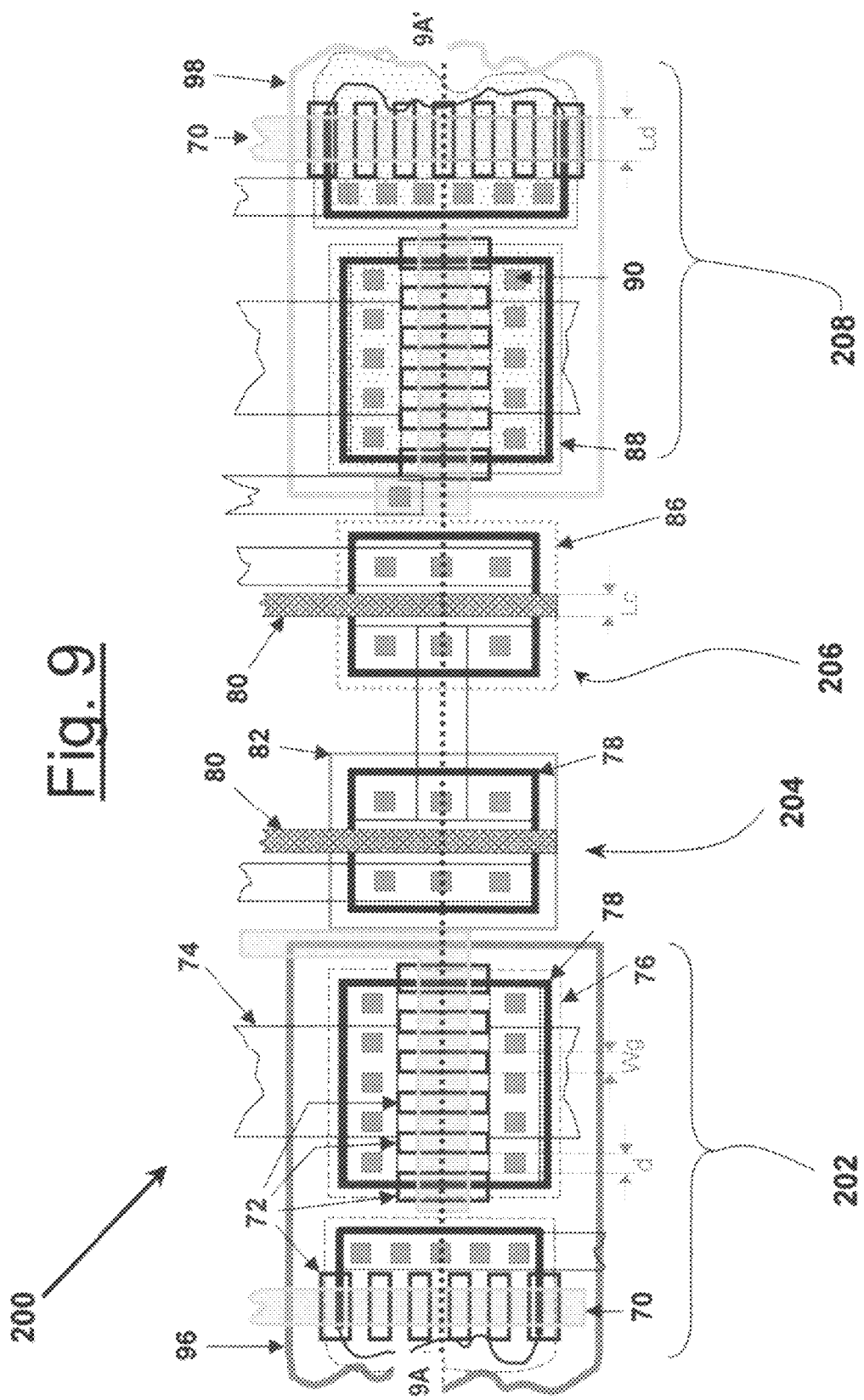
FIG. 9 is a top view of the photolithography masking elements of a third embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment.
Figure 9A:
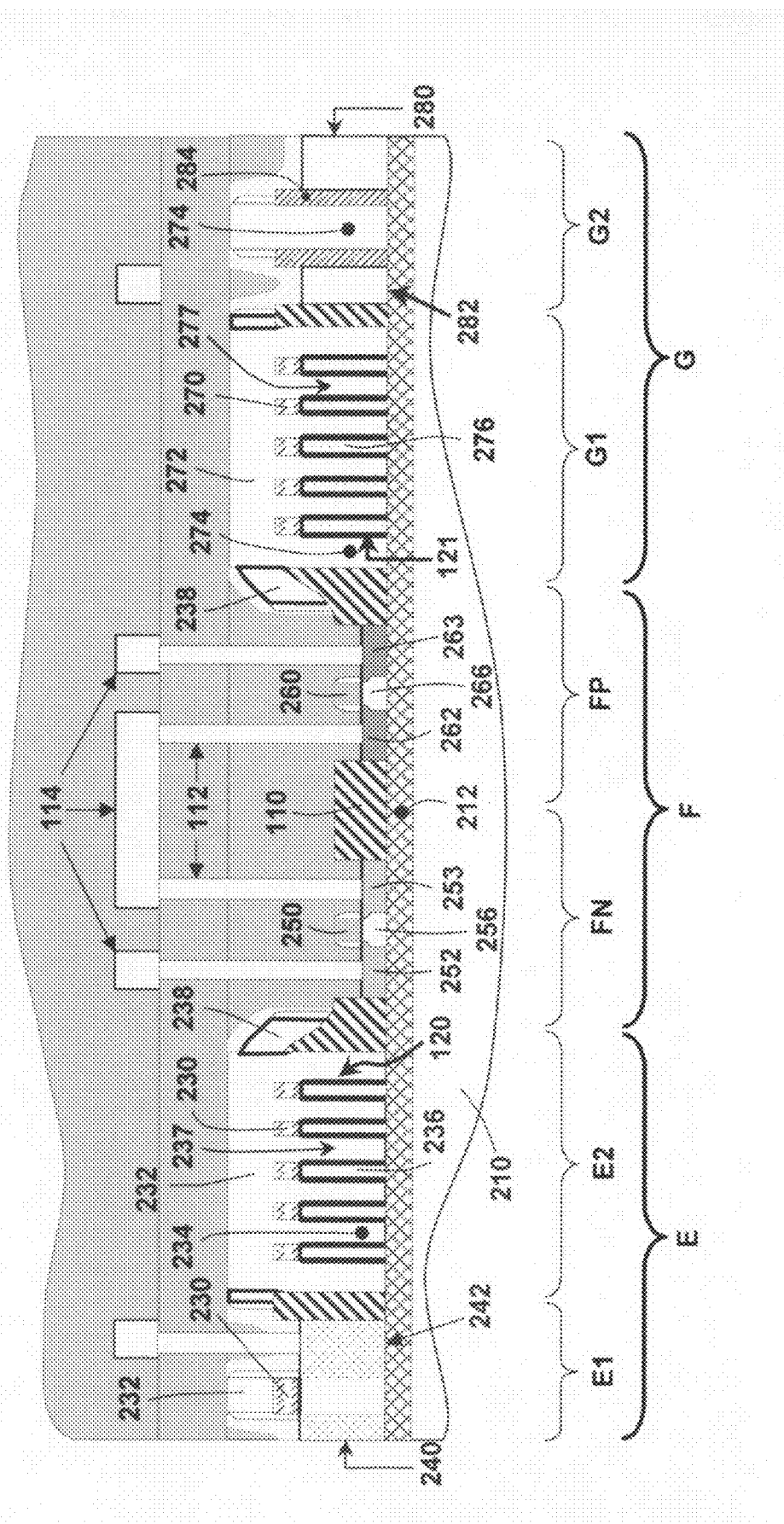
FIG. 9A is a cross-sectional view taken substantially along line 9A-9A' of FIG. 9.

A third embodiment of the present invention is shown in FIG. 9 in the case of a Silicon-On-Insulator (SOI) starting substrate. FIG. 9 illustrates a combined SOI device 200 which incorporates planar CMOS logic consisting of an N-Channel device 204, a P-Channel device 206, as well as two N-Channel castellated-gate MOSFETs 202 and two P-Channel castellated-gate MOSFETs 208. Each castellated MOSFET of FIG. 9 is shown in a first orientation, as well as a second orientation that is rotated 90 deg from the first. FIG. 9A shows the combined device 200 in a cross-sectional view taken substantially along the line 9A-9A' of FIG. 9.

As shown in FIG. 9A, the active silicon regions of the SOI substrate 210 have been fabricated to have a terraced structure (as defined by masks 96 and 98 in FIG. 9), wherein the N-Channel castellated-gate devices E1 and E2 reside within a predefined region E of a first active silicon thickness having p-type conductivity, and are separated from each other, and other device regions by trench isolation structures 110. In this third embodiment, the N-Channel castellated-gate devices consist of a plurality of thin vertical silicon channels 236 that span the distance between a source 240 and a drain 242. The silicon channels of the N-channel castellated gate devices are gated by a plurality of vertical electrodes 234 that are separated from the channels by a dielectric material 120, separated from the source and drain by a spacer (not shown), and connected together at their top surfaces by a conducting strap 232. In this third embodiment, the silicon channels are dual gated, with the third (or top gate) decoupled from the electrode/strap 232 by relatively thick caps of insulating material 230, preferably silicon nitride ($Si_3N_4$). The N-Channel castellated-gate devices have heavily doped source 240 and drain 242 regions of n-type conductivity that extend in depth all the way to the buried insulator layer 212.

Similarly, the combined SOI device 200 incorporates P-Channel castellated-gate devices G1 and G2 reside within a predefined region G, also of a first active silicon thickness while having n-type conductivity, and are separated from each other, and other device regions by trench isolation structures 110. The P-Channel castellated-gate devices also consist of a plurality of thin vertical silicon channels 276 that span the distance between a source 280 and a drain 282. The silicon channels of the P-channel castellated gate devices are gated by a plurality of vertical electrodes 274 that are separated from the channels by a dielectric material 121, separated from the source and drain by a spacer (not shown), and connected together at their top surfaces by a conducting strap 272. As was the case with the N-Channel castellated-gate device of this third embodiment of the present invention, the silicon channels are dual gated, with the third (or top gate) decoupled from the electrode/strap 282 by relatively thick caps of insulating material 270, preferably silicon nitride ($Si_3N_4$). The P-Channel castellated-gate devices have heavily doped source 280 and drain 282 regions of p-type conductivity that also extend in depth all the way to the buried insulator layer 212.

The silicon channels 236, 276, respectively of the N-Channel and P-Channel castellated-gate devices may be formed by a common processing step, or formed by separate operations. In addition, castellated-gate electrode structures 232, 234 and 272, 274 may be of the same material formed in a common operation, or may be different materials fabricated in completely separate steps. Furthermore, top gate decoupling caps for the N-Channel device 230 and P-Channel device 270, respectively, may be of the same material and formed in a common manufacturing operation.

By utilizing terraced active silicon areas, combined SOI device 200 has incorporated thin-film fully-depleted CMOS logic devices (FDCMOS) F which are commonly known by those skilled in the art. The FDCMOS devices consist of a planar SOI N-Channel MOSFET FN and a planar SOI P-Channel MOSFET FP, separated from each other and from the castellated-gate MOSFET devices by trench isolation 110. The NCH FDCMOS logic device is formed in a predetermined area with second active silicon thickness, and has a body region 256 of a first conductivity type (typically p-type). The N-Channel device has a highly doped n-type source region 252 and a drain region 253 which are spaced apart by a predetermined interval as defined by the gate electrode 250. Likewise, the PCH FDCMOS logic device is formed in another predetermined area with second active silicon thickness, and has a body region 266 of a second conductivity type (typically n-type). The P-Channel device has a highly doped p-type source region 158 and a drain region 159 which are spaced apart by a predetermined interval as defined by the gate electrode 260. As is common practice in typical SOI FDCMOS core process technologies, the N-Channel and P-Channel devices may share the same gate electrode material, although the gates of the two devices are usually doped to have different conductivity types.

Finally, it should be noted that the layout masks for the combined SOI device 200 shown in FIGS. 8 and 8A are substantially the same as the bulk version 60 illustrated in FIGS. 7 and 7A. This feature enables design transportability between starting wafer types, thereby enabling the matching of product applications and markets to substrate cost.

Method 1

Referring now to FIG. 10, and once again to FIG. 3, a generic process flow 300 is illustrated for fabricating a device constructed in accordance with the present invention, with a core component of the method being block 304. The process 300 demonstrates the ability to integrate a high performance castellated-gate I/O device as the first fabricated component of a combined device in a sequential fabrication process. The combined process 300 begins with block 302 wherein a starting silicon substrate is provided and optionally processed using standard foundry compatible microelectronic fabrication techniques to tailor impurity levels and/or create regions of separate conductivity type. After the starting substrate has been appropriately tailored, castellated-gate MOSFET devices are fabricated as described in block 304. Advancing to fabrication block 306, the core logic and/or memory devices of the combined device are deposed/fabricated or otherwise applied to the substrate. Isolation structures (such as Shallow Trench Isolation, STI) may be incorporated into the wafer during process block 304, block 306, or both (i.e. two or more sets of isolation structures). Proceeding to block 308, the combined device is post-processed through standard "back-end" microelectronic fabrication steps to add wiring and contact structures which may also include the application of silicide and silicide blocking steps. The starting substrate 32 stated in block 302 of FIG. 10 for the general case of the present invention (see also FIG. 3) may include, but is not limited to, bulk, epitaxial, or bonded silicon wafers, preferably with an active layer of 100-crystalline orientation. Wafers that include buried insulators (SOI) as well as those that incorporate strained silicon layers or Silicon-Germanium heterostructures may also be used.

At this point, a first possible embodiment of the disclosed device and its fabrication method (Method 1) based on the process 300 is described in detail for the case where both N-Channel and P-Channel castellated-gate MOSFETs of a structure and method described by the previously noted related patent application are integrated with commonly known CMOS core logic devices. Referring now to FIG. 11, the process 400 provides a more-detailed sequence of fabrication steps with which to produce the first embodiment of the disclosed device based on generic process flow 300. It should be understood, however, that the processing steps disclosed herein are adaptable to any device covered by the claims of the present invention.

Referring to the process 400 in FIG. 11, a silicon substrate wafer is provided at block 402 which has completed any of a number of possible standard foundry-compatible CMOS processing steps prior to the formation of insulator isolation structures (e.g. Shallow Trench Isolation). Blocks 404, 406, 408, 410, and 412 provide the processing sequence for forming the castellated-gate MOSFETs of this first embodiment (block 304 of FIG. 10) in accordance with the first method (Method 1) of the related patent application. Blocks 414 and 416 provide the processing sequence for forming a number of commonly known CMOS logic devices (block 306 of FIG. 10), and finally, block 418 provides standard "back-end" microelectronic fabrication steps that provide wiring and contacts (block 308 of FIG. 10).

Figure 12:
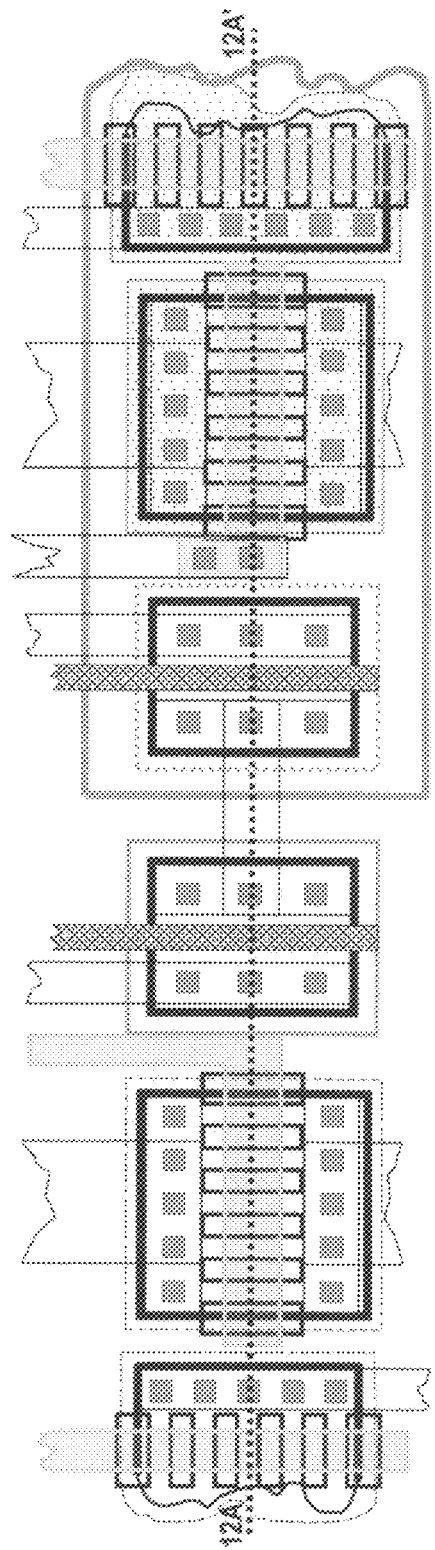
FIG. 12 is a top view of the photolithography masking elements for making a first embodiment of the present invention, which was also illustrated in FIG. 7. The figure illustrates N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment.
Figure 12A:
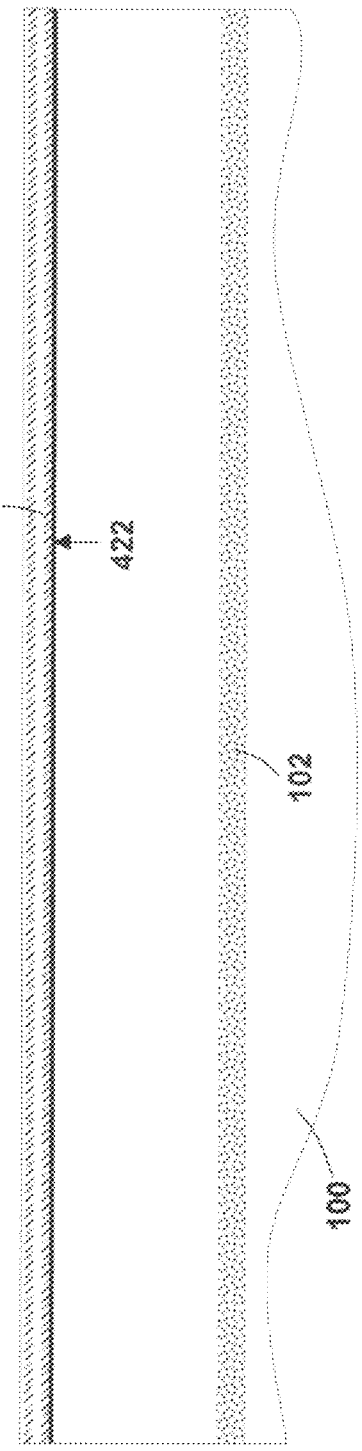
FIG. 12A is a cross-sectional view taken substantially along line 12A-12A' of FIG. 12 illustrating an initial maskless/non-photo processing step wherein a pad nitride layer is deposed on a starting wafer.

FIG. 12 illustrates a top-down view of the photo masking layers (see also FIG. 7) to be applied to a low-resistivity bulk starting wafer with a top surface of 100-crystalline orientation in order to create this first embodiment of the combined device of the disclosed invention. FIG. 12A illustrates a cross-sectional view taken along line 12A-12A' of FIG. 12 after the completion of a maskless step that might occur in block 402 of FIG. 11 to implant a global p+ buried layer 102 into starting wafer 100 which includes a cap nitride layer 420 and support oxide 422.

Next, as shown in FIGS. 13-13A, the active layer masks 78 for castellated-gate MOSFETs and core logic planar MOSFETs are simultaneously applied, and shallow trench isolation (STI) oxide islands 110 are formed, preferably using well-known reverse-tone active mask techniques in order to allow for more-varied densities and sizes of active silicon oxide islands. To reiterate, although common isolation structures (STI) have been simultaneously formed in this subsequent process step of the first embodiment, separate sets of isolation structures could have been formed for castellated-gate MOSFETs and planer digital logic MOSFETs, as indicated by FIG. 10. FIGS. 13-13A illustrate STI formation just prior to the step where the pad nitride 420 is usually stripped in prior art processes using hot phosphoric acid, thereby completing the fabrication of device isolation. In accordance with the first method of the referenced patent, FIG. 14-14A illustrates the application of the gate slot mask 72 to form openings 424 in photoresist 426, where the pad nitride 420 to form the active regions is still in place.

Figure 19:
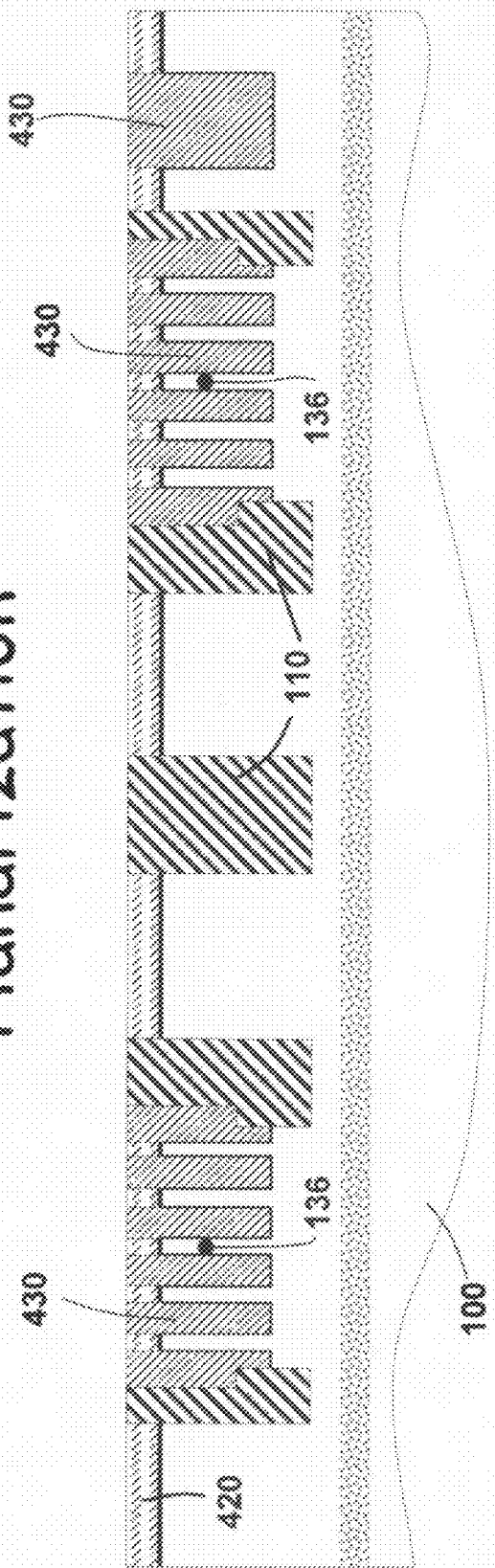
FIG. 19 is a sectional view of another subsequent process step illustrating the deposition of an oxide to fill the patterned gate-slots in the same embodiment of the present invention.

As described in detail in the referenced patent, FIGS. 15-18 illustrate a multi-step etch procedure to form channel pillars 136 which result from the creation of etched slots 137 in the silicon substrate. As illustrated in this first method of the present embodiment, the silicon trenches are formed using a wet etch technique (see FIG. 18), although reactive ion etch (RIE) or other methods may be used to form the same structure. After the completion of trench formation, the resulting gate-slots 137 are filled with an insulator 430 and planarized using the original active pad nitride layer 420 as a CMP etch stop (see FIG. 19).

Figure 20:
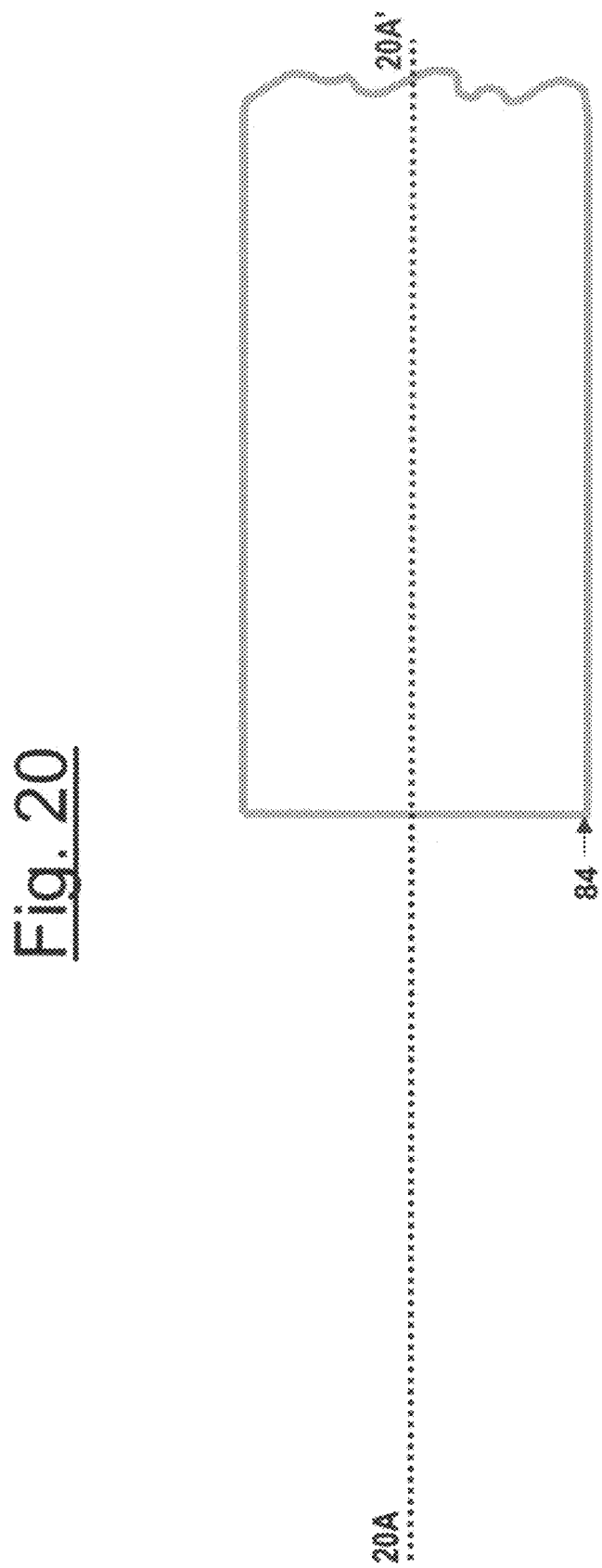
FIG. 20 is a top view of a subsequent process step for applying darkfield polarity N-Well masks to form a common N-Well region for both planer and Fully-Depleted Castellated Gate P-Channel MOSFETs in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment.
Figure 20B:
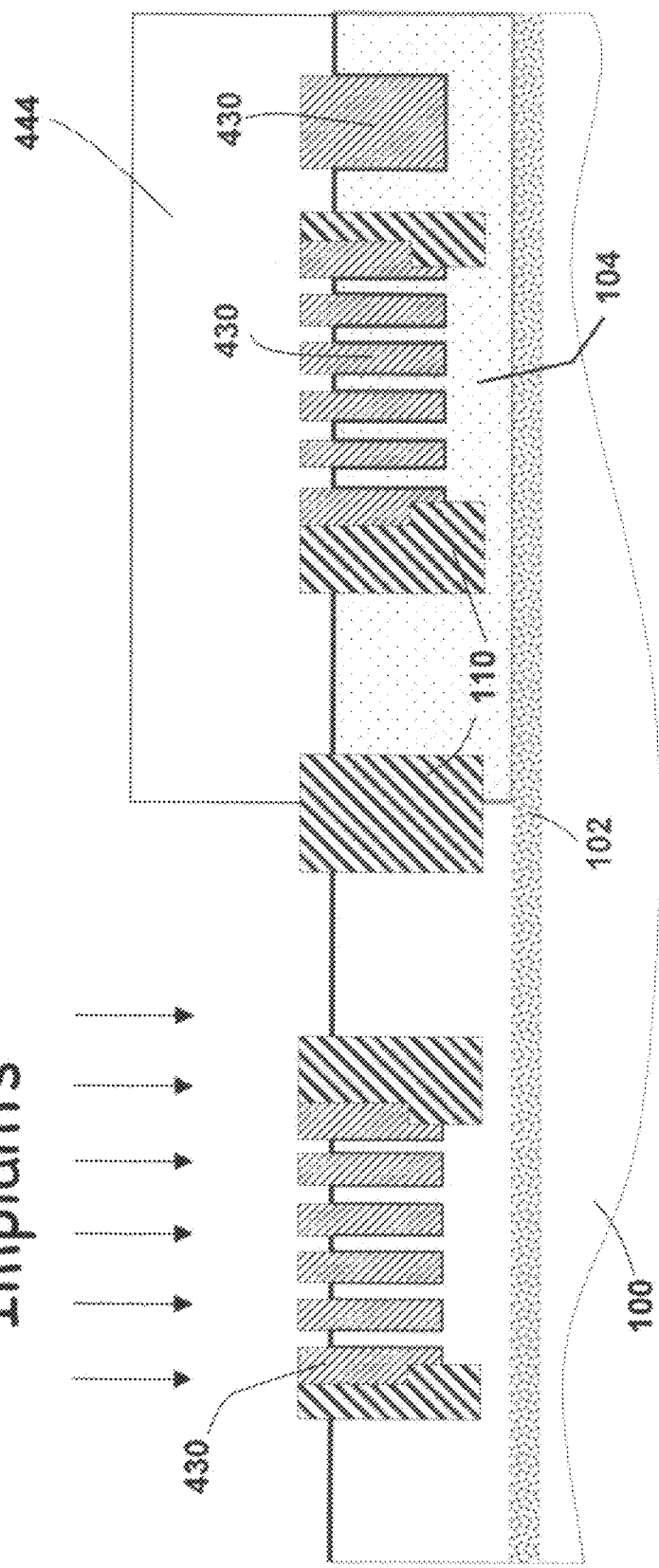
FIG. 20B is a cross-sectional view taken substantially along line 20A-20A of FIG. 20 in which the N-Well mask data is applied in a clear-field polarity so as to form a common P-Well region for both planer and Fully-Depleted Castellated Gate N-Channel MOSFETs in the same embodiment of the present invention.

FIGS. 20, 20A, and 20B illustrate the formation of regions of different conductivity type in order to form both N-Channel and P-Channel castellated-gate MOSFETs. In FIG. 20A, the N-Well mask shape 84 is applied in a "dark field" manner (for positive resist) in order to produce openings in photoresist 442 through which donor impurities such as Phosphorous or Arsenic are implanted to form a region of n-type conductivity 104 within which P-Channel MOSFETs can be formed. In the next step shown in FIG. 20B, the same N-Well mask shape is applied in a "clear field" manner in order to produce openings through which acceptor impurities (such as Boron) are implanted, thereby forming and/or tailoring a region of p-type conductivity within which N-Channel MOSFETs can be formed.

In this first embodiment of the combined device of the disclosed invention, the CMOS logic devices share regions of common conductivity type with their castellated-gate counterparts of like polarity (i.e. N-Channel or P-Channel). While the first embodiment employs the use of two reticles derived from a common mask shape (physical design data) to form the N-Well and P-Well regions, other approaches could be taken with similar effect. For example, the N-Well and P-Well regions could be defined by separate mask data, or the P-Well could be formed as part of a global implant scheme, later to be counter-doped by a single N-Well masking operation. These and other methods are known to those skilled in the art.

Figure 21A:
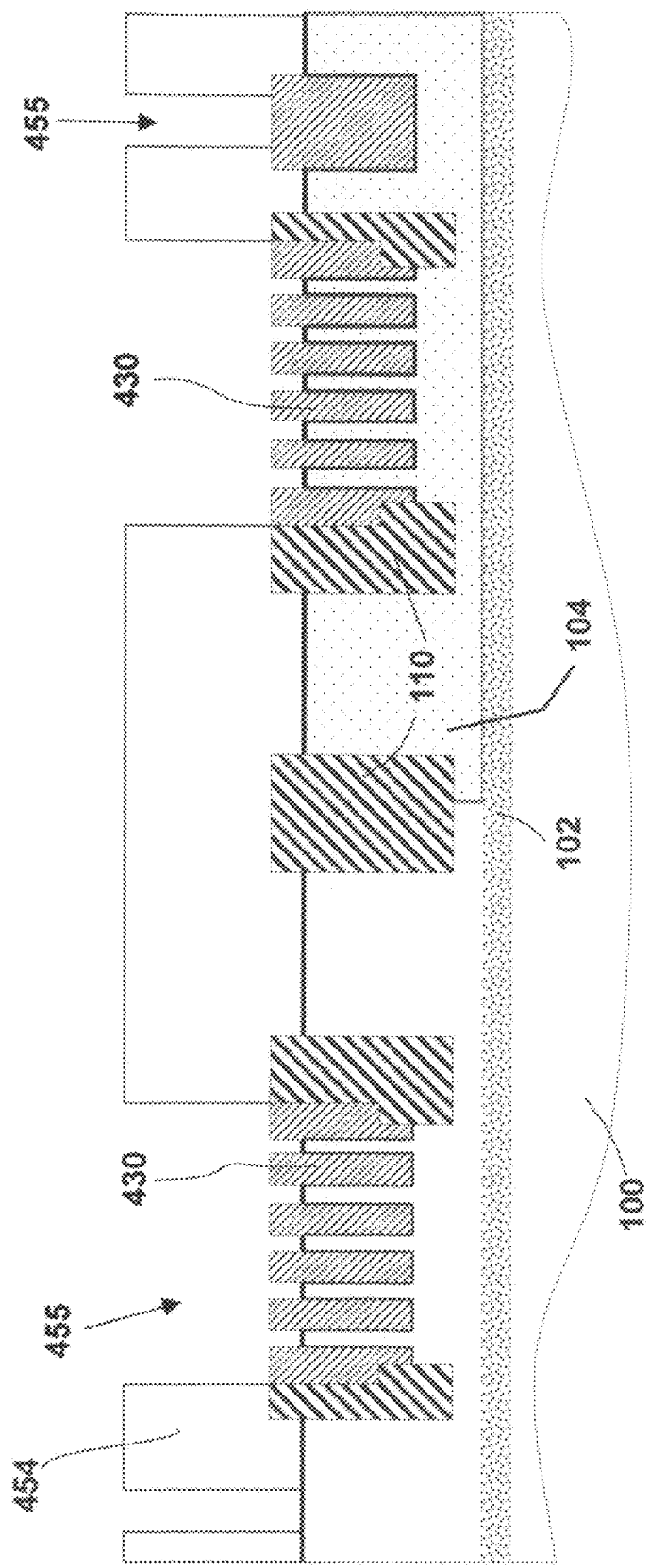
FIG. 21A is a cross-sectional view taken substantially along line 21A-21A of FIG. 21.
Figure 23:
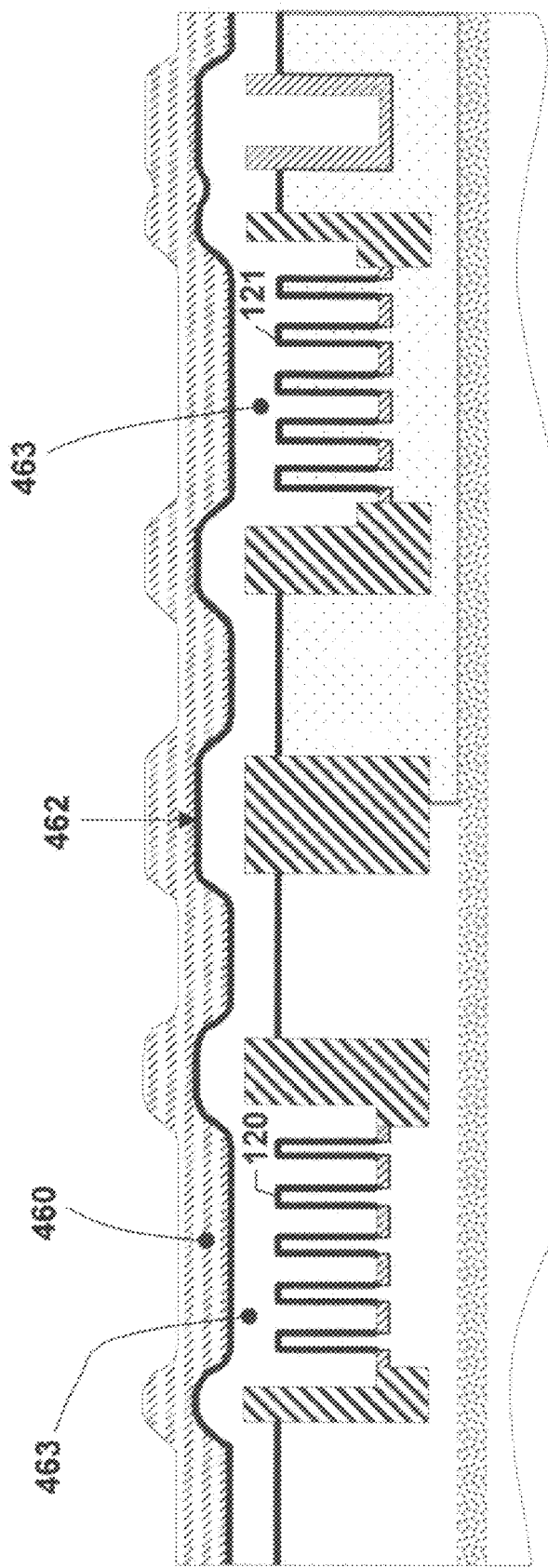
FIG. 23 is a sectional view of another subsequent process step illustrating the formation of a common gate stack for both N-Channel and P-Channel Fully-Depleted Castellated-Gate MOSFETs, including a gate conductor, an oxide and a silicon nitride cap in the same embodiment of the present invention.
Figure 24:
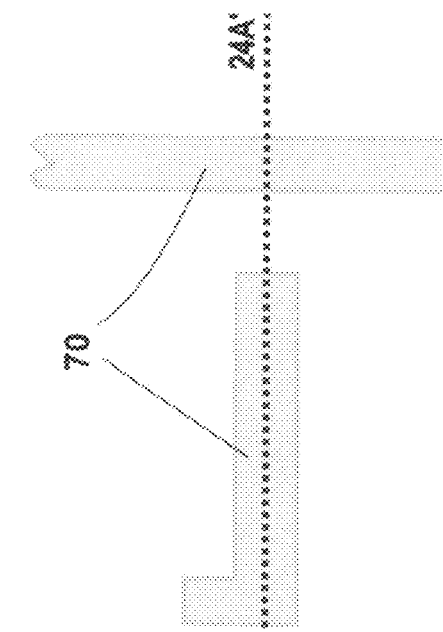
FIG. 24 is a top view of another subsequent process step for patterning and etching the gate stack using a gate mask in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment.
Figure 24A:
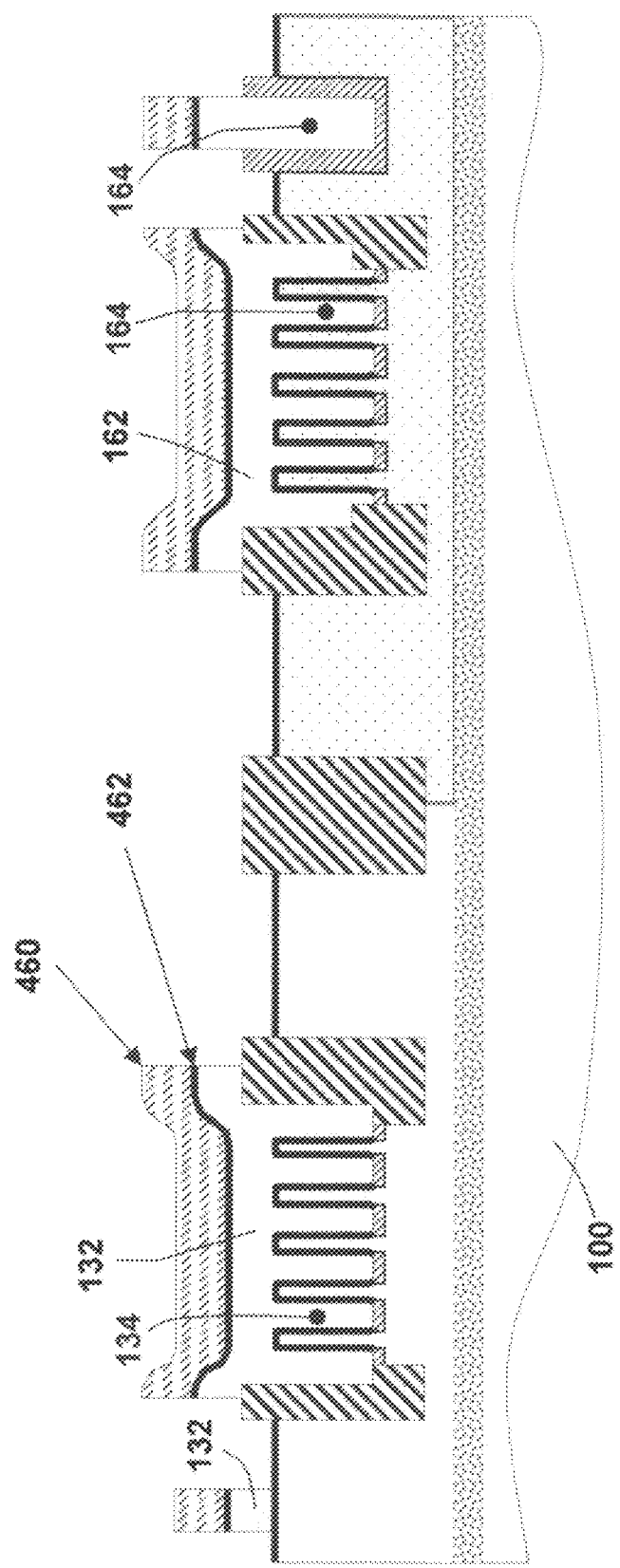
FIG. 24A is a cross-sectional view taken substantially along line 24A-24A of FIG. 24.
Figure 26:
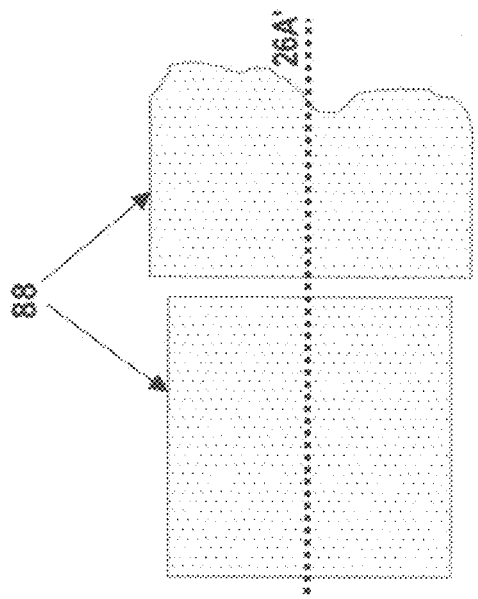
FIG. 26 is a top view of yet another subsequent process step for forming self-aligned source and drain regions for the P-Channel Fully-Depleted Castellated-Gate device through the application of source and drain masks in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment.
Figure 26A:
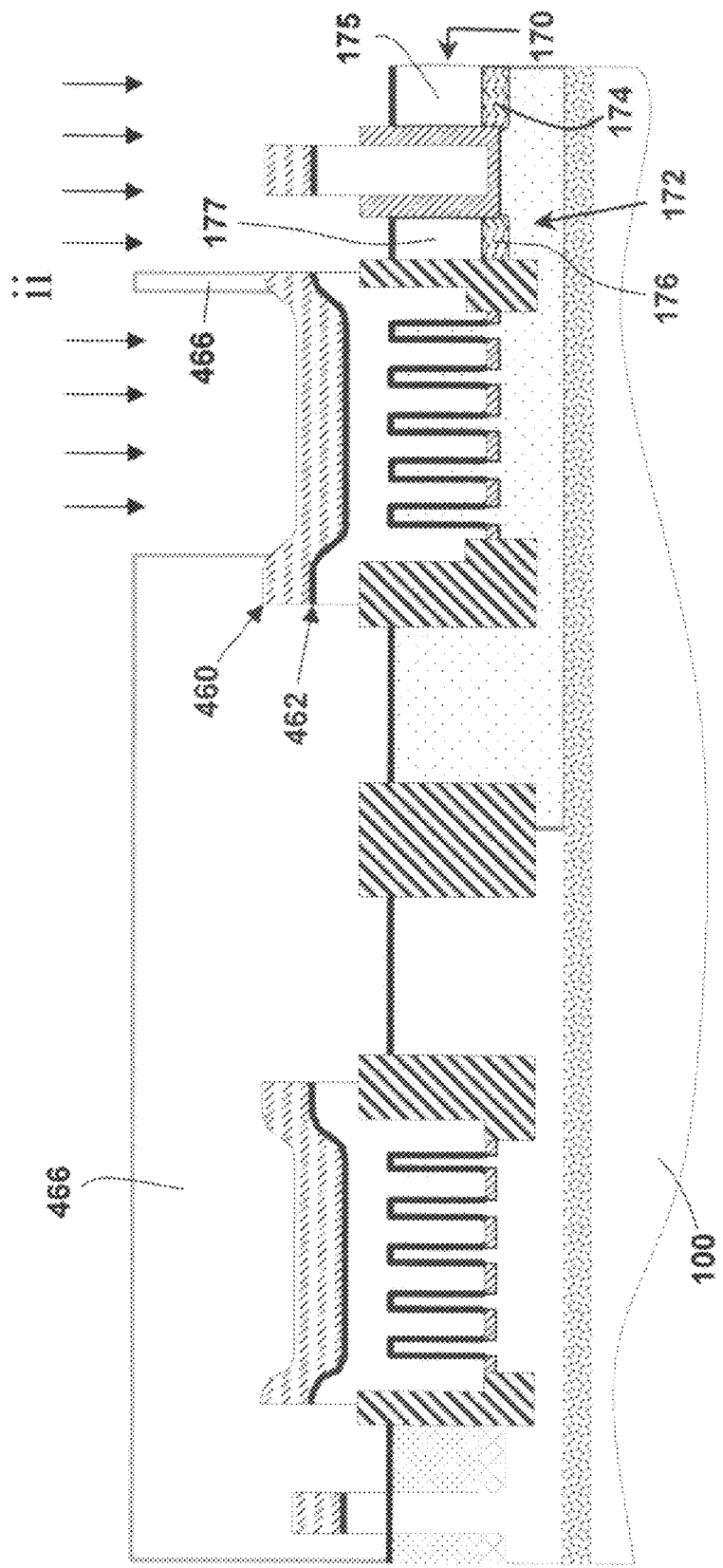
FIG. 26A is a cross-sectional view taken substantially along line 26A-26A of FIG. 26.

Referring back to FIG. 11, the next block of process steps 408 to fabricate the castellated MOSFETS in this first embodiment of the present invention (as prescribed by the referenced patent) are illustrated in cross-sectional views in FIGS. 21, 21A, and 22. As shown, gate slots 137,167 for both N-Channel and P-Channel castellated-gate MOSFETs are created simultaneously, respectively, as well as spacers. In subsequent steps illustrated in FIGS. 23, 24, and 24A, a gate structure is formed simultaneously for the N-Channel and P-Channel devices by deposing a gate insulator, followed by the deposition and patterning of a gate stack using a combined mask shape (70 in FIG. 24). In this first method embodiment, the gate stack preferably consists of polysilicon 463, oxide 462, and silicon nitride 460 (see FIG. 23). In an alternate approach, the N-Channel and P-Channel gate slots 137,167, and their respective gate structures could be formed using a sequence of separate operations, thereby enabling the use of different gate oxide thickness, and/or gate materials for the N-Channel and P-Channel devices.

In the next group of process steps 412 summarized in FIG. 11, and illustrated in FIGS. 25, 25A, 26 and 26A, ion implantations are performed to create dual-layer source and drain structures of the N-Channel and P-Channel castellated-gate MOSFETs. As discussed in the referenced patent, and shown in FIGS. 25A and 26A, a gate-capping layer 460 is left in place to insure that the source/drain implants do not penetrate into the device channel regions.

After completion of the process steps associated with the Castellated-Gate MOSFET(s) source and drain structures 412, the I/O device structure of the first embodiment of the present invention is largely complete. Subsequent processing steps 414 and 416 of Method 1 illustrated in FIG. 11 serve to incorporate typical CMOS logic and/or memory structures which are well known to those skilled in the art. Examples of these processing steps are depicted in FIGS. 27, 27A, 28, 29, 29A, 30, and 30A.

Figure 28:
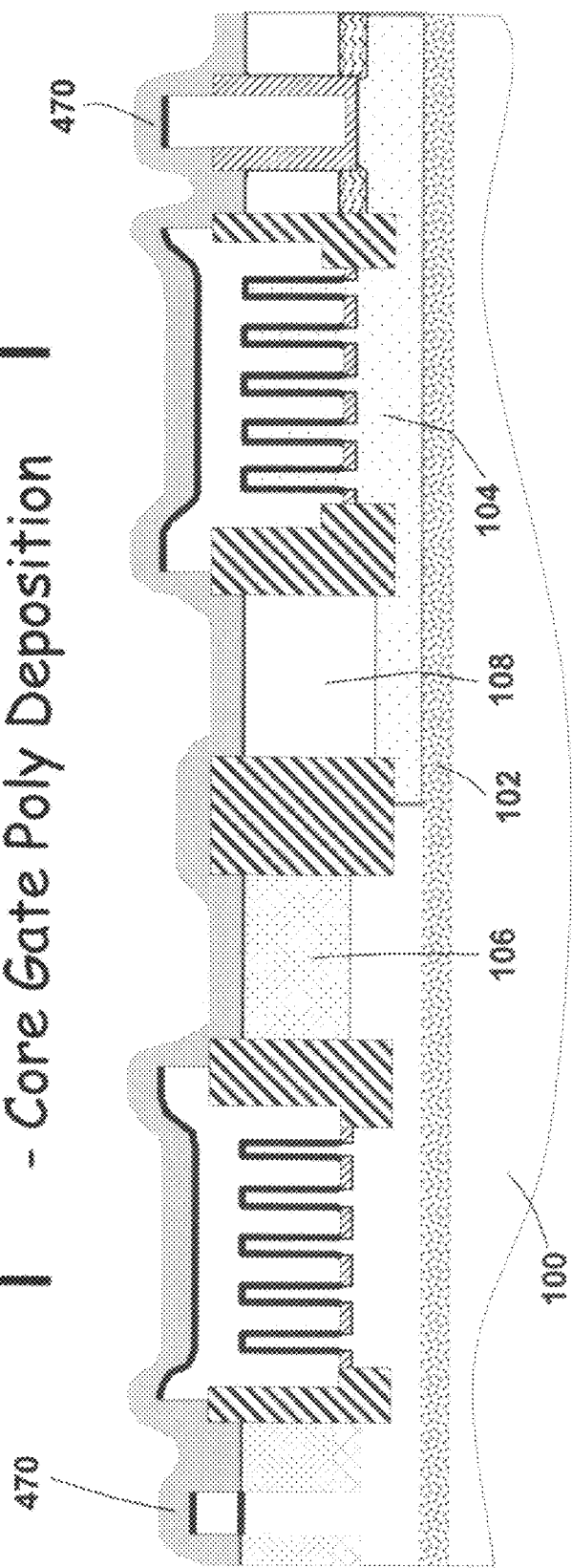
FIG. 28 is a sectional view of yet another subsequent process step for deposing a common gate film for both N-Channel and P-Channel MOS logic devices in the same embodiment of the present invention.
Figure 29A:
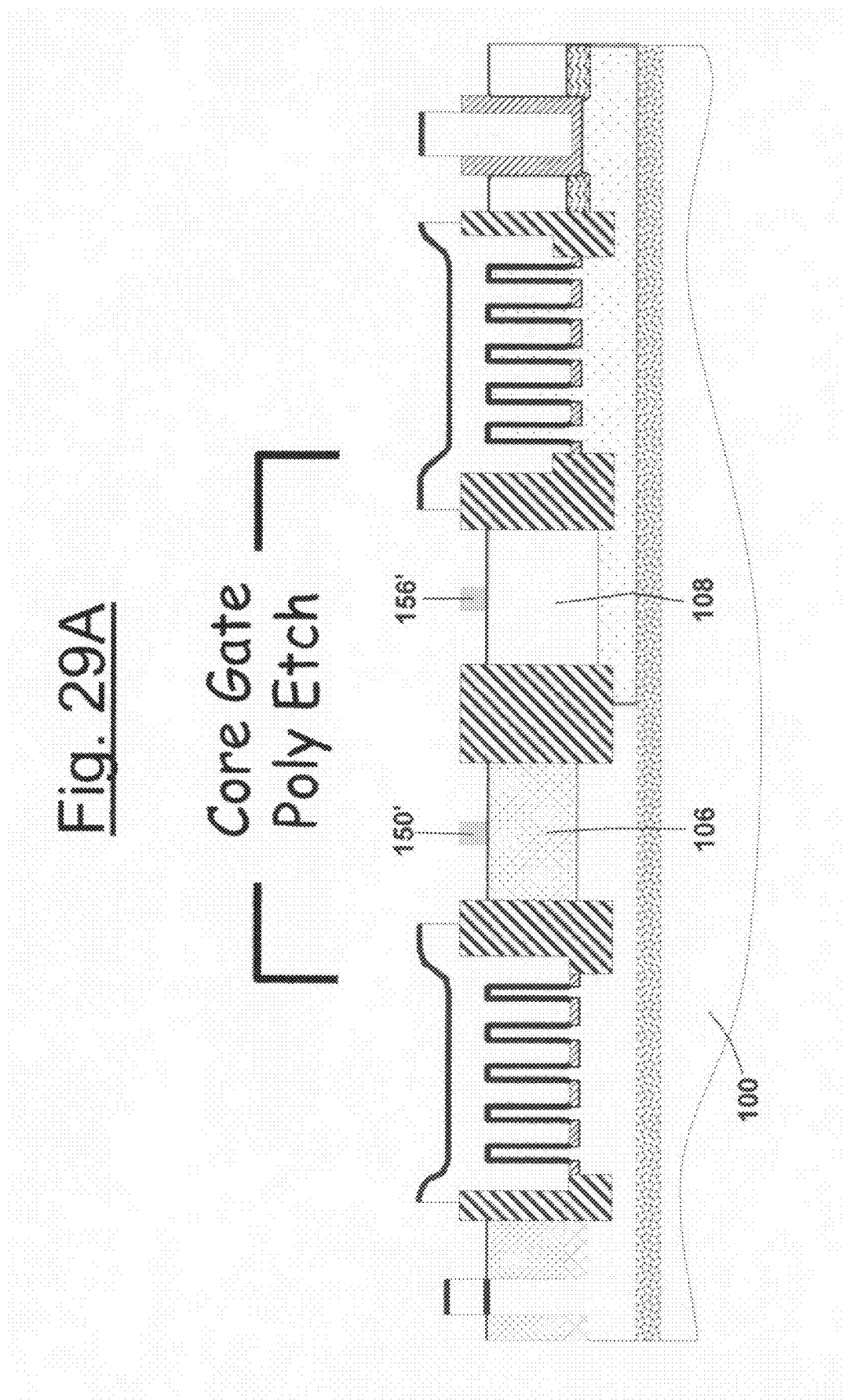
FIG. 29A is a cross-sectional view taken substantially along line 29A-29A of FIG. 29.

In FIGS. 27-27A, the planer N-Channel MOSFET source/drain mask 82 is used to tailor the doping concentration of a predetermined region 106 of the wafer for logic device formation. In FIG. 28, a gate material 470 (typically polysilicon) is globally deposed over the wafer, which includes predetermined regions 106 and 108 within which to form logic devices. In FIGS. 29-29A, the pre-annealed gate electrodes 150' and 156' of the N-Channel and P-Channel logic devices, respectively, are patterned using a common gate mask shape 80. The fabrication steps of the CMOS logic devices of this first embodiment are substantially completed following the formation of self-aligned P-Channel source and drain junctions, as depicted by FIGS. 30-30A. Other processing options not shown might include, but are not limited-to, the formation of heterostructures consisting of materials such as Silicon (Si), Germanium (Ge), Carbon (C), or other appropriate elements. High permittivity gate materials may be deposed during the formation of CMOS logic and/or memory devices, as well as the deposition of metal gate structures either directly, or using replacement/substitution methods.

Figure 31:
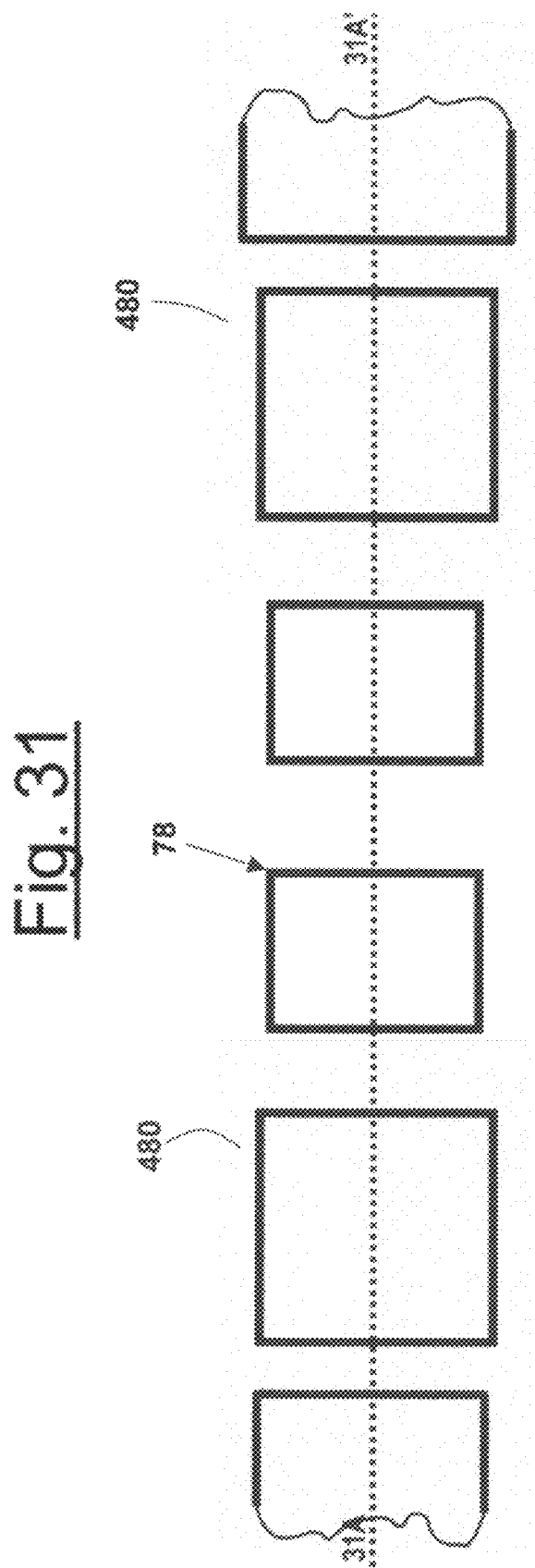
FIG. 31 is a top view of yet another subsequent process step for forming a salicide blocking layer around the N-Channel and P-Channel Fully-Depleted Castellated-Gate devices by applying a salicide block mask in the same embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment.
Figure 31A:
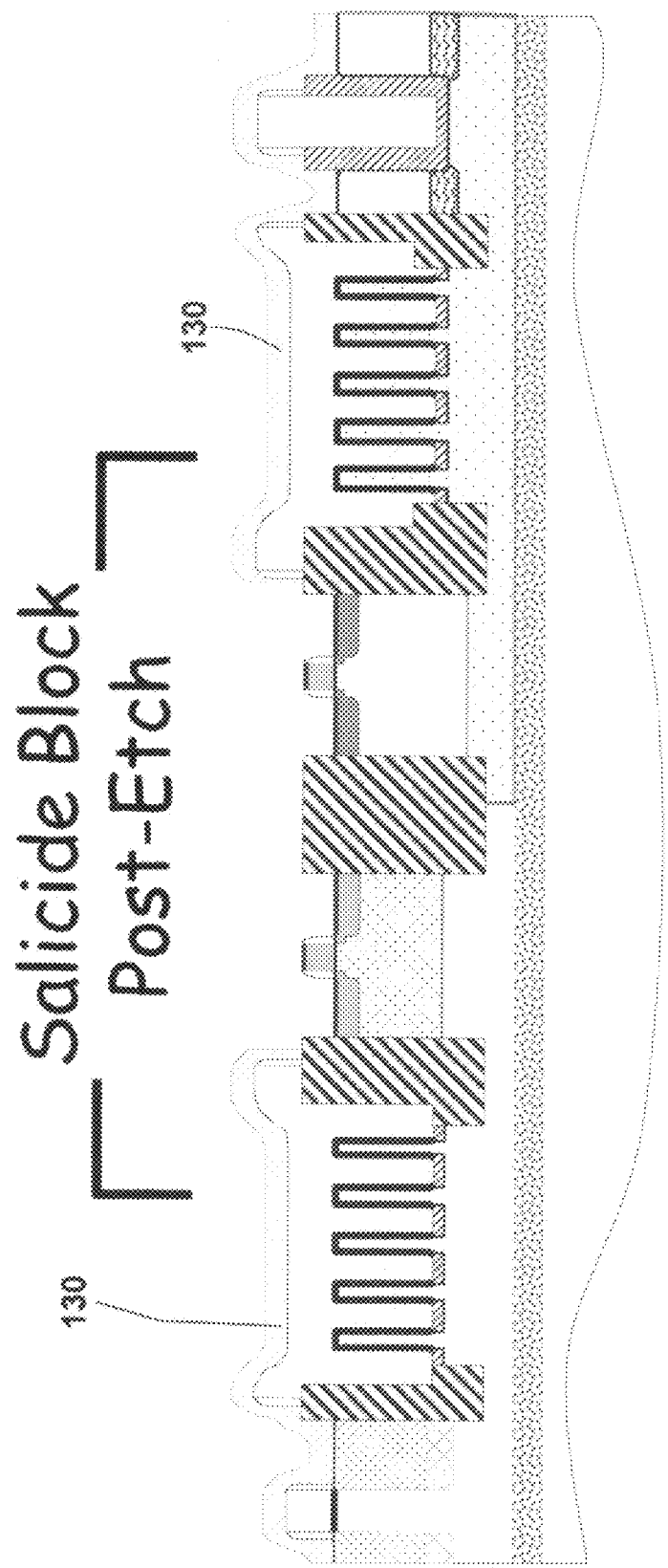
FIG. 31A is a cross-sectional view taken substantially along line 31A-31A of FIG. 31.

Further "Back-End" processing 418, summarized in FIG. 11, serves to form completed functional circuitry by providing contacts and wiring structures. Among the back-end fabrication steps may be a silicide blocking process, whereby the silicide layer, used almost universally in Standard CMOS processing, is prevented from forming. As shown in FIGS. 31 and 31A, a masking layer 480 is used to pattern a deposed thin film 130 such as oxide or nitride prior to the formation of the silicide. Since silicide will only form on exposed silicon, the patterned thin film layers serve to block its formation in areas described by the respective masking layer. Since silicided source and drain structures potentially have limited utility in the vertically-oriented Castellated-Gate device structure, the inclusion of a silicide blocking step may beneficial in the formation of the composite device of the present invention.

Method 2

A second possible method embodiment of the composite device constructed in accordance with the present invention makes use of dummy and replacement gate(s) to facilitate the formation of a fully planarized gate conductor structure(s) for the Castellated Gate MOSFET devices. An alternate embodiment of a structure and method for creating a Castellated-Gate MOSFET using replacement-gate techniques is discussed in detail in the referenced patent. Applying replacement gate-methods to create a second possible embodiment of the mixed-signal semiconductor technology of the present invention (baseline flow 300 in FIG. 10) results in a process flow 500, which is summarized in FIG. 32. As discussed with respect to the first fabrication embodiment of the present invention (Method 1), it should be understood that the processing steps disclosed herein are adaptable to any device covered by the claims of the present invention.

Referring now to FIG. 32, a silicon substrate wafer is provided at block 502 which has completed any of a number of possible standard foundry-compatible CMOS processing steps prior to the formation of insulator isolation structures (e.g. Shallow Trench Isolation). Dummy gate fabrication steps 508 depose and pattern a structure that enables the formation 510 of super self-aligned source and drain regions for the Castellated-Gate MOSFETs. Subsequent process blocks 512 and 514 result in the fabrication of CMOS logic and/or memory devices which are known to those skilled in the art. With the fabrication of the logic devices completed, a zero level insulating layer is deposited and planarized 516 using CMP techniques. Fabrication of the Castellated-Gate devices is completed by removing the dummy gate in block 518, and forming a planarized replacement gate structure in block 520. The final processing steps of block 522 complete the fabrication of this second method embodiment of the present invention by providing contact and wiring structures with which to form functional circuitry. The second method embodiment of FIG. 32 will be summarized by the brief description that follows.

Figure 33A:
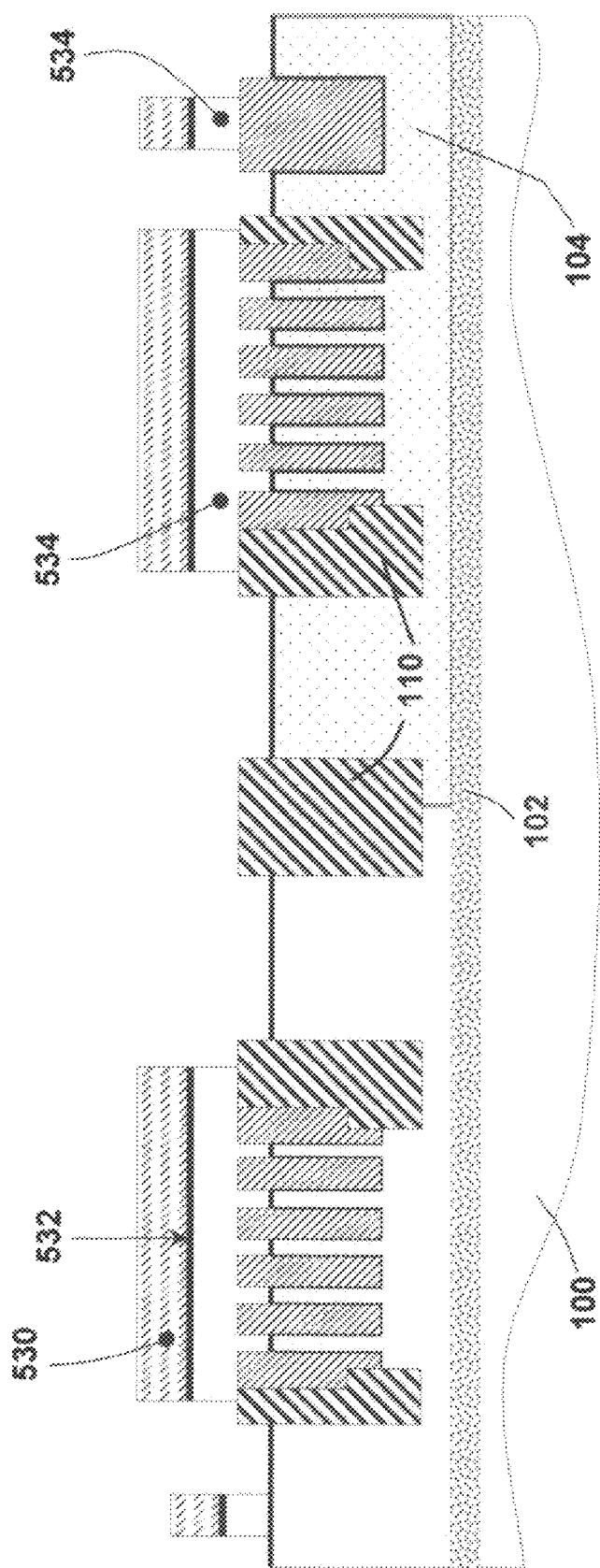
FIG. 33A is a cross-sectional view taken substantially along line 33A-33A of FIG. 33.

After forming and filling the gate slots of the Castellated-Gate MOSFETs ostensibly in the same manner as Method 1, a dummy gate stack, in this case consisting of polysilicon 534, oxide 532 and nitride 530, is deposited and patterned using the clear field Castellated-Gate mask shape 70, as shown in FIGS. 33-33A. The dummy gate enables the formation of super self-aligned source and drain structures, as illustrated in FIGS. 34-34A and FIGS. 35-35A, for the n-channel and p-channel Castellated-Gate MOSFETs, respectively. The vertical thickness of the deposited dummy gate stack must be great enough to prevent the penetration of source/drain implants into the channel regions.

Figure 36:
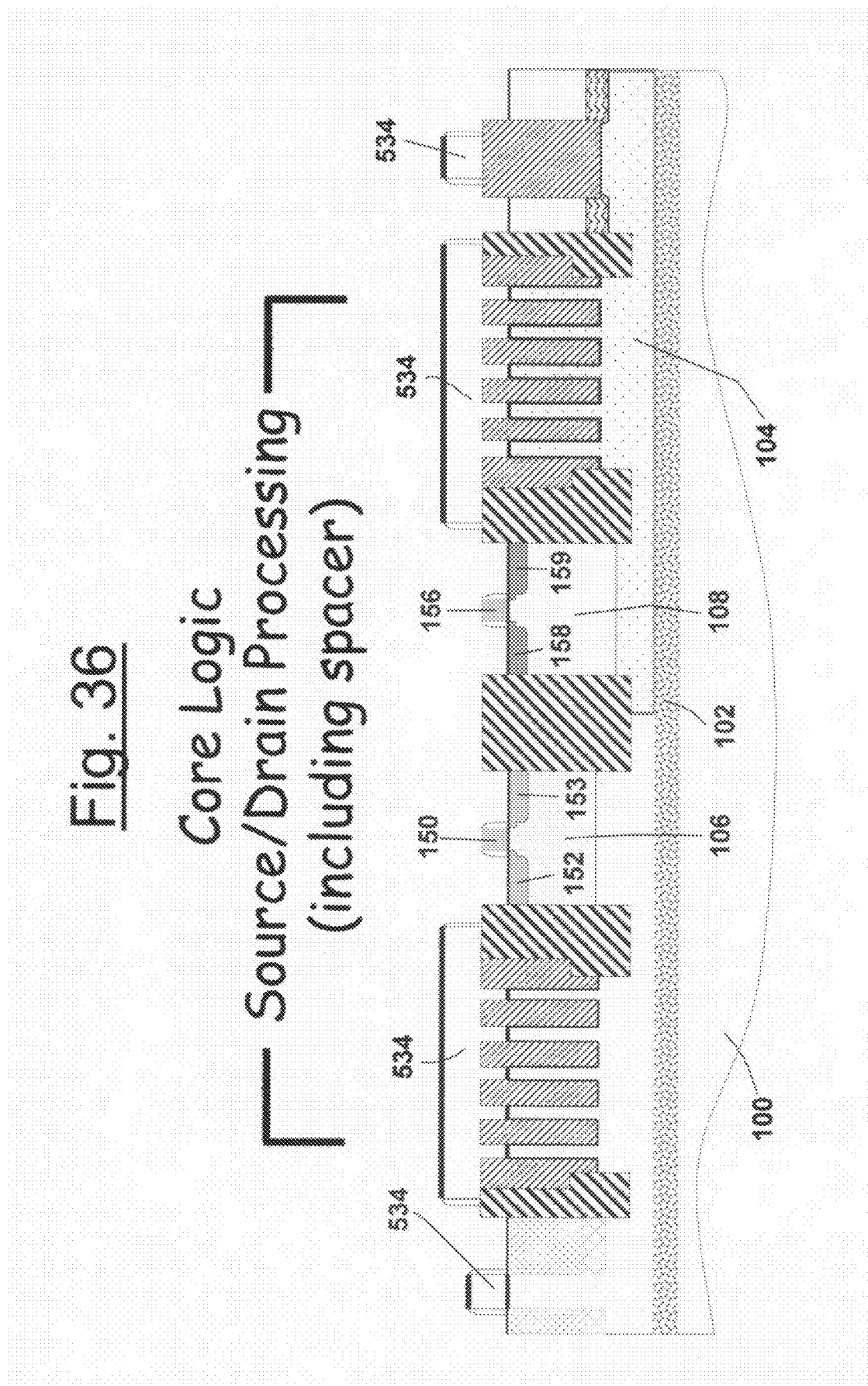
FIG. 36 is a sectional view illustrating the completion of the processing steps associated with the N-Channel and P-Channel core logic devices in forming the second embodiment of the present invention.

Referring once again to FIG. 32, with the dummy gate still in place, core logic or memory CMOS devices are formed using methods know in the art, as summarized in blocks 512 and 514 of the second basic method embodiment 500 of the present invention. The resulting intermediate structure is illustrated in FIG. 36. At this stage, it should be noted that the nitride component 530 of the gate stack has been removed, and the polysilicon structure 534 remains in place.

Figure 37:
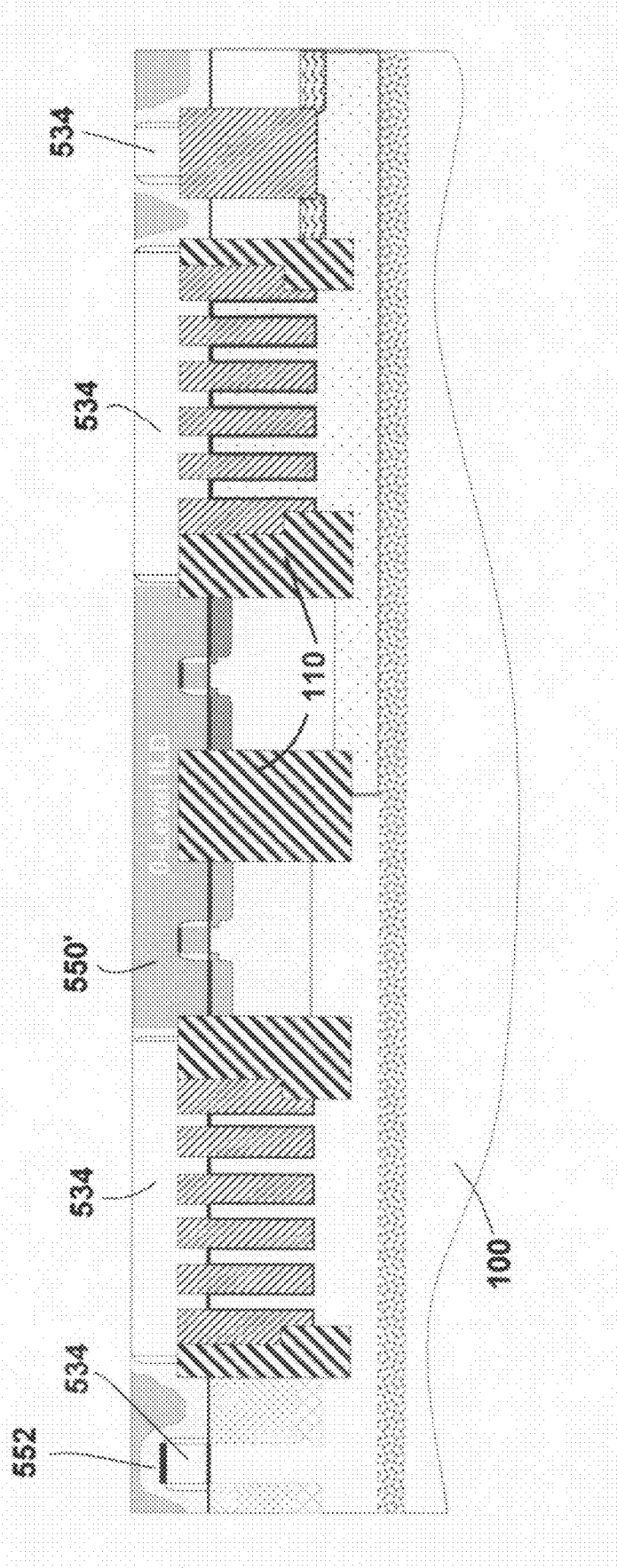
FIG. 37 is a sectional view of another subsequent process step illustrating the deposition of a dielectric oxide to form a zero level insulating layer with subsequent planarization in the second embodiment of the present invention.

Subsequent processing steps 516 (see FIG. 32) result in the formation of silicide, primarily for the CMOS logic/memory devices, and silicide blocked regions, as appropriate for circuit functionality, reliability, or other factors. Additionally, as shown in FIG. 37, a "zero-level" intertevel dielectric (ILD) 550' is formed by deposing a dielectric material (insulator), and planarizing it with chemical mechanical polishing (CMP) processes, whereby the patterned dummy gates 534 act as an etch stop, or reference.

Figure 39:
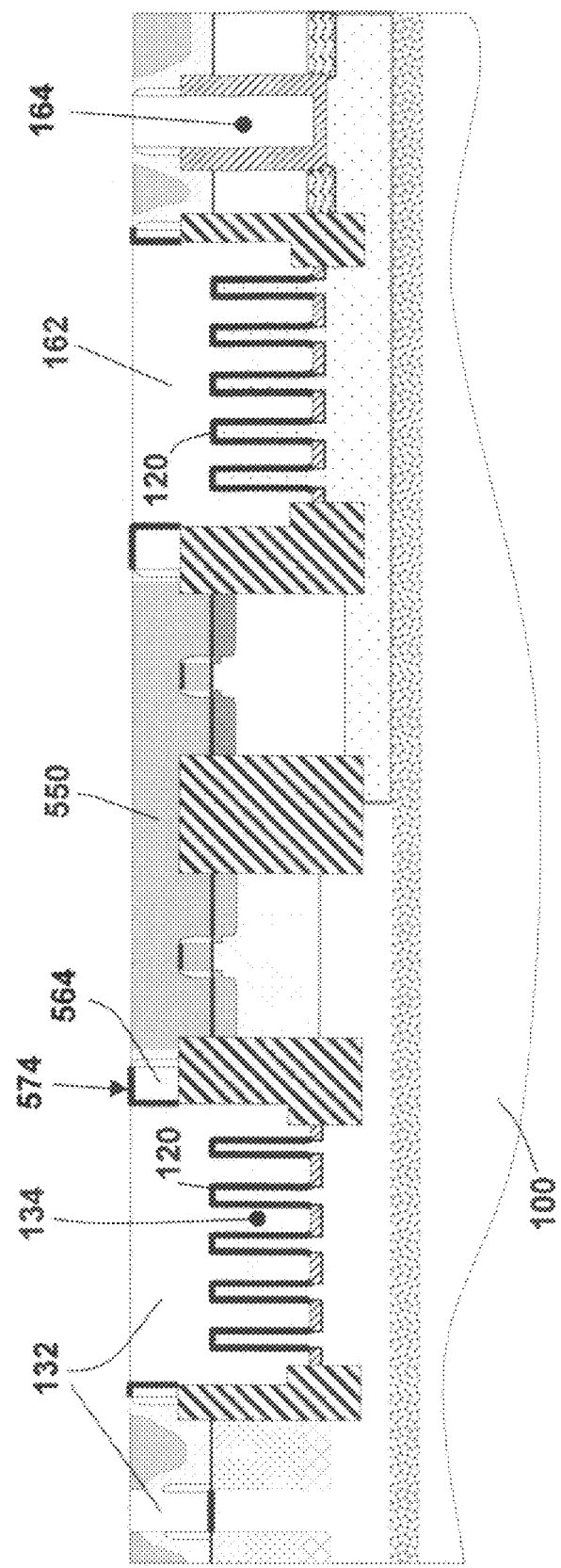
FIG. 39 is a sectional view of illustrating completion of the processing steps in forming the second embodiment of the present invention.

Further processing steps 518, 520 (see FIG. 32) illustrated in FIGS. 38-38A, and FIG. 39 result in the formation of a final gate oxide 120 and replacement gates 132,134 and 162,164, for N-Channel and P-Channel Castellated-Gate MOSFETs, respectively. As shown in FIGS. 38-38A, a derived mask layer 432 is used to create openings 562 in photoresist 560 through which the dummy gate 534 is removed and replaced with a second material which may be selected from a list that includes metals such as Tungsten (W), Tantalum (Ta), or composites such as silicides. The replacement gates are planarized with respect to the final "zero-level" ILD 550 as shown in FIG. 39. Unremoved dummy gate material 564 may be used as an etch stop, or reference film during the planarization process. Again, as in the case of the first method embodiment of the present invention (METHOD 1), two separate derived mask reticles could be employed in separate sequential operations during the formation of the N-Channel and P-Channel Castellated-Gate devices so as to allow the use of different gate oxide thicknesses, and/or gate electrode materials for the two distinct device types (that is, NCH and PCH).

Figure 40:
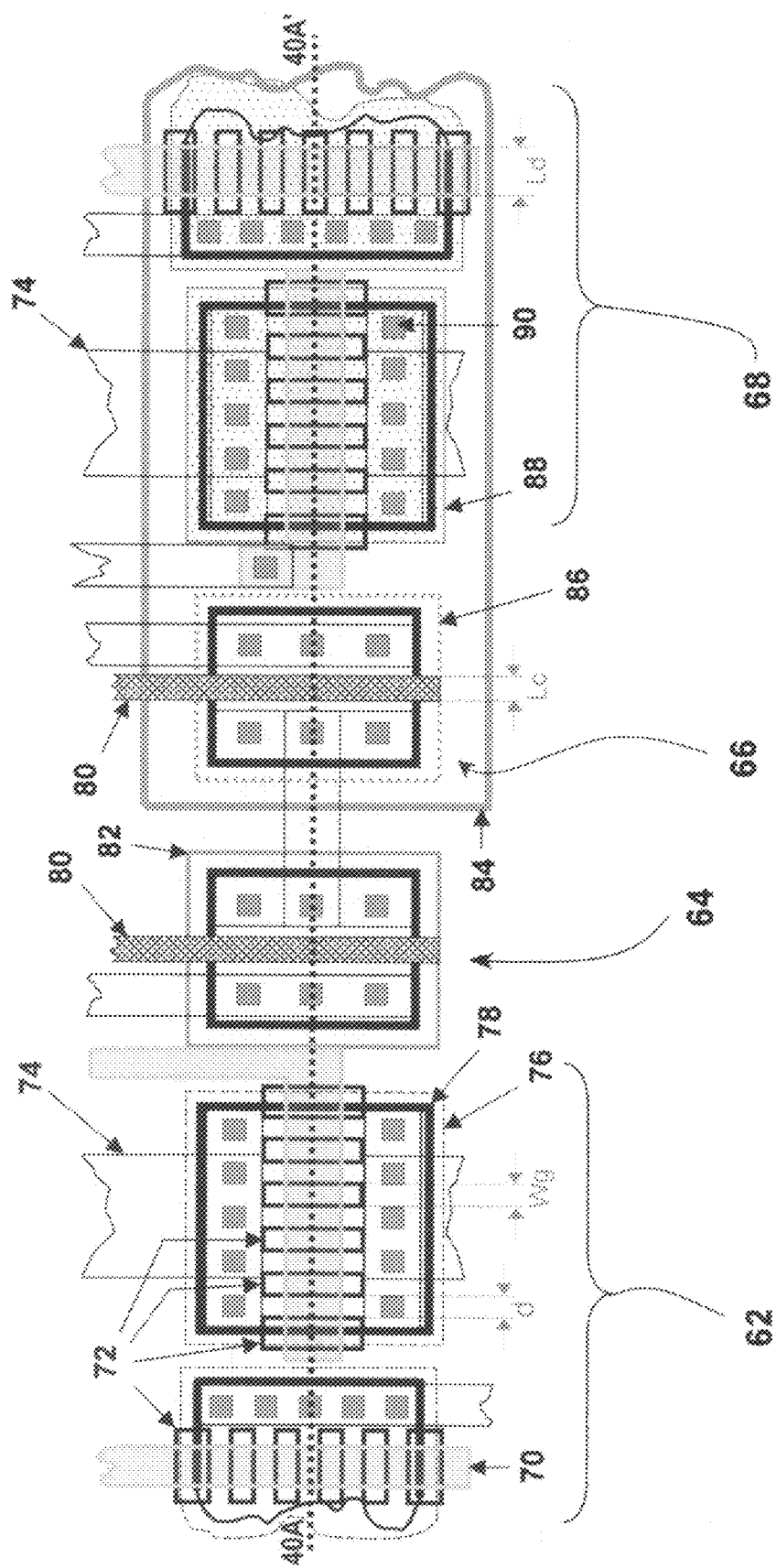
FIG. 40 is a top view of the final form resulting from the process in the second embodiment of the present invention, illustrating N-Channel and P-Channel MOS logic devices, N-Channel and P-Channel Fully-Depleted Castellated-Gate MOSFETs of a first similar orientation, and N-Channel and P-Channel Fully-Depleted Castellated-Gate MOSFETs in orientations 90° relative to the first orientations, to illustrate the complete structure of the embodiment.
Figure 40A:
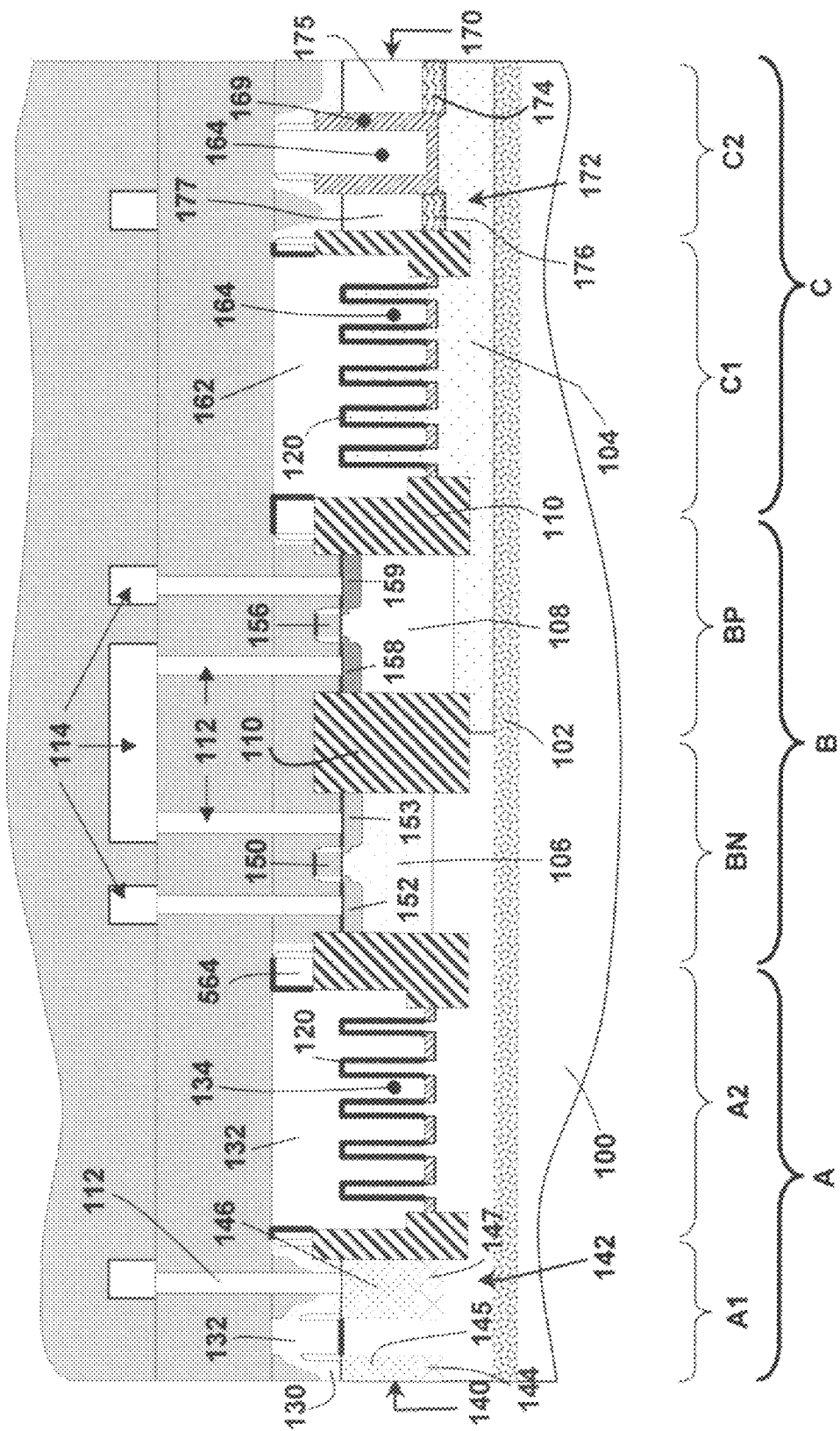
FIG. 40A is a cross-sectional view taken substantially along line 40A-40A of FIG. 40.

After having completed the planarization of the replacement gates for the Castellated-Gate MOSFETs, further "Back-End" processing 522, summarized in FIG. 32, serves to form completed functional circuitry by providing contacts and wiring structures. The final structure produced by this second method for forming the composite device of the present invention is illustrated in a cross-sectional view in FIG. 40A.

Finally, it is important to note the similarity between the physical design layout/mask layers used during the execution of the second method embodiment of the proposed invention (FIG. 40), and the first method embodiment (FIG. 7). This similarity enables design portability between the first and second method embodiments of the present invention. In addition, the design layout similarity enables the combination of the device structures of the first and second method embodiments into a potential third embodiment wherein a logic/memory technology is combined with one or more Castellated MOSFETs having a gate structure fabricated according to the first method, as well as one or more Castellated MOSFETs having a gate structure (dummy/replacement type gate) fabricated according to the second method, all on a common substrate.

The foregoing description and the illustrative embodiments of the present invention have been described in detail in varying modifications and alternate embodiments. It should be understood, however, that the foregoing description of the present invention is exemplary only, and that the scope of the present invention is to be limited to the claims as interpreted in view of the prior art. Moreover, the invention illustratively disclosed herein suitably may be practiced in the absence of any element which is not specifically disclosed herein.

I claim:

1. A method of manufacturing a composite semiconductor device which includes a MOS transistor device and a castellated-gate MOSFET device capable of fully-depleted operation comprising the steps of:
    creating a starting silicon semiconductor substrate;
    applying active layer pad nitride masks to form trench isolation islands in said substrate;
    forming a plurality of thin silicon channel elements by etching a plurality of spaced gate slots to a first predetermined depth into said substrate;
    filling said slots with a dielectric material;
    clearing out an area of said dielectric material within said gate slots to form a spacer and bottom gate;
    depositing a gate dielectric;
    filling said slot regions with a conductive gate material and connecting them together at their upper end surfaces with a top gate layer;
    implanting a source and a drain region at opposite end portions of said spaced, channel elements;
    implanting predetermined active areas in said starting silicon substrate so as to tailor the doping concentration and polarity of the semiconductor bodies formed thereby;
    forming a planer gate structure by deposing a planer insulating gate material, deposing a conductive gate material and then removing the unpatterned regions of said conductive gate material; and
    forming self-aligned source and drain regions by implanting a dopant species of a polarity opposite to that of said semiconductor bodies.

2. The method as claimed in claim 1, wherein said semiconductor substrate comprises a silicon-on-insulator wafer, and wherein said spaced gate slots are etched to the same depth as said shallow trench isolation islands and all the way to said buried insulator layer.

3. The method as claimed in claim 1, wherein said semiconductor substrate incorporates a layer of strained silicon formed in a predetermined upper region of the said substrate.

4. The method as claimed in claim 1, wherein said semiconductor substrate incorporates heterostructures containing silicon and germanium formed in a predetermined upper region of the said substrate.

5. A method of manufacturing a composite semiconductor device which includes a MOS transistor device and a castellated-gate MOSFET device capable of fully-depleted operation comprising the steps of:
    creating a starting silicon semiconductor substrate;
    applying active layer pad nitride masks to form trench isolation islands in said substrate;
    forming a plurality of thin silicon channel elements by etching a plurality of spaced gate slots to a first predetermined depth into said substrate:
    filling said slots with a dielectric material;
    forming a dummy gate structure by depositing and patterning a film material:
    implanting source and drain regions that are consequently self-aligned by said dummy gate structure;
    implanting predetermined active areas in said starting silicon substrate so as to tailor the doping concentration and polarity of the semiconductor bodies formed thereby;
    forming a planer gate structure by deposing a planer insulating gate material, deposing a conductive gate material and then removing the unpatterned regions of said conductive gate material;
    forming self-aligned source and drain regions by implanting a dopant species of a polarity opposite to that of said semiconductor bodies:
    forming a planarized interlevel dielectric layer by depositing an oxide and etching it back using said dummy gate structure as a CMP etch stop;
    removing said dummy gate structure and underlying area of said dielectric material within said gate slots;
    deposting a gate dielectric;
    forming vertical gate elements by depositing a conductive gate material over said planarized interlevel dielectric layer to fill the opened areas of said slot regions; and
    forming a planarized conducting strap which connects said vertical gate elements together at their upper end surfaces by using CMP to polish back upper surface of said conductive gate material.

6. The method as claimed in claim 5. wherein said semiconductor substrate comprises a silicon-on-insulator wafer, and wherein said spaced gate slots are etched to the same depth as said shallow trench isolation islands and all the way to said buried insulator layer.

7. The method as claimed in claim 5, wherein said semiconductor substrate incorporates a layer of strained silicon formed in a predetermined upper region of the said substrate.

8. The method as claimed in claim 5, wherein said semiconductor substrate incorporates heterosiructures containing silicon and germanium formed in a predetermined upper region of the said substrate.

* * * * *